(12) United States Patent
Ohno et al.

(10) Patent No.: US 11,054,687 B2
(45) Date of Patent: Jul. 6, 2021

(54) METHOD FOR MANUFACTURING DISPLAY DEVICE, DISPLAY DEVICE, DISPLAY MODULE, AND ELECTRONIC DEVICE

(71) Applicant: Semiconductor Energy Laboratory Co., Ltd., Atsugi (JP)

(72) Inventors: Masakatsu Ohno, Utsunomiya (JP); Seiji Yasumoto, Tochigi (JP); Naoto Goto, Tochigi (JP); Hiroki Adachi, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 172 days.

(21) Appl. No.: 16/319,649

(22) PCT Filed: May 11, 2017

(86) PCT No.: PCT/IB2017/052748
§ 371 (c)(1),
(2) Date: Jan. 22, 2019

(87) PCT Pub. No.: WO2018/029546
PCT Pub. Date: Feb. 15, 2018

(65) Prior Publication Data
US 2021/0026188 A1    Jan. 28, 2021

(30) Foreign Application Priority Data
Aug. 9, 2016    (JP) .............................. JP2016-156831

(51) Int. Cl.
*G02F 1/136*    (2006.01)
*G02F 1/1333*    (2006.01)
(Continued)

(52) U.S. Cl.
CPC ...... *G02F 1/133382* (2013.01); *G02F 1/1368* (2013.01); *G02F 1/136286* (2013.01)

(58) Field of Classification Search
None
See application file for complete search history.

(56) References Cited

U.S. PATENT DOCUMENTS

| 4,409,134 A | 10/1983 | Yamazaki |
| 5,826,162 A | 10/1998 | Aral et al. |
(Continued)

FOREIGN PATENT DOCUMENTS

| CN | 001281156 A | 1/2001 |
| CN | 001575049 A | 2/2005 |
(Continued)

OTHER PUBLICATIONS

Kusunoki.K et al., "Transmissive OLED and Reflective LC Hybrid (TR-Hybrid) Display", SID Digest '16 : SID International Symposium Digest of Technical Papers, May 22, 2016, vol. 46, pp. 57-60.
(Continued)

*Primary Examiner* — James A Dudek
(74) *Attorney, Agent, or Firm* — Robinson Intellectual Property Law Office; Eric J. Robinson

(57) ABSTRACT

A method for manufacturing a display device with low power consumption is provided.
A method for manufacturing a display device includes a step of forming a first layer over a substrate by using a material containing a resin or a resin precursor, a step of forming a first region and a second region thinner than the first region in the first layer, a step of forming a first resin layer including a first region and a second region thinner than the first region by performing first heat treatment on the first layer in a gas containing oxygen, a step of forming, over the first resin layer, a layer to be separated including a display element, and a step of separating the layer to be separated and the substrate from each other. A step of forming a conductive layer over the first resin layer in a position overlapping with the second region is included in the step of forming the layer
(Continued)

to be separated. A step of exposing the conductive layer by removing the first resin layer is included after the step of separating the layer to be separated and the substrate from each other.

29 Claims, 39 Drawing Sheets

(51) Int. Cl.
    *G02F 1/1362*     (2006.01)
    *G02F 1/1368*     (2006.01)

(56) References Cited

U.S. PATENT DOCUMENTS

| | | |
|---|---|---|
| 5,834,327 A | 11/1998 | Yamazaki et al. |
| 6,100,166 A | 8/2000 | Sakaguchi et al. |
| 6,127,199 A | 10/2000 | Inoue et al. |
| 6,294,799 B1 | 9/2001 | Yamazaki et al. |
| 6,335,479 B1 | 1/2002 | Yamada et al. |
| 6,372,608 B1 | 4/2002 | Shimoda et al. |
| 6,379,792 B1 | 4/2002 | Isshiki et al. |
| 6,452,653 B1 | 9/2002 | Yamanaka et al. |
| 6,468,638 B2 | 10/2002 | Jacobsen et al. |
| 6,521,511 B1 | 2/2003 | Inoue et al. |
| 6,627,518 B1 | 9/2003 | Inoue et al. |
| 6,645,830 B2 | 11/2003 | Shimoda et al. |
| RE38,466 E * | 3/2004 | Inoue .................. G02F 1/1368 438/30 |
| 6,714,268 B2 | 3/2004 | Wang et al. |
| 6,740,599 B2 | 5/2004 | Yamazaki et al. |
| 6,814,832 B2 | 11/2004 | Utsunomiya |
| 6,825,099 B2 | 11/2004 | Yanagita et al. |
| 6,846,616 B2 | 1/2005 | Kobayashi et al. |
| 6,867,067 B2 | 3/2005 | Ghyselen et al. |
| 6,885,146 B2 | 4/2005 | Yamazaki et al. |
| 6,946,361 B2 | 9/2005 | Takayama et al. |
| 6,947,321 B2 | 9/2005 | Tanabe |
| 6,972,263 B2 | 12/2005 | Yamazaki et al. |
| 7,038,641 B2 | 5/2006 | Hirota et al. |
| 7,052,924 B2 | 5/2006 | Daniels et al. |
| 7,067,392 B2 | 6/2006 | Yamazaki et al. |
| 7,078,737 B2 | 7/2006 | Yuri et al. |
| 7,084,045 B2 | 8/2006 | Takayama et al. |
| 7,084,936 B2 | 8/2006 | Kato |
| 7,094,665 B2 | 8/2006 | Shimoda et al. |
| 7,102,704 B2 | 9/2006 | Mitsui et al. |
| 7,147,740 B2 | 12/2006 | Takayama et al. |
| 7,169,652 B2 | 1/2007 | Kimura |
| 7,176,991 B2 | 2/2007 | Mitsui et al. |
| 7,212,266 B2 | 5/2007 | Tashirok et al. |
| 7,239,361 B2 | 7/2007 | Kato |
| 7,241,666 B2 | 7/2007 | Goto et al. |
| 7,248,235 B2 | 7/2007 | Fujii et al. |
| 7,262,088 B2 | 8/2007 | Kodaira et al. |
| 7,341,924 B2 | 3/2008 | Takayama et al. |
| 7,342,354 B2 | 3/2008 | Utsunomiya et al. |
| 7,385,654 B2 | 6/2008 | Mitsui et al. |
| 7,420,208 B2 | 9/2008 | Yamazaki et al. |
| 7,439,111 B2 | 10/2008 | Ohtani et al. |
| 7,456,059 B2 | 11/2008 | Kodaira et al. |
| 7,569,886 B2 | 8/2009 | Matsukura |
| 7,572,667 B2 | 8/2009 | Ryu et al. |
| 7,575,965 B2 | 8/2009 | Kuwabara et al. |
| 7,622,361 B2 | 11/2009 | Goto et al. |
| 7,727,898 B2 | 6/2010 | Yamazaki et al. |
| 7,745,269 B2 | 6/2010 | Matsukura |
| 7,821,002 B2 | 10/2010 | Yamazaki et al. |
| 7,833,871 B2 | 11/2010 | Kawakami et al. |
| 7,883,989 B2 | 2/2011 | Goto et al. |
| 7,903,211 B2 | 3/2011 | Tashiro et al. |
| 7,916,167 B2 | 3/2011 | Miyagawa et al. |
| 8,110,442 B2 | 2/2012 | Jinbo |
| 8,123,896 B2 | 2/2012 | Watanabe et al. |
| 8,173,519 B2 | 5/2012 | Morisue et al. |
| 8,222,092 B2 | 7/2012 | Yamazaki et al. |
| 8,222,666 B2 | 7/2012 | Hatano et al. |
| 8,237,166 B2 | 8/2012 | Kumomi et al. |
| 8,284,369 B2 | 10/2012 | Chida et al. |
| 8,384,824 B2 | 2/2013 | Miyagawa et al. |
| 8,415,208 B2 | 4/2013 | Takayama et al. |
| 8,450,769 B2 | 5/2013 | Hatano et al. |
| 8,766,314 B2 | 7/2014 | Hatano et al. |
| 8,796,078 B2 | 8/2014 | Sasaki et al. |
| 8,816,349 B2 | 8/2014 | Yamazaki et al. |
| 8,830,424 B2 | 9/2014 | Hirakata et al. |
| 8,895,974 B2 | 11/2014 | Sugimoto et al. |
| 8,969,128 B2 | 3/2015 | Cho et al. |
| 8,980,733 B2 | 3/2015 | Yamazaki et al. |
| 9,000,443 B2 | 4/2015 | Hatano |
| 9,053,401 B2 | 6/2015 | Watanabe et al. |
| 9,088,006 B2 | 7/2015 | Yamazaki et al. |
| 9,268,162 B2 | 2/2016 | Haskal |
| 9,398,178 B2 | 7/2016 | Miyagawa et al. |
| 9,425,371 B2 | 8/2016 | Hatano et al. |
| 9,437,831 B2 | 9/2016 | Yamazaki et al. |
| 9,437,832 B2 | 9/2016 | Sakuishi et al. |
| 9,623,637 B2 | 4/2017 | Tanaka |
| 9,799,716 B2 | 10/2017 | Hatano et al. |
| 10,079,353 B2 | 9/2018 | Sakuishi et al. |
| 10,101,628 B2 | 10/2018 | Yamazaki et al. |
| 10,141,526 B2 | 11/2018 | Sakuishi et al. |
| 10,180,605 B2 | 1/2019 | Kubota et al. |
| 10,283,627 B2 | 5/2019 | Sasaki et al. |
| 2002/0018161 A1 | 2/2002 | Yamanaka et al. |
| 2003/0003687 A1 | 1/2003 | Yanagita et al. |
| 2003/0024635 A1 | 2/2003 | Utsunomiya |
| 2003/0048372 A1 | 3/2003 | Koyama |
| 2003/0087073 A1 | 5/2003 | Kobayashi |
| 2003/0201960 A1 | 10/2003 | Fujieda |
| 2003/0217805 A1 | 11/2003 | Takayama et al. |
| 2004/0079941 A1 | 4/2004 | Yamazaki et al. |
| 2004/0129960 A1 | 7/2004 | Maruyama et al. |
| 2004/0209442 A1 | 10/2004 | Takakuwa et al. |
| 2004/0239827 A1 | 12/2004 | Yamazaki et al. |
| 2004/0245924 A1 | 12/2004 | Utsunomiya et al. |
| 2005/0124751 A1 | 6/2005 | Klingenberg et al. |
| 2005/0127371 A1 | 6/2005 | Yamazaki et al. |
| 2005/0130391 A1 | 6/2005 | Takayama et al. |
| 2005/0173701 A1 | 8/2005 | Kawase et al. |
| 2005/0250308 A1 | 11/2005 | Yamaguchi et al. |
| 2005/0287871 A1 | 12/2005 | Nakayama et al. |
| 2006/0072047 A1 | 4/2006 | Sekiguchi |
| 2007/0171142 A1 | 7/2007 | Ikarashi et al. |
| 2007/0207571 A1 | 9/2007 | Morisue et al. |
| 2007/0295973 A1 | 12/2007 | Jinbo et al. |
| 2008/0180618 A1 | 7/2008 | Fujieda |
| 2009/0194154 A1 | 8/2009 | Takahashi et al. |
| 2009/0315457 A1 | 12/2009 | Furukawa et al. |
| 2010/0045919 A1 | 2/2010 | Chida et al. |
| 2010/0148209 A1 | 6/2010 | Hatano et al. |
| 2010/0171905 A1 | 7/2010 | Huang et al. |
| 2010/0200999 A1 | 8/2010 | Yamazaki et al. |
| 2011/0308739 A1 | 12/2011 | McCutcheon et al. |
| 2012/0061664 A1 | 3/2012 | Yamazaki et al. |
| 2012/0228617 A1 | 9/2012 | Ko et al. |
| 2012/0280229 A1 | 11/2012 | Suzuki et al. |
| 2012/0325535 A1 | 12/2012 | Zahr |
| 2013/0314633 A1 | 11/2013 | Koo et al. |
| 2014/0339517 A1 | 11/2014 | Park et al. |
| 2015/0060778 A1 | 3/2015 | Kim et al. |
| 2015/0072454 A1 | 3/2015 | Kim et al. |
| 2015/0087093 A1 | 3/2015 | Sakano et al. |
| 2015/0151514 A1 | 6/2015 | Kikuchi et al. |
| 2015/0210048 A1 | 7/2015 | Jeong et al. |
| 2015/0236280 A1 | 8/2015 | Sakuishi et al. |
| 2015/0303408 A1 | 10/2015 | Lee et al. |
| 2017/0158805 A1 | 6/2017 | Su |
| 2017/0278878 A1 | 9/2017 | Kuwabara et al. |
| 2017/0293171 A1 | 10/2017 | Yamazaki et al. |
| 2017/0294462 A1 | 10/2017 | Yamazaki et al. |
| 2017/0294463 A1 | 10/2017 | Yamazaki et al. |
| 2017/0301860 A1 | 10/2017 | Yamazaki et al. |

(56) References Cited

U.S. PATENT DOCUMENTS

| | | |
|---|---|---|
| 2017/0305134 A1 | 10/2017 | Hirakata |
| 2017/0309731 A1 | 10/2017 | Yamazaki et al. |
| 2017/0329162 A1 | 11/2017 | Yamazaki et al. |
| 2018/0012751 A1 | 1/2018 | Kamochi et al. |
| 2018/0033978 A1 | 2/2018 | Ohno et al. |

FOREIGN PATENT DOCUMENTS

| | | |
|---|---|---|
| CN | 001652000 A | 8/2005 |
| CN | 001770405 A | 5/2006 |
| CN | 101064347 A | 10/2007 |
| CN | 101262013 A | 9/2008 |
| CN | 101901768 A | 12/2010 |
| CN | 102547042 A | 7/2012 |
| CN | 104465698 A | 3/2015 |
| CN | 105579500 A | 5/2016 |
| EP | 1480272 A | 11/2004 |
| EP | 1528594 A | 5/2005 |
| EP | 1850374 A | 10/2007 |
| EP | 2256795 A | 12/2010 |
| EP | 2259294 A | 12/2010 |
| EP | 2259300 A | 12/2010 |
| JP | 09-219453 A | 8/1997 |
| JP | 2001-066593 A | 3/2001 |
| JP | 2002-196702 A | 7/2002 |
| JP | 2002-328630 A | 11/2002 |
| JP | 2003-076302 A | 3/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2004-349152 A | 12/2004 |
| JP | 2007-108771 A | 4/2007 |
| JP | 2007-232882 A | 9/2007 |
| JP | 4161574 | 10/2008 |
| JP | 2009-004485 A | 1/2009 |
| JP | 2009-260166 A | 11/2009 |
| JP | 2010-073683 A | 4/2010 |
| JP | 2010-165673 A | 7/2010 |
| JP | 2011-191750 A | 9/2011 |
| JP | 2011-197696 A | 10/2011 |
| JP | 2013-221965 A | 10/2013 |
| JP | 5309672 | 10/2013 |
| JP | 2014-197522 A | 10/2014 |
| JP | 2015-173104 A | 10/2015 |
| JP | 2016-005899 A | 1/2016 |
| JP | 2016-090783 A | 5/2016 |
| KR | 2004-0100913 A | 12/2004 |
| KR | 2010-0022938 A | 3/2010 |
| KR | 2011-0106370 A | 9/2011 |
| KR | 2013-0130610 A | 12/2013 |
| KR | 2016-0124756 A | 10/2016 |
| TW | 200427362 | 12/2004 |
| TW | 201539779 | 10/2015 |
| WO | WO-2004/053819 | 6/2004 |
| WO | WO-2010/071089 | 6/2010 |
| WO | WO-2015/046128 | 4/2015 |
| WO | WO-2015/125046 | 8/2015 |

OTHER PUBLICATIONS

Sakuishi.T et al., "Transmissive OLED and Reflective LC Hybrid (TR-Hybrid) Display with High Visibility and Low Power Consumption", SID Digest '16 : SID International Symposium Digest of Technical Papers, May 22, 2016, vol. 47, pp. 735-738.

Shieh.H, "Transflective display by Hybrid OLED and LCD", LEOS 2005 (IEEE Lasers and Electro-Optics Society Annual Meeting), Oct. 22, 2005, pp. 650-651, IEEE.

Lee.J et al., "High ambient-contrast-ratio display using tandem reflective liquid crystal display and organic light-emitting device", Optics Express, Nov. 14, 2005, vol. 13, No. 23, pp. 9431-9438.

Ohide.T et al., "Application of Transfer Technology to Manufacturing of Transmissive OLED and Reflective LC Hybrid (TR-Hybrid) Display", SID Digest '16 : SID International Symposium Digest of Technical Papers, May 22, 2016, vol. 47, pp. 1002-1004.

International Search Report (Application No. PCT/IB2017/052748) dated Aug. 22, 2017.

Written Opinion (Application No. PCT/IB2017/052748) dated Aug. 22, 2017.

Chinese Office Action (Application No. 201780047650.3) dated Nov. 17, 2020.

* cited by examiner

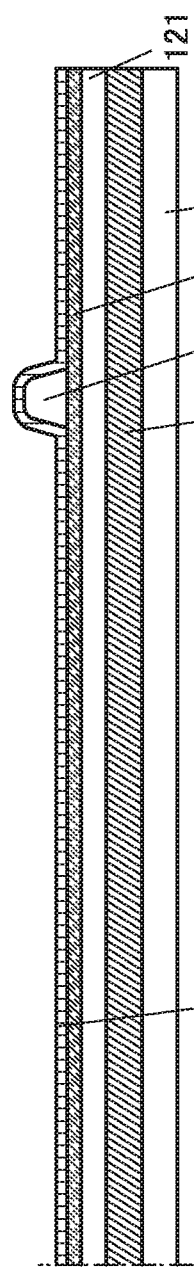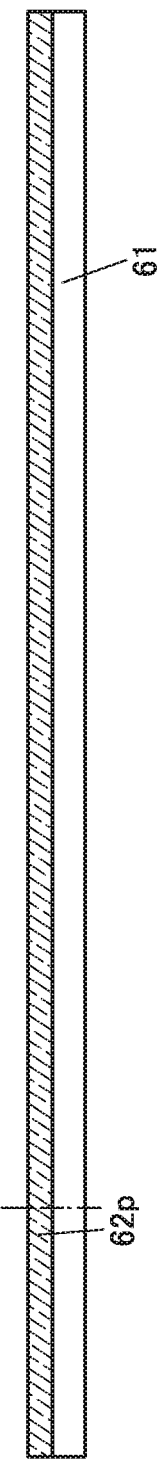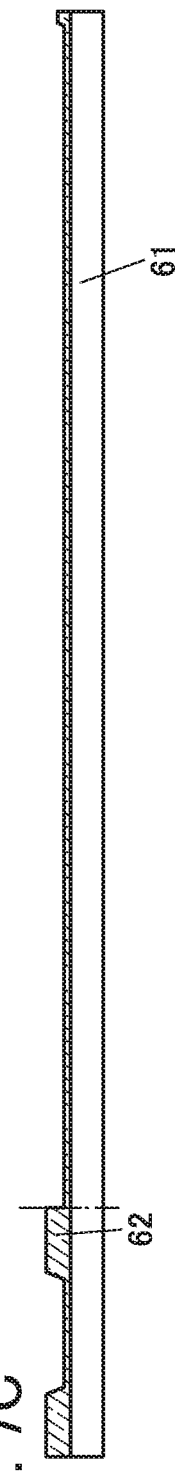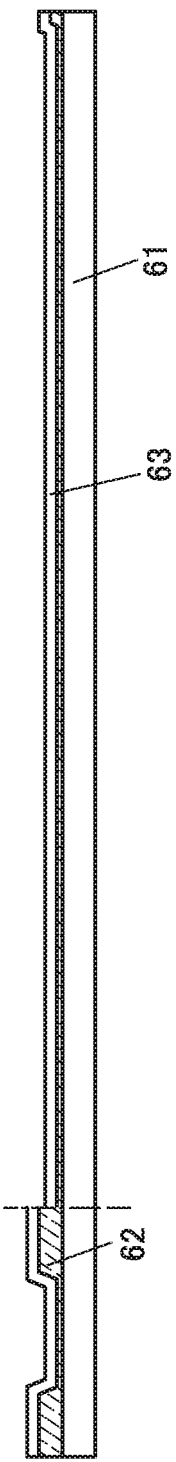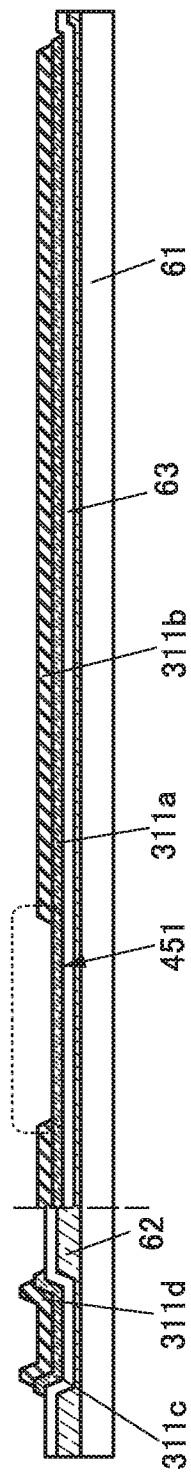

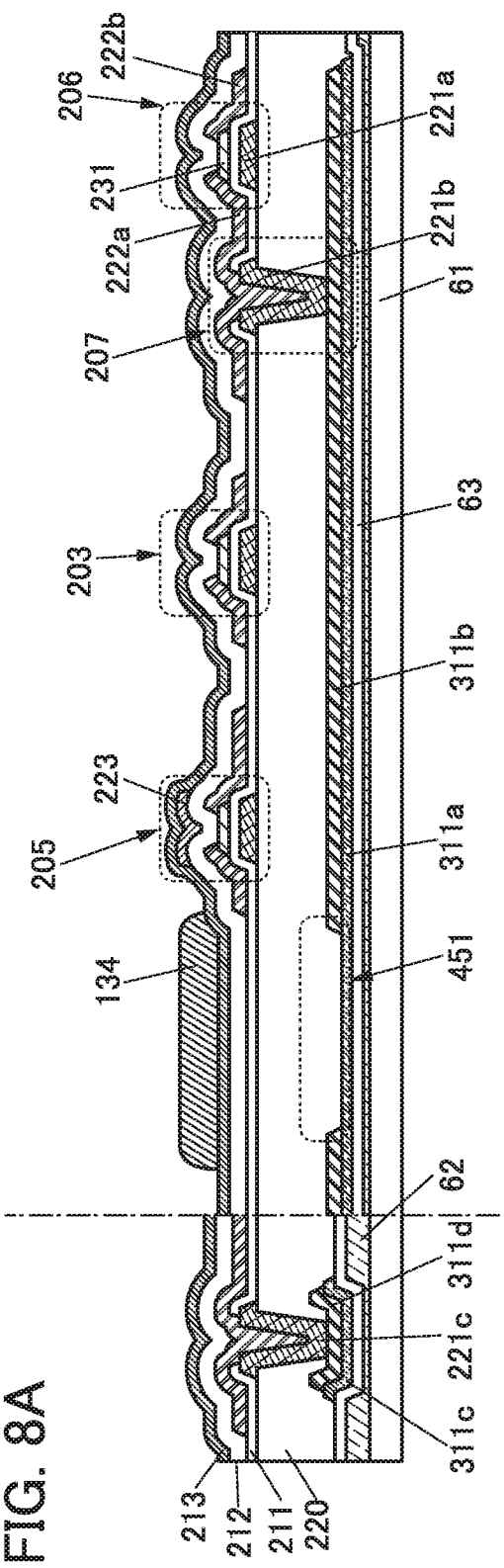
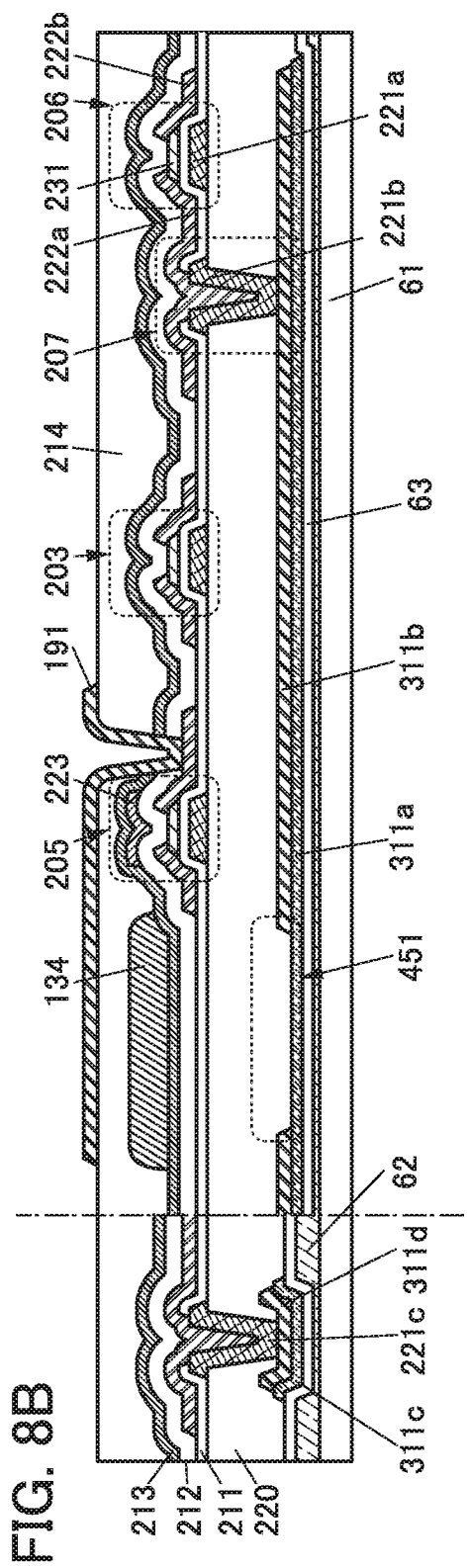

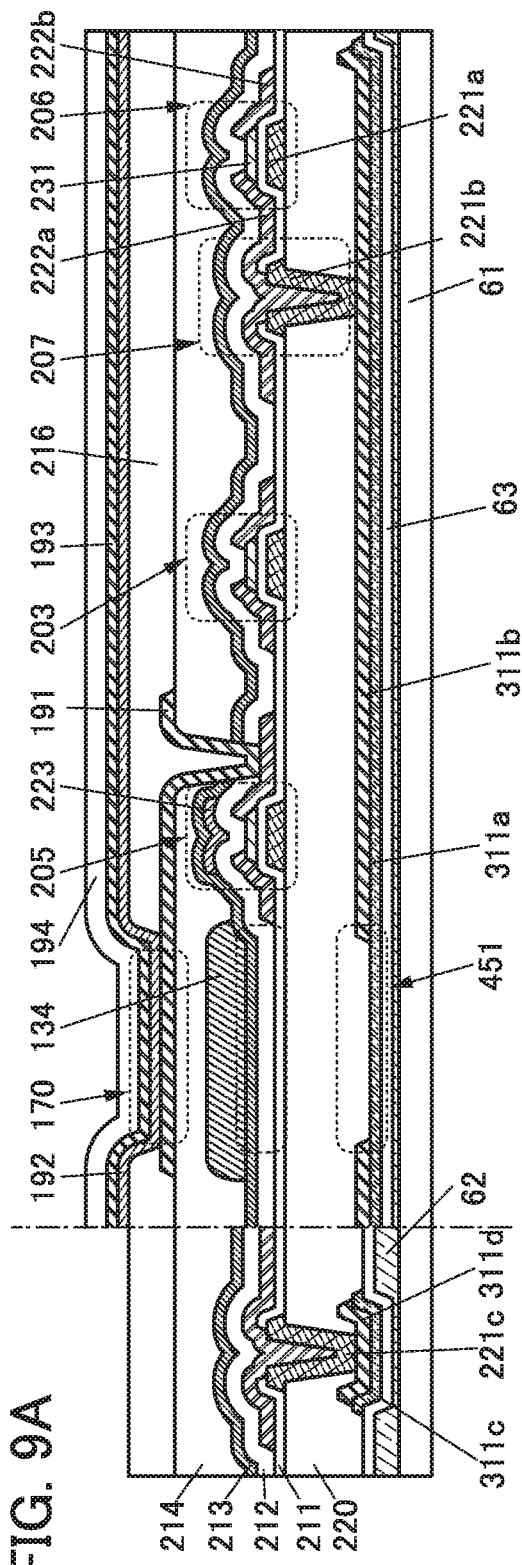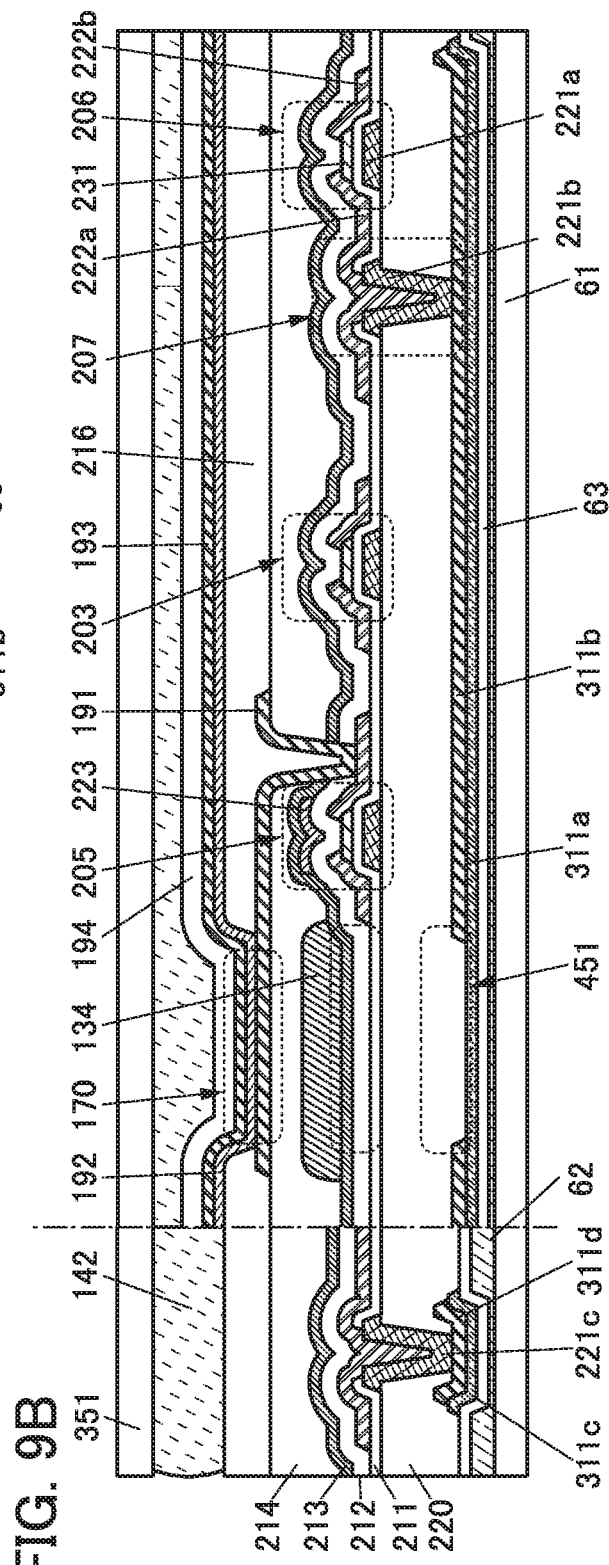

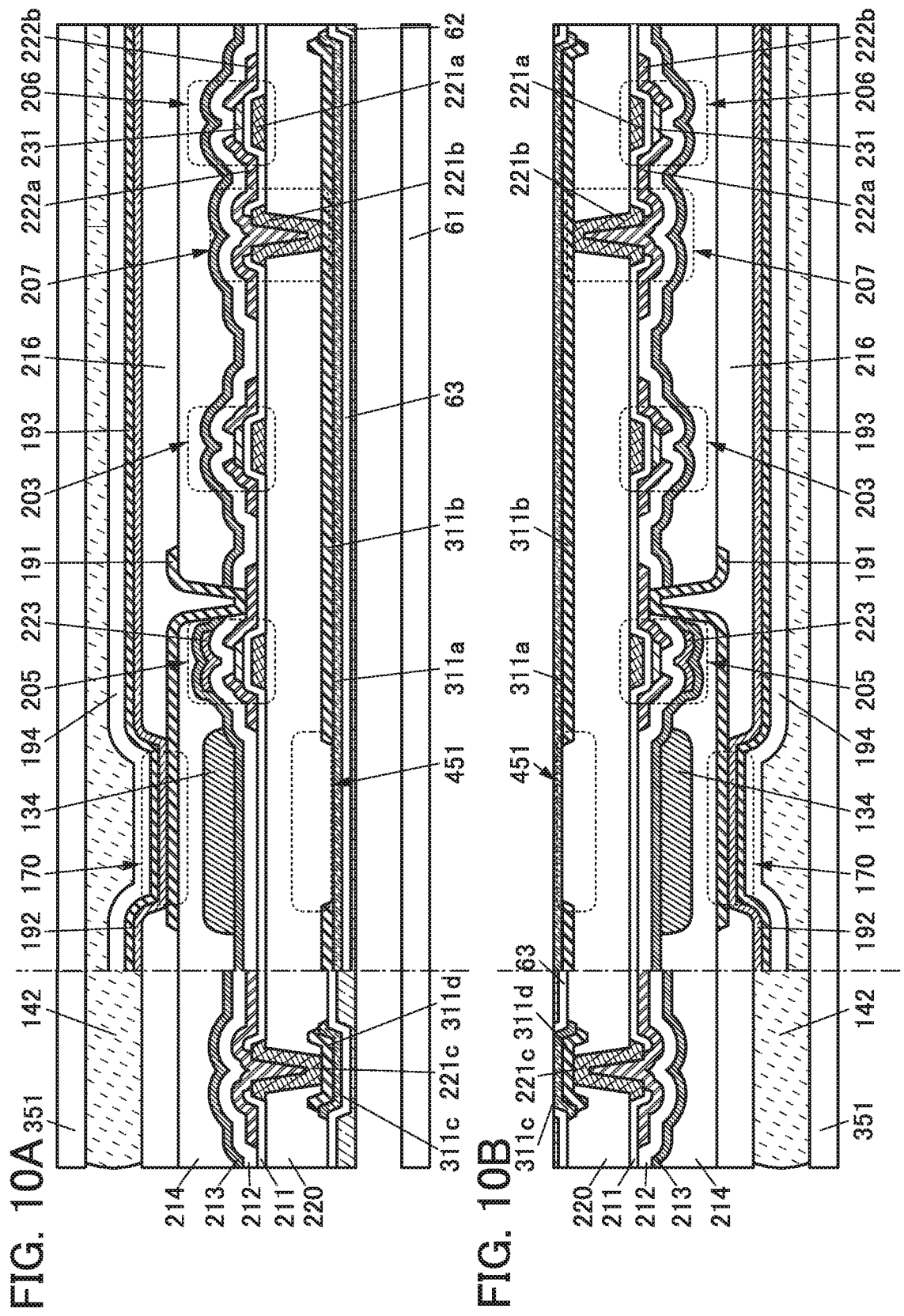

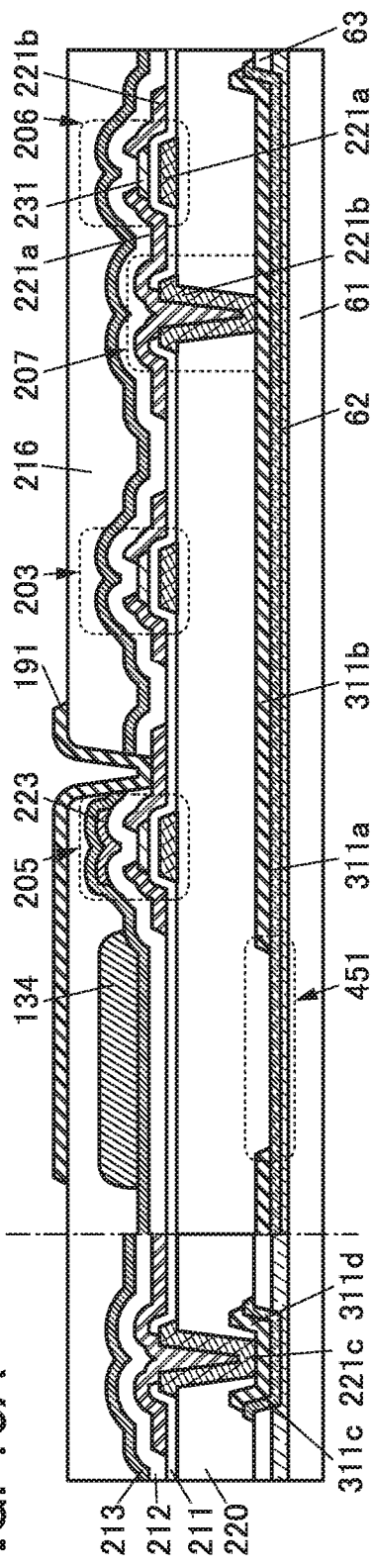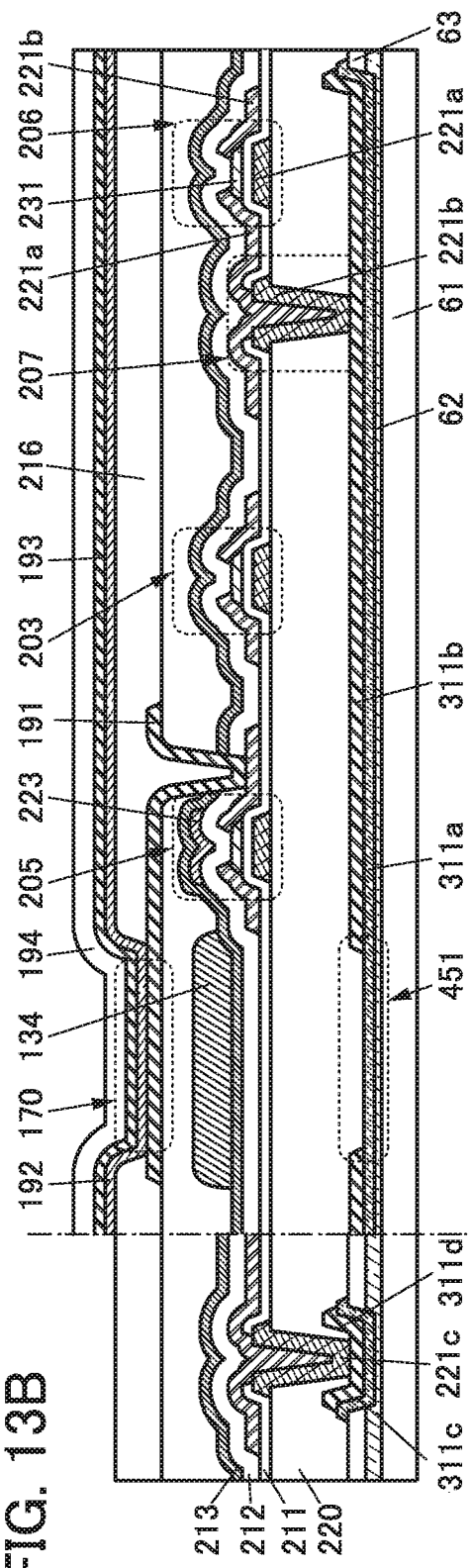

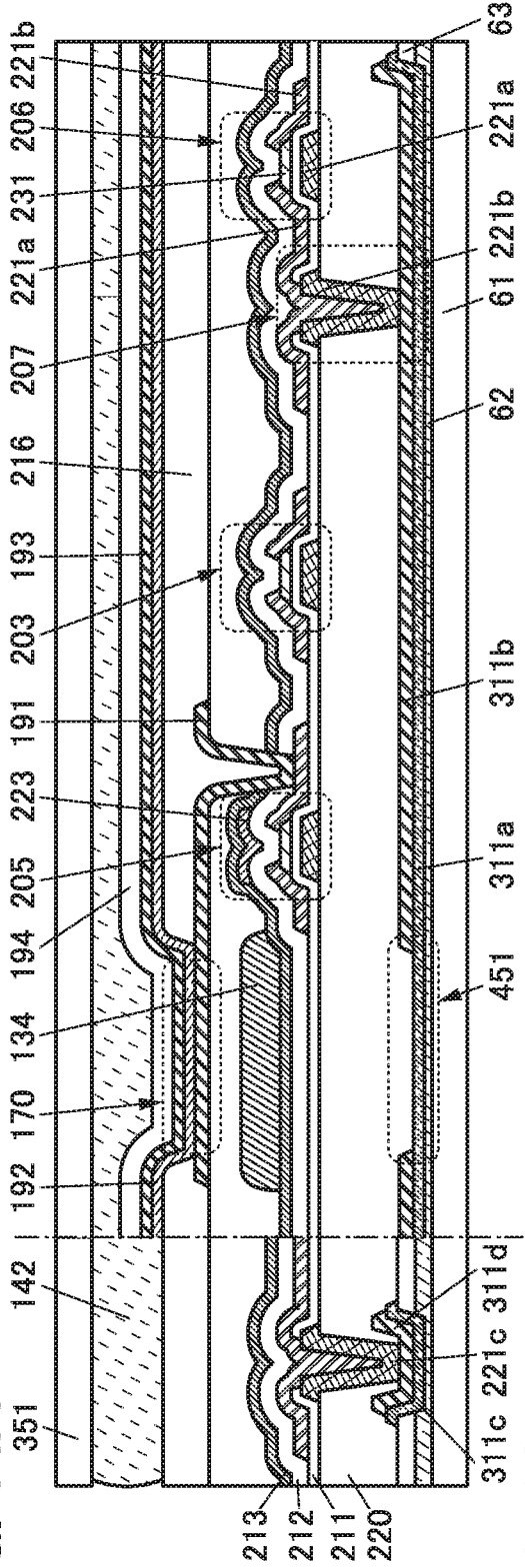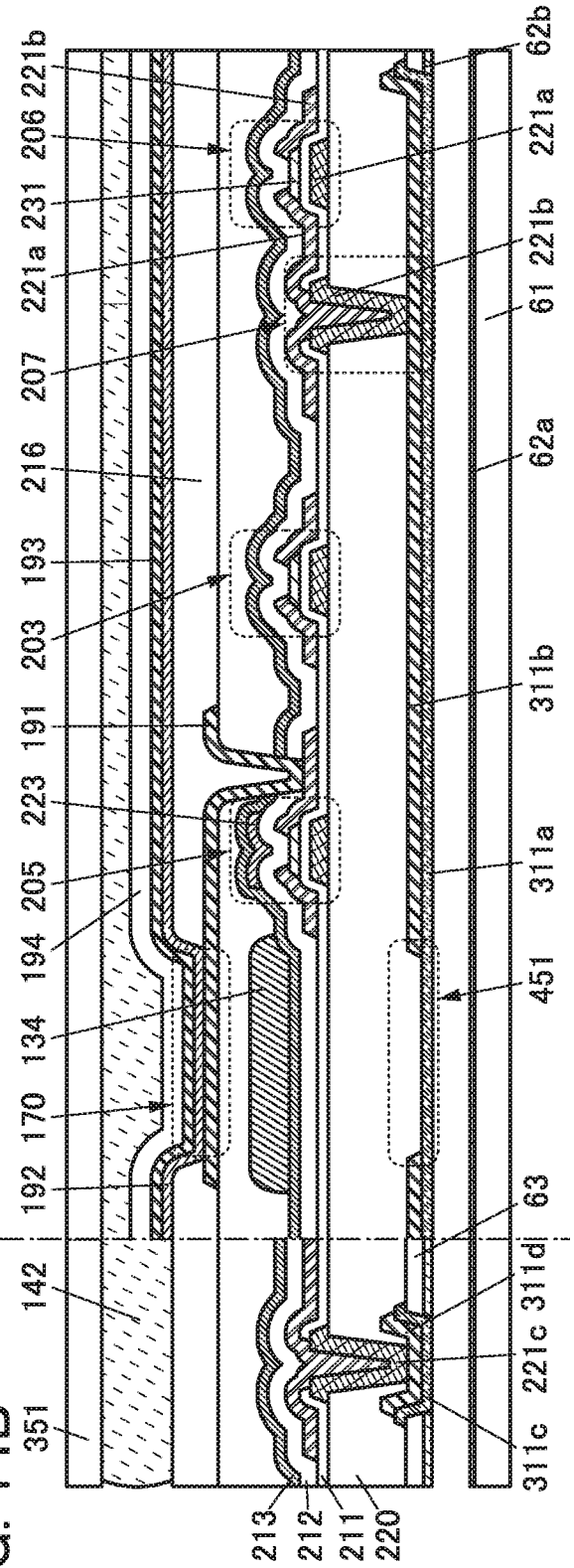

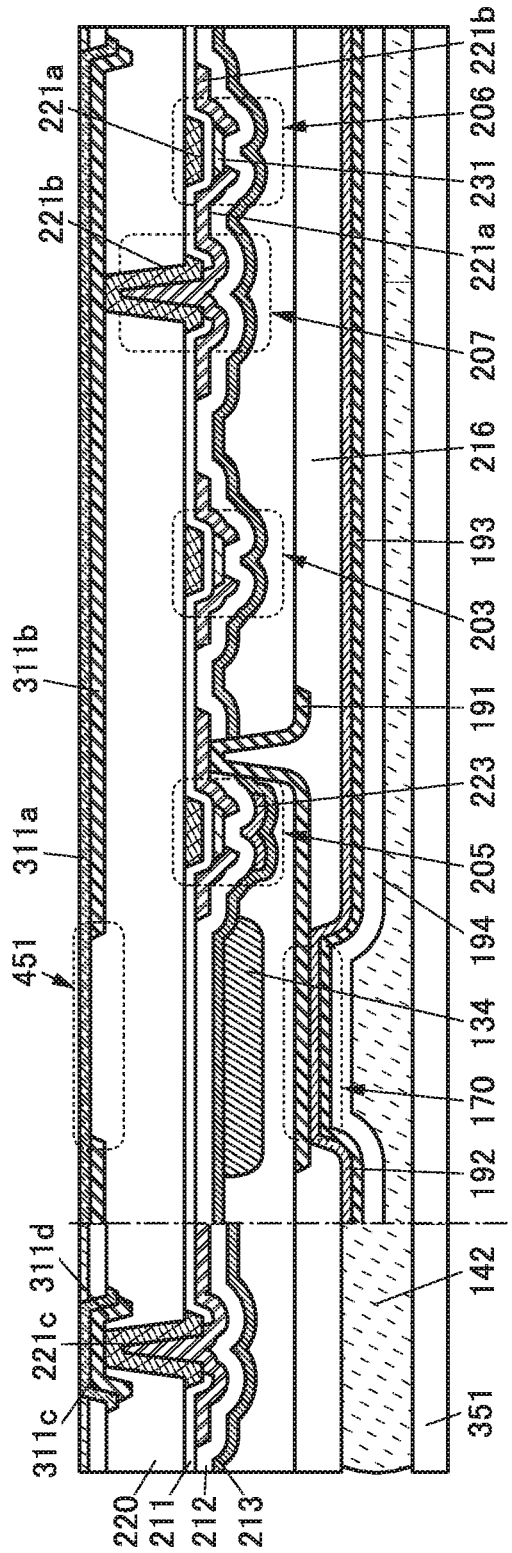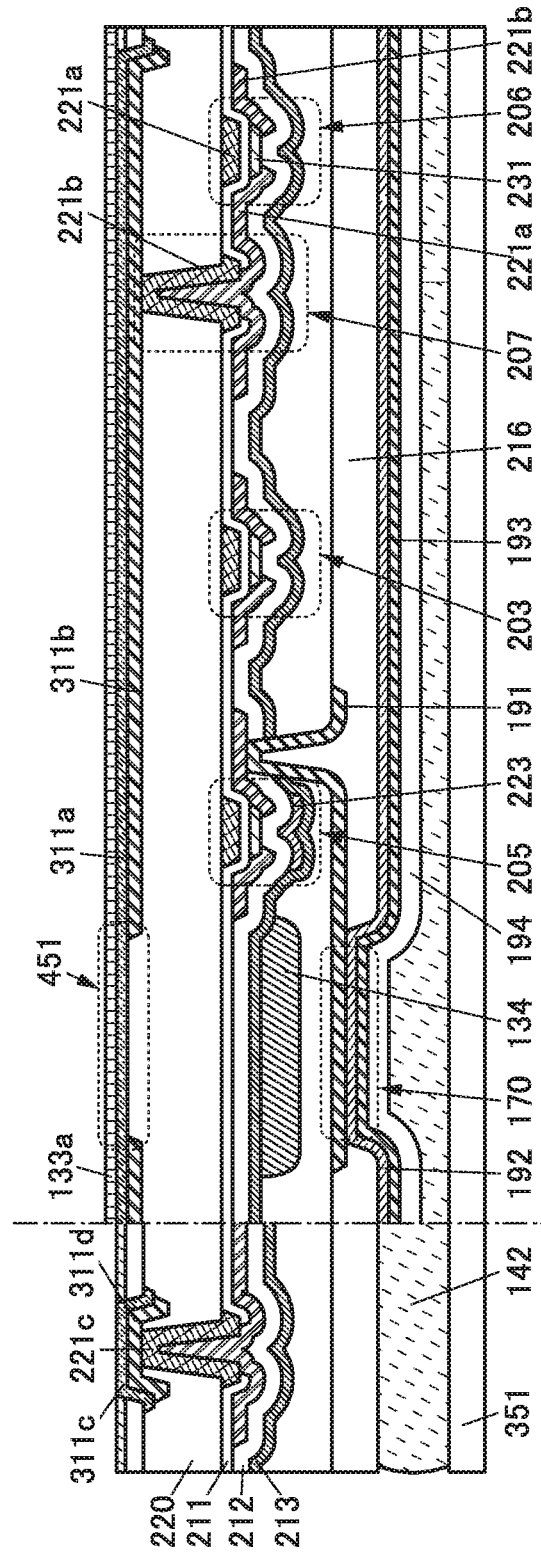

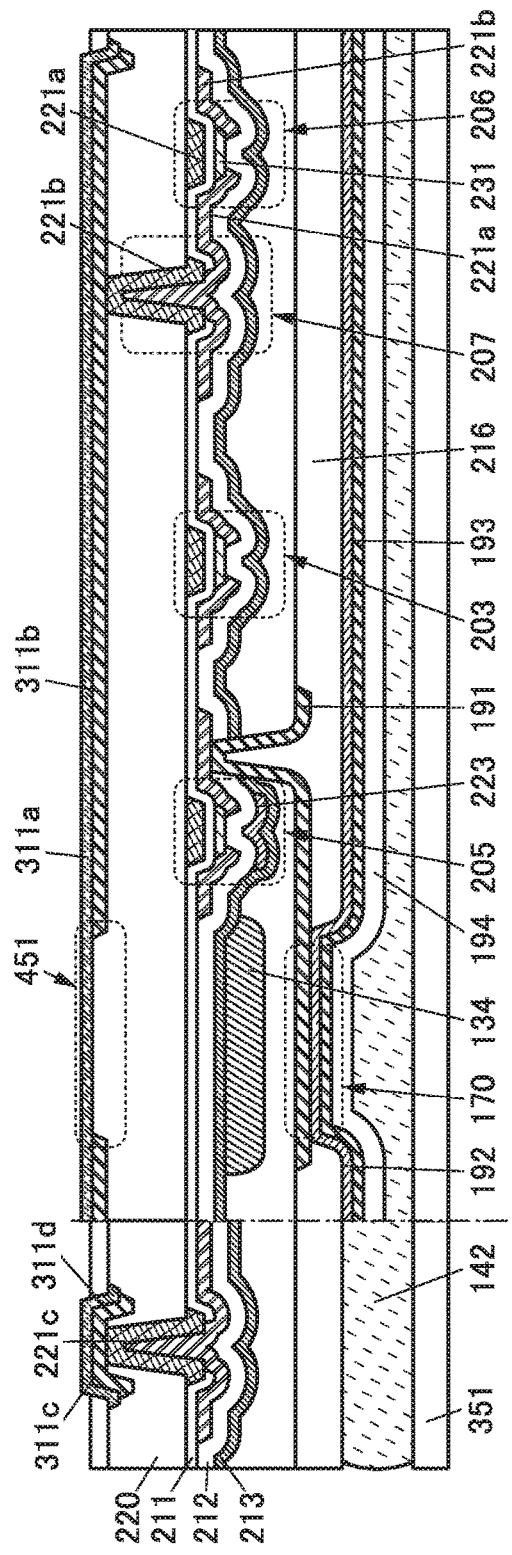
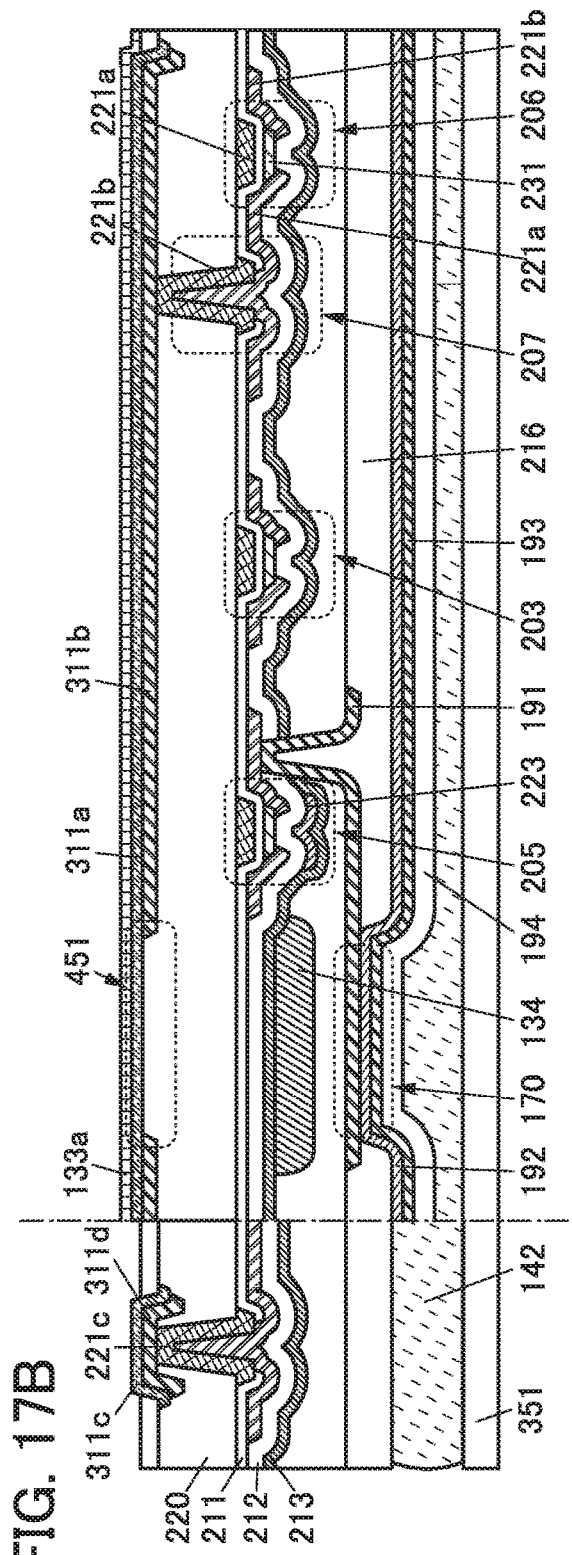
FIG. 17A
FIG. 17B

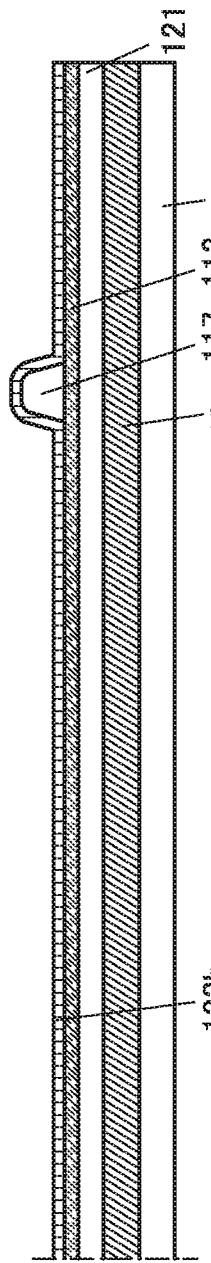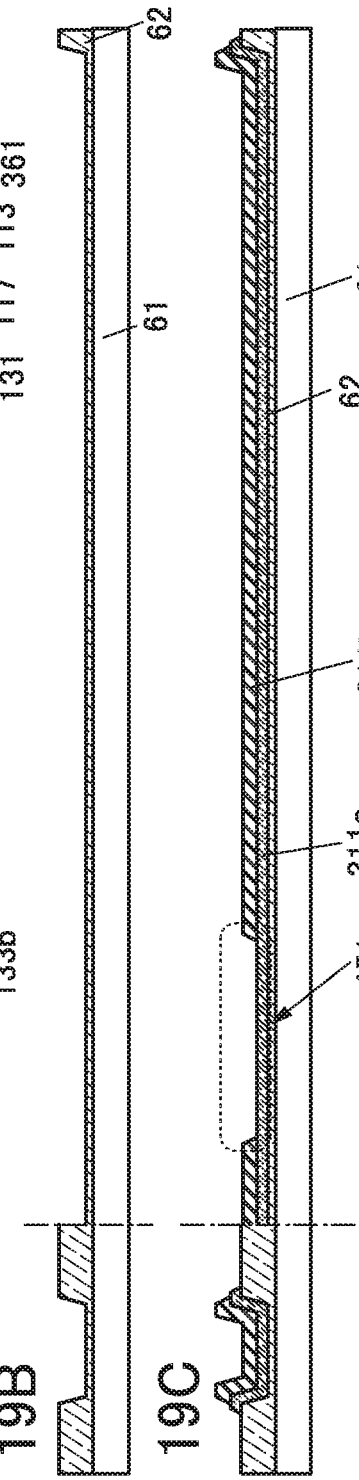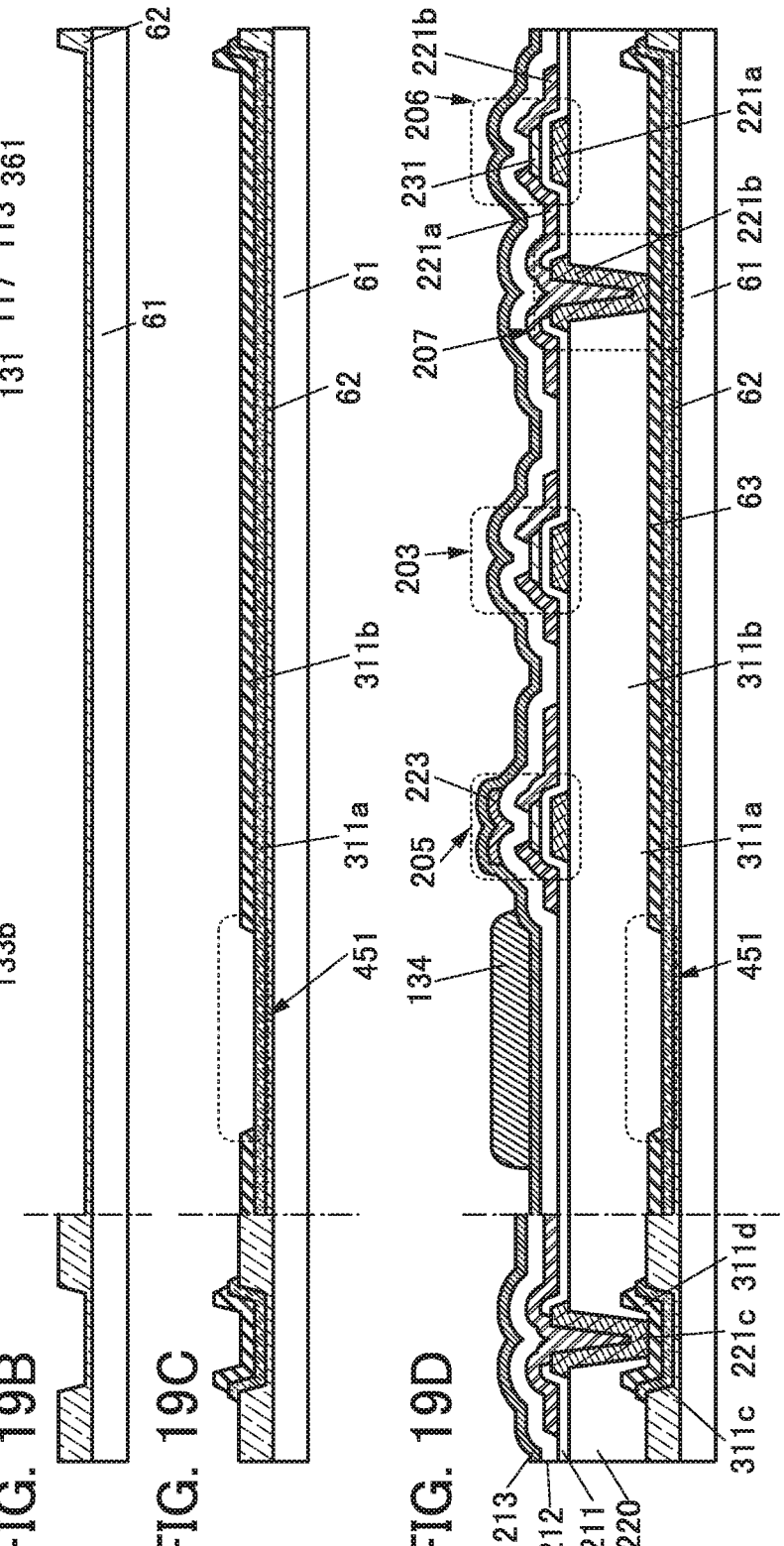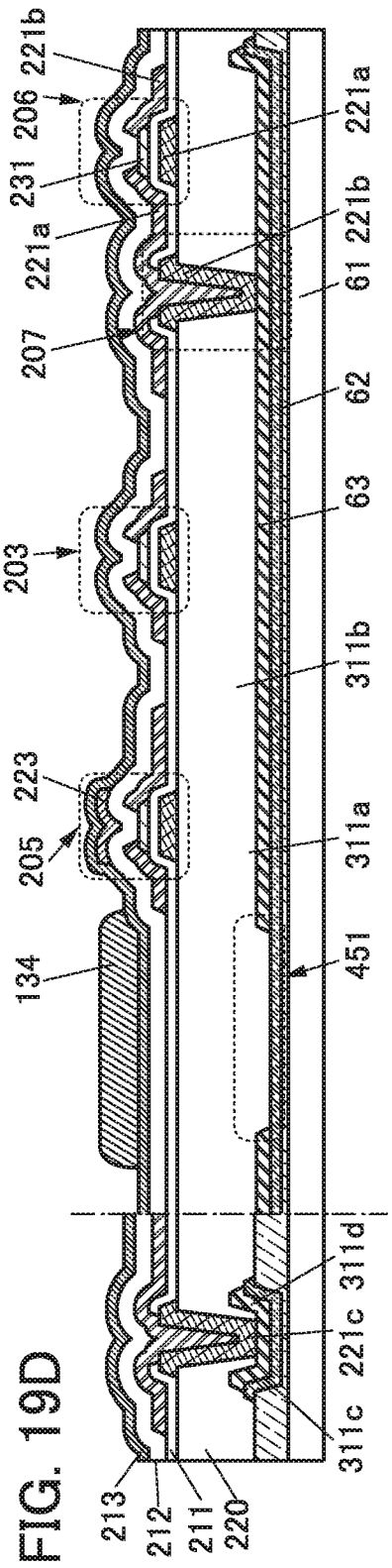

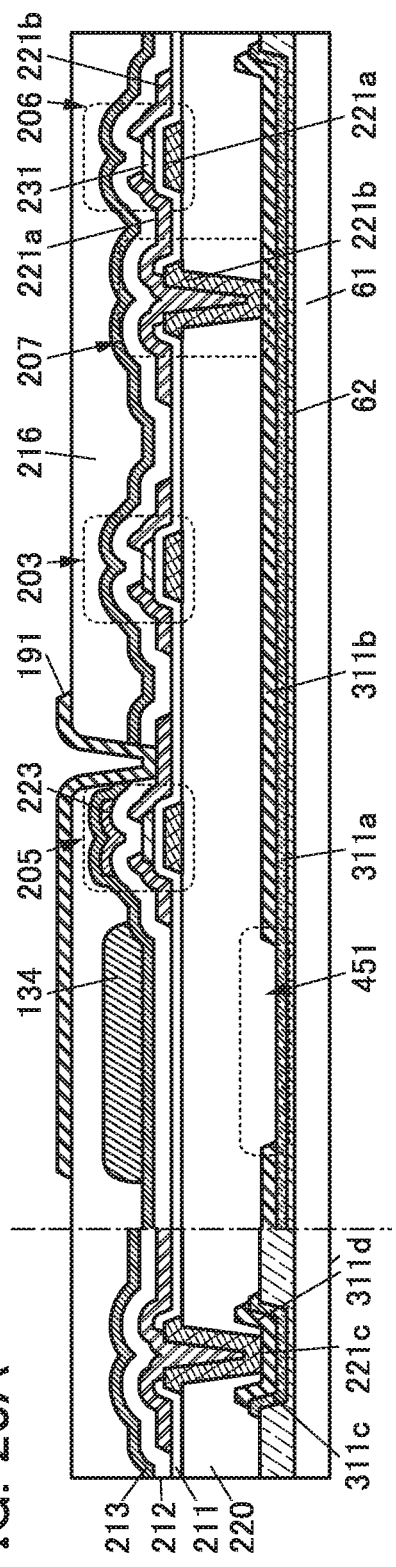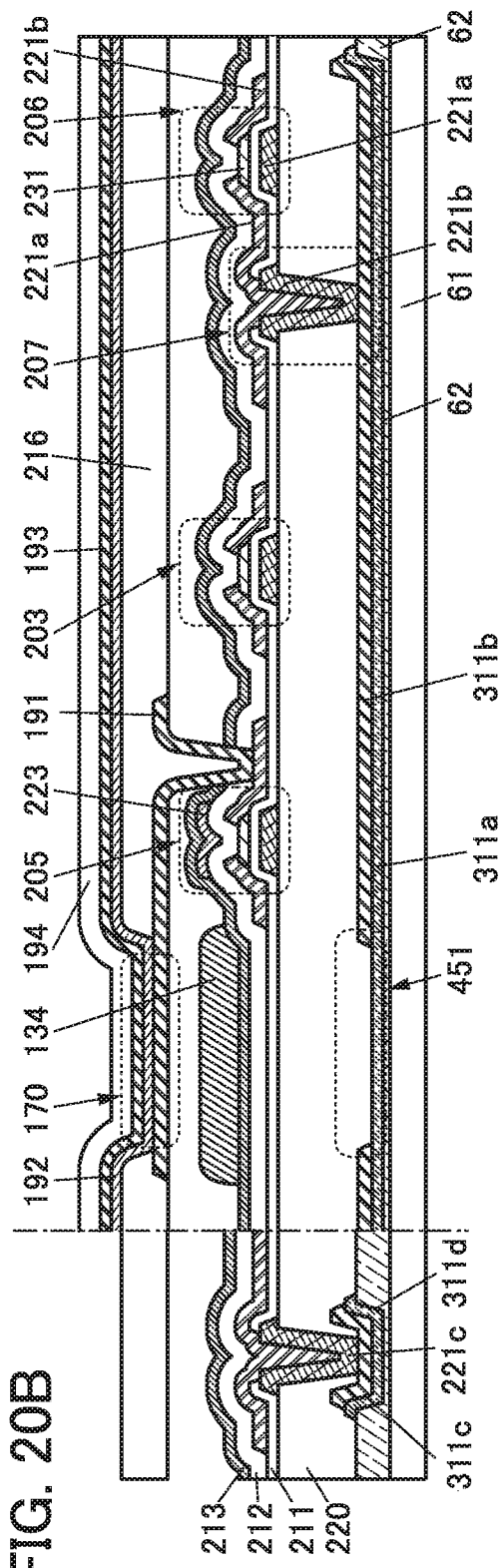

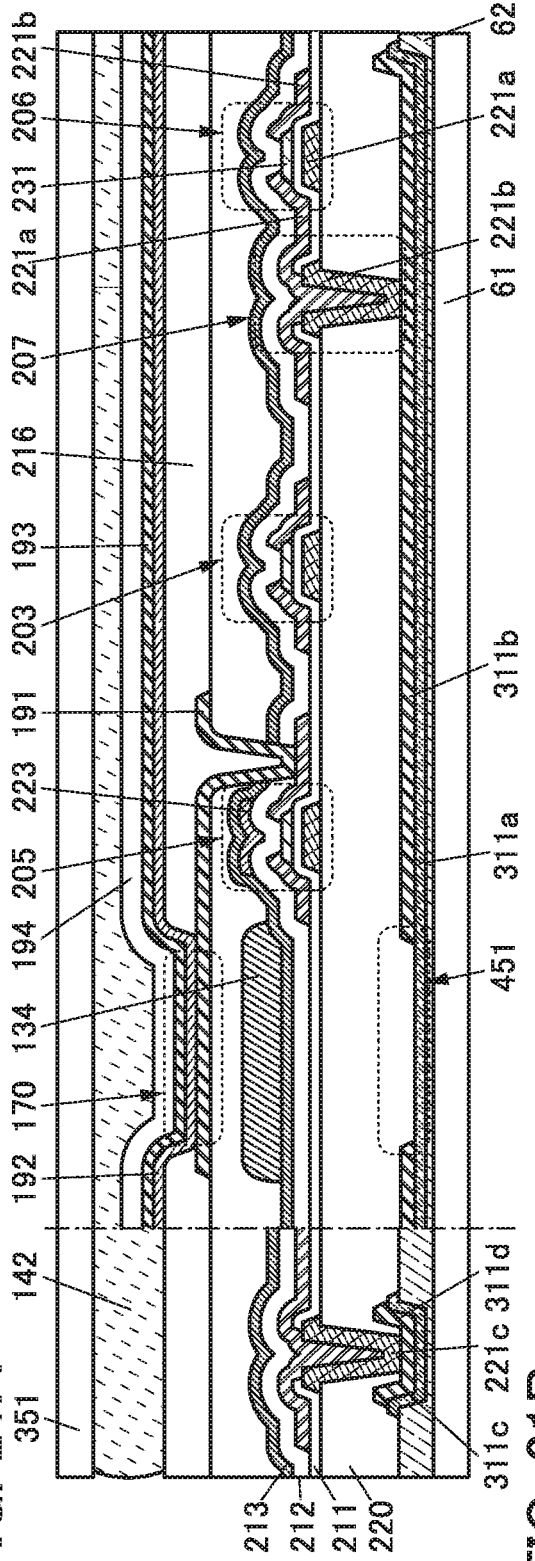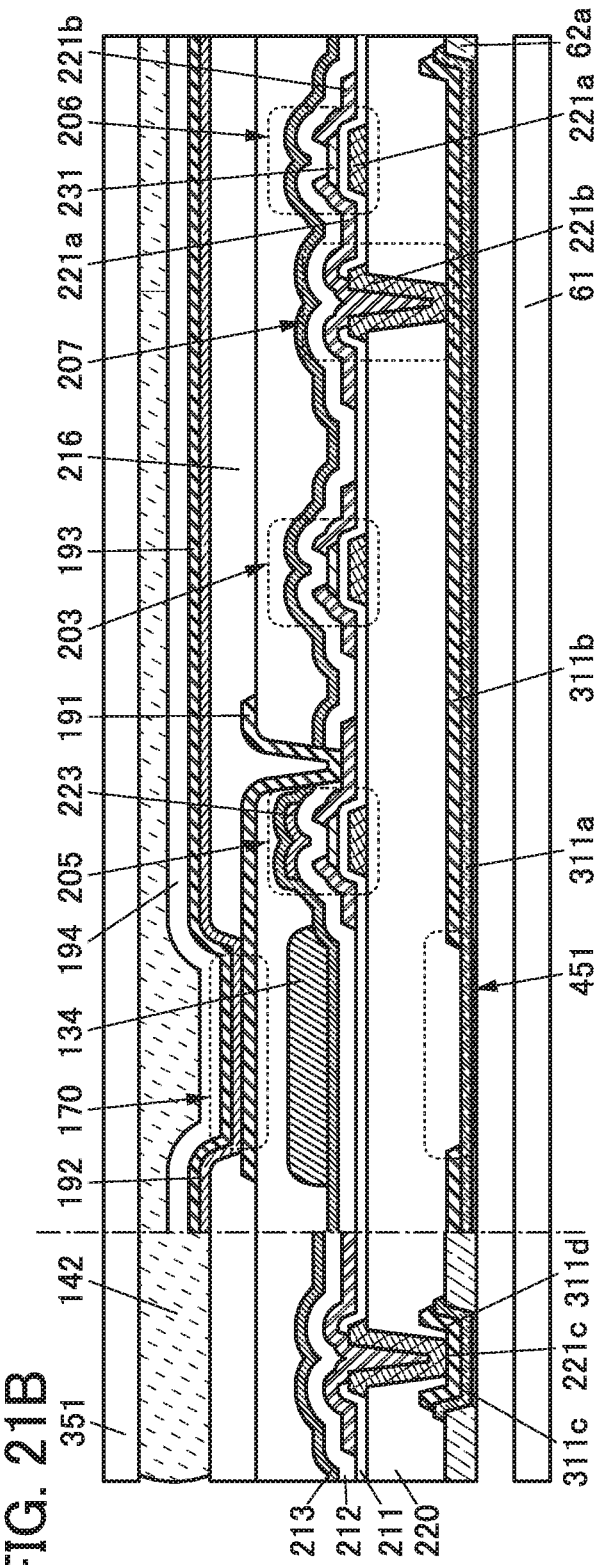

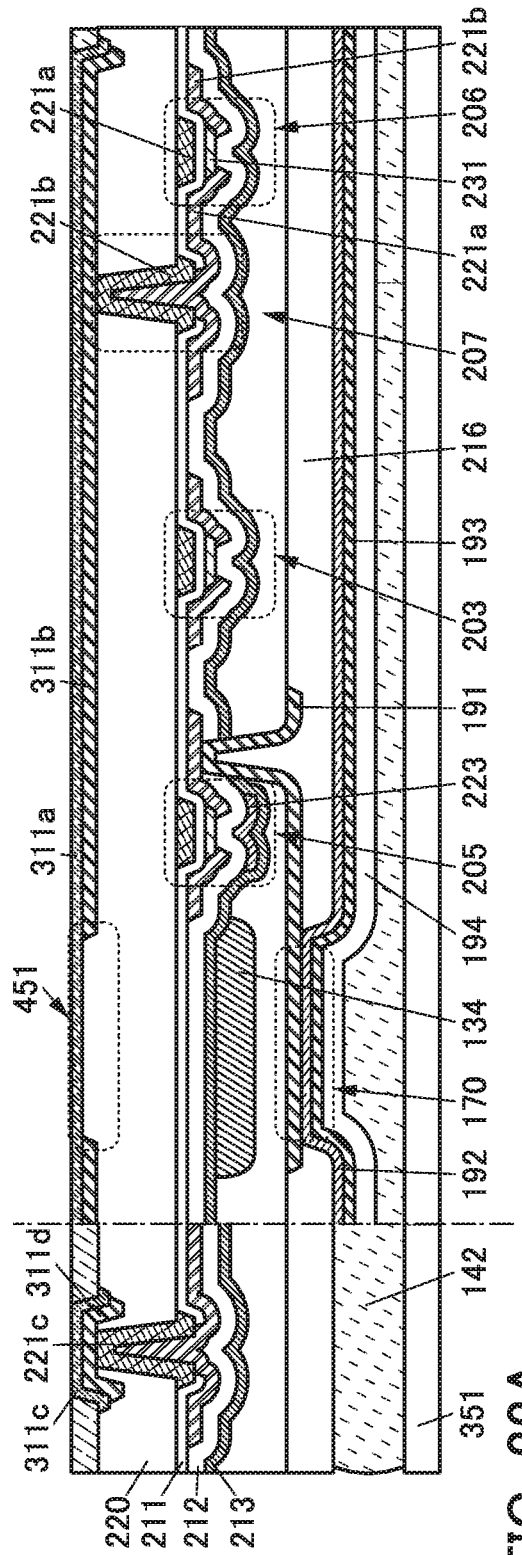
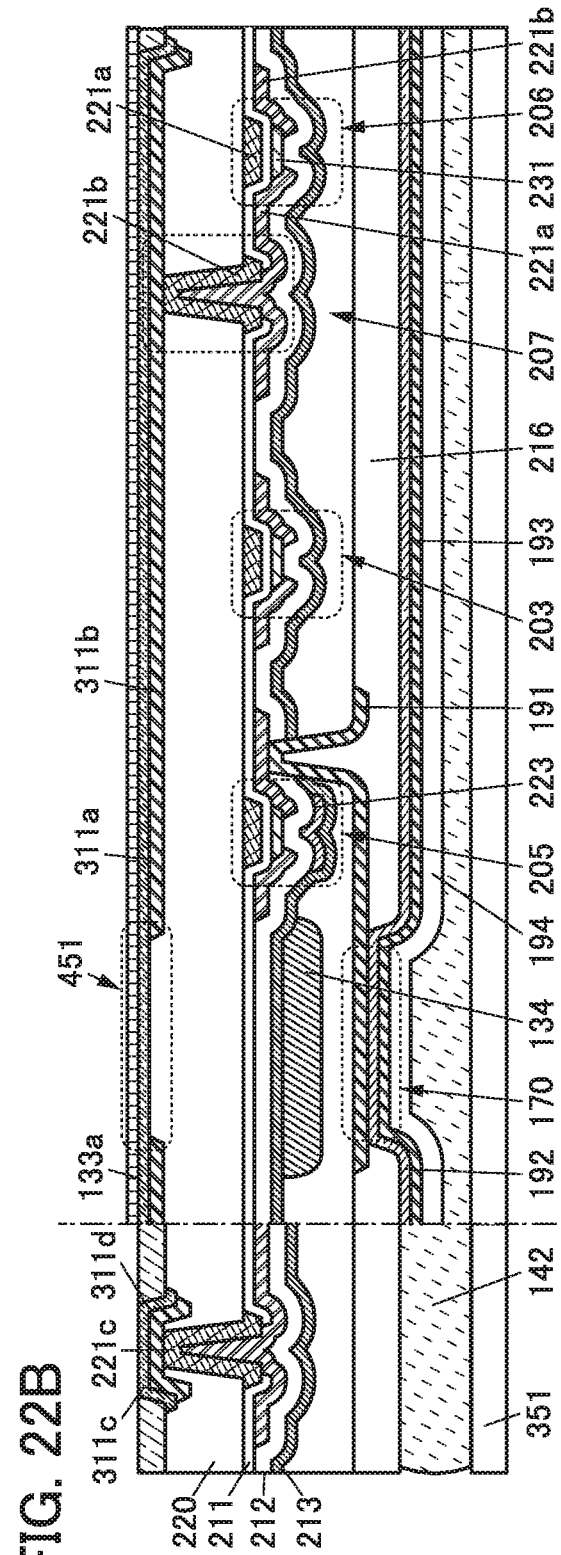
FIG. 22A
FIG. 22B

FIG. 28A
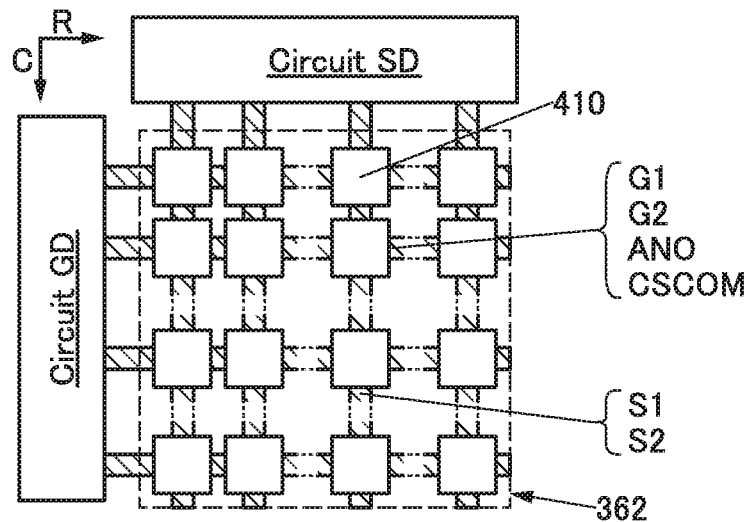
FIG. 28B1
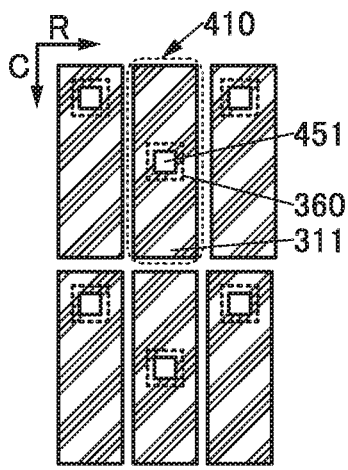
FIG. 28B2
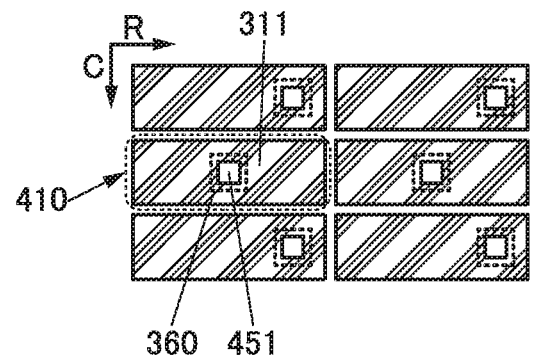
FIG. 28B3
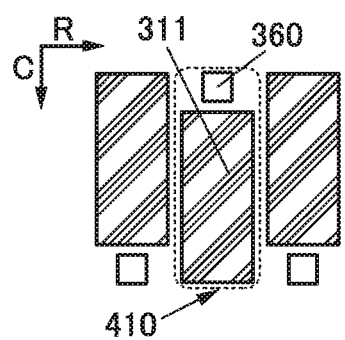
FIG. 28B4
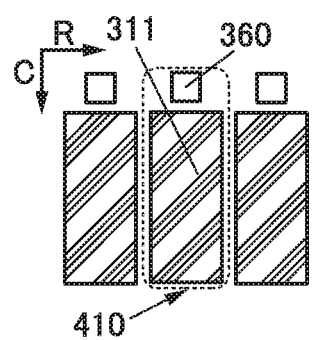

FIG. 30A
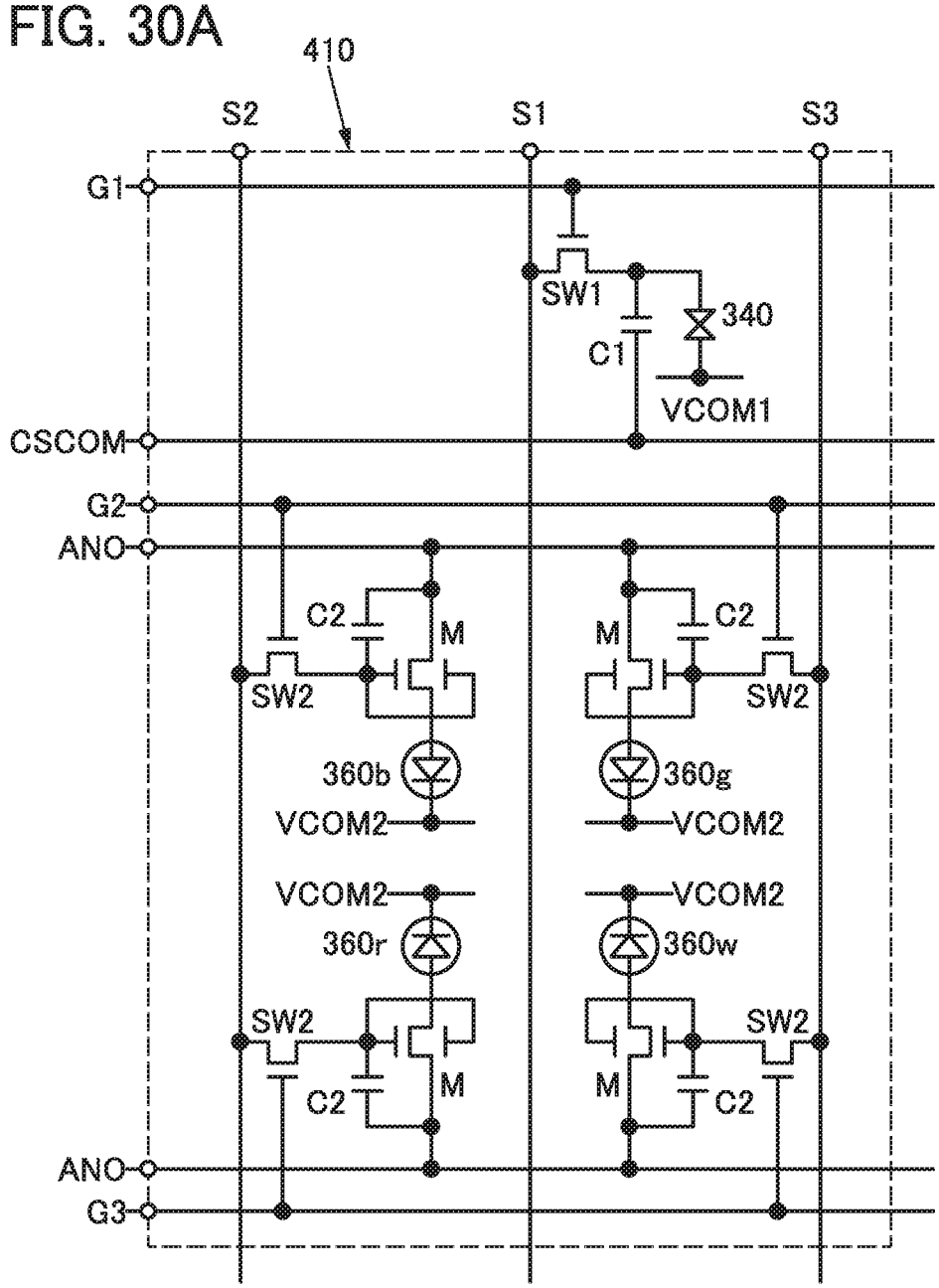
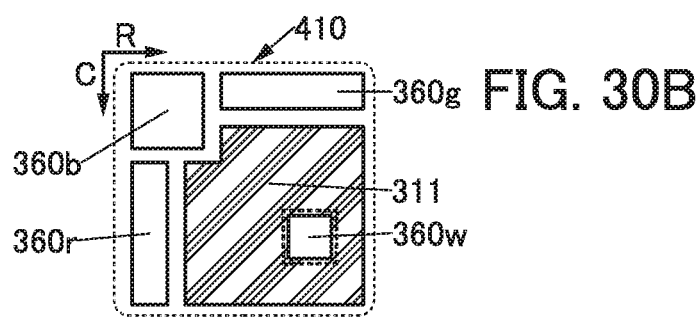
FIG. 30B

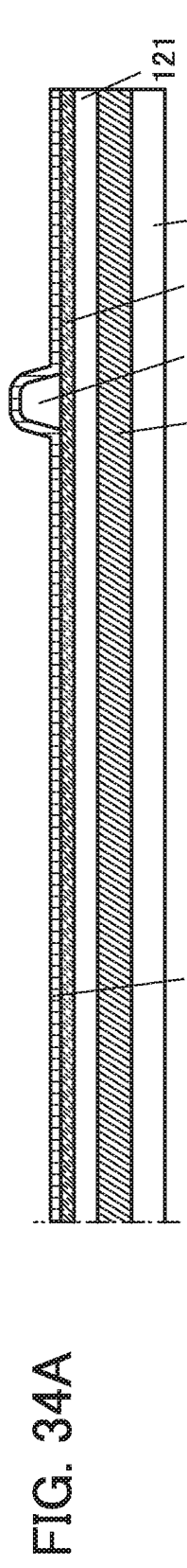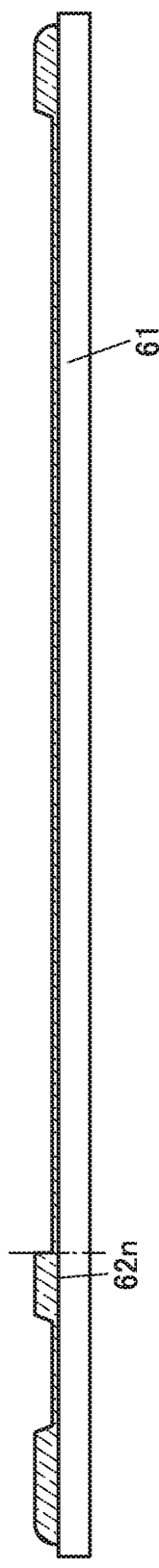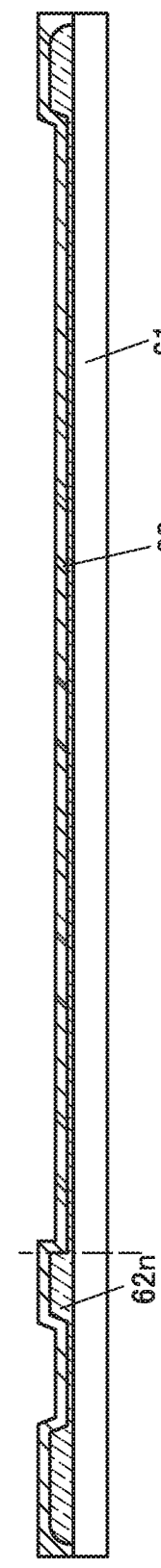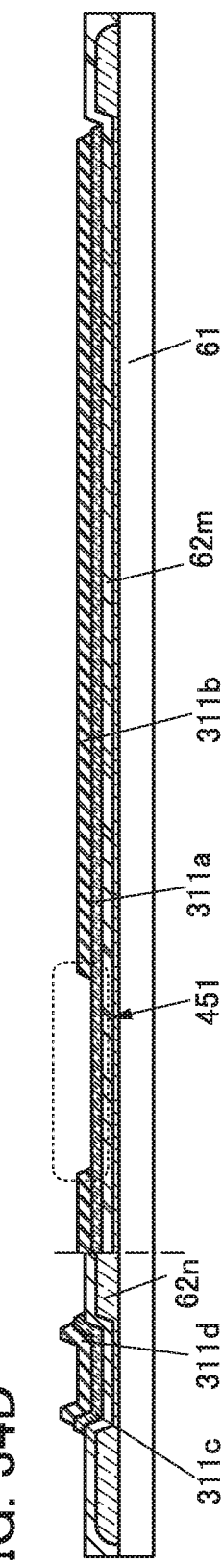

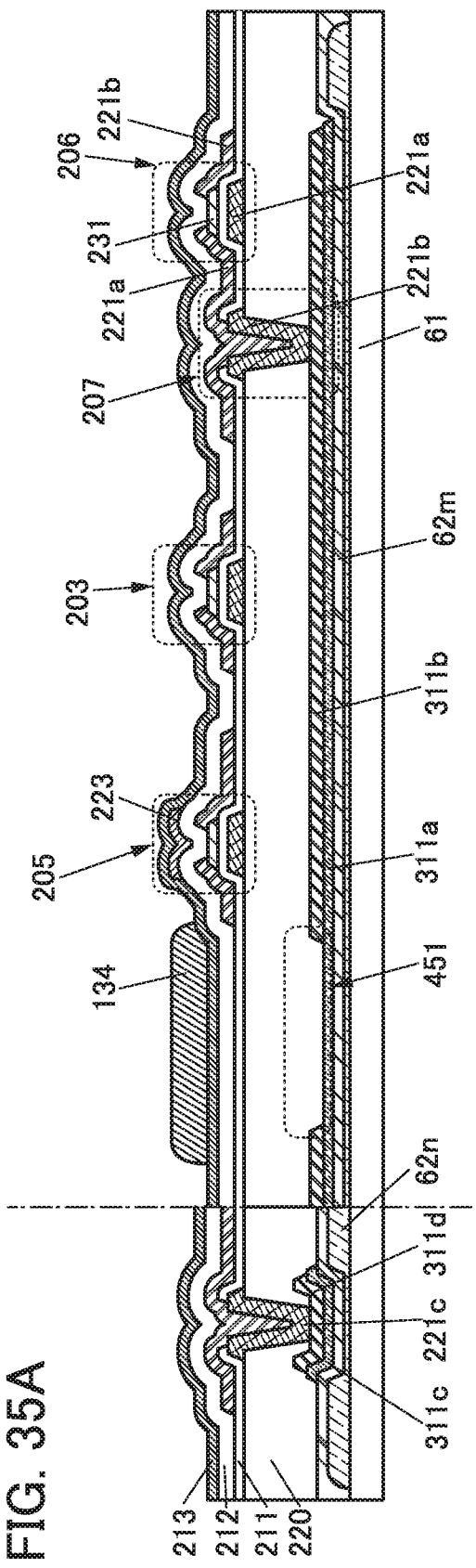
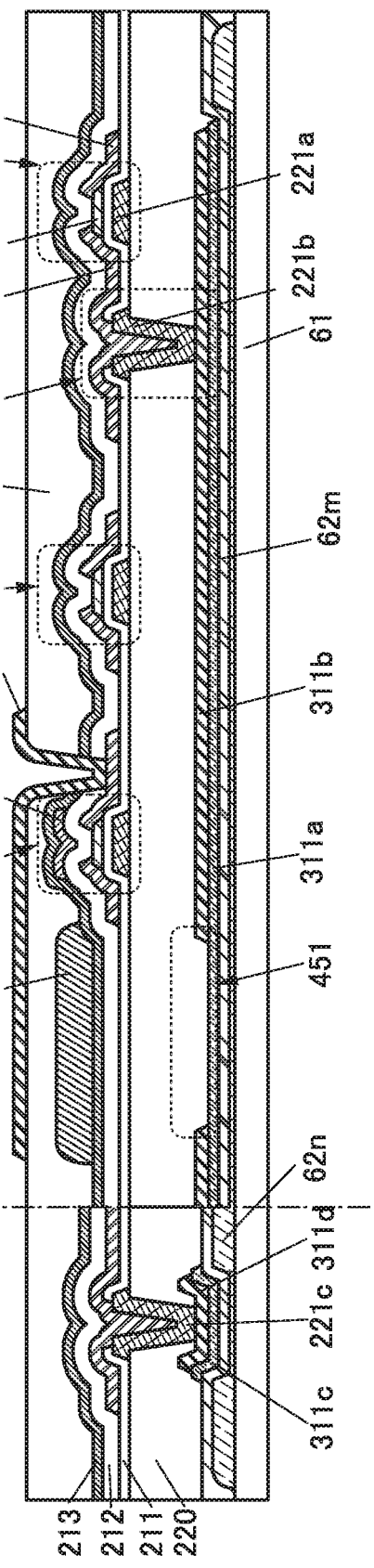
FIG. 35A
FIG. 35B

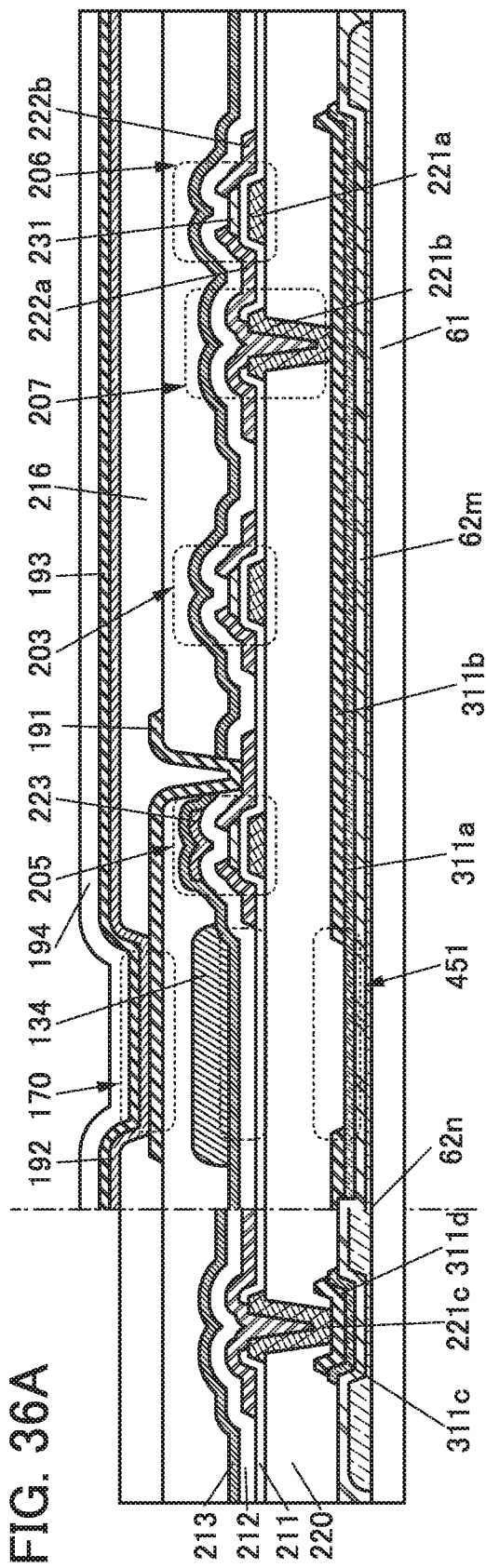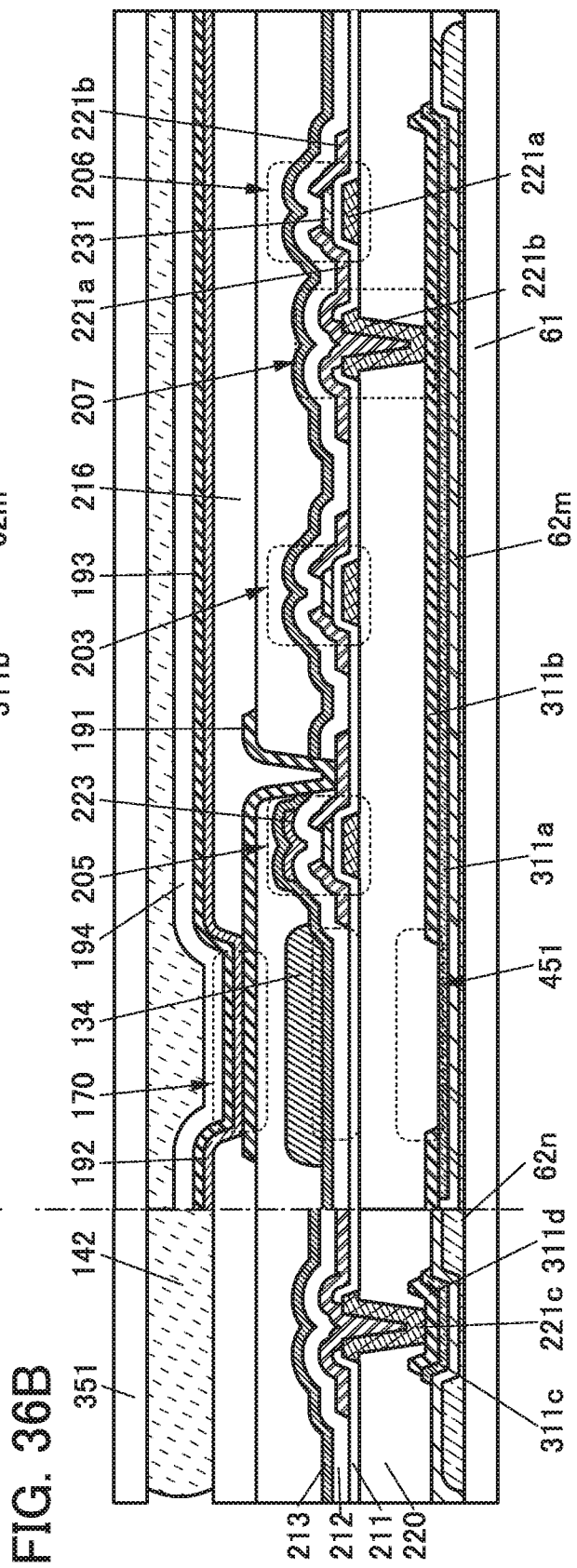

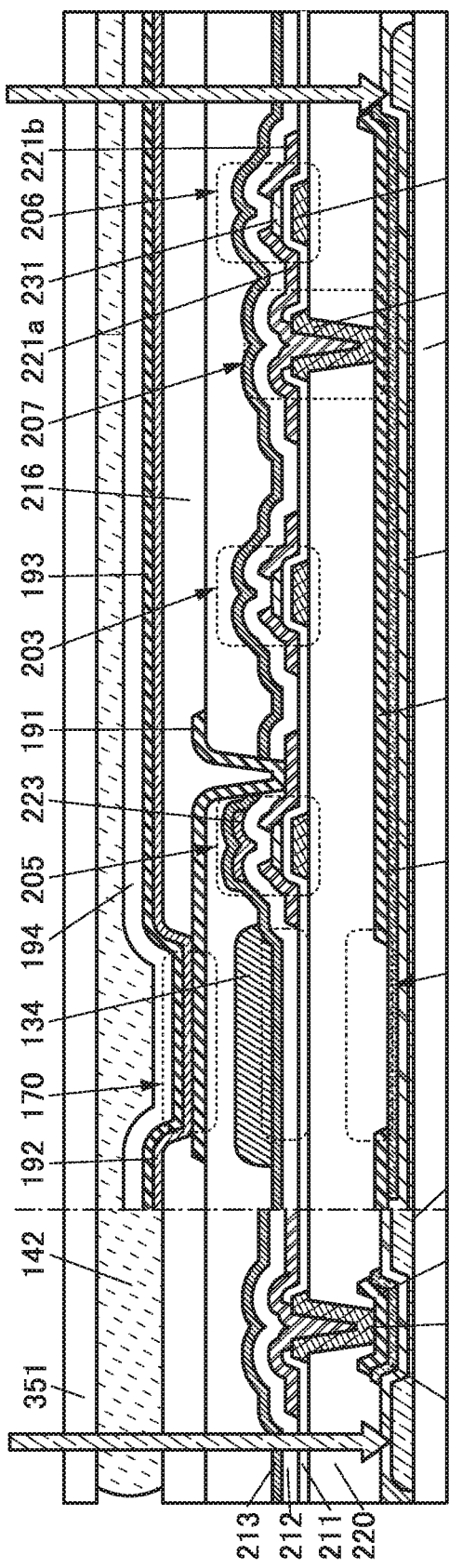
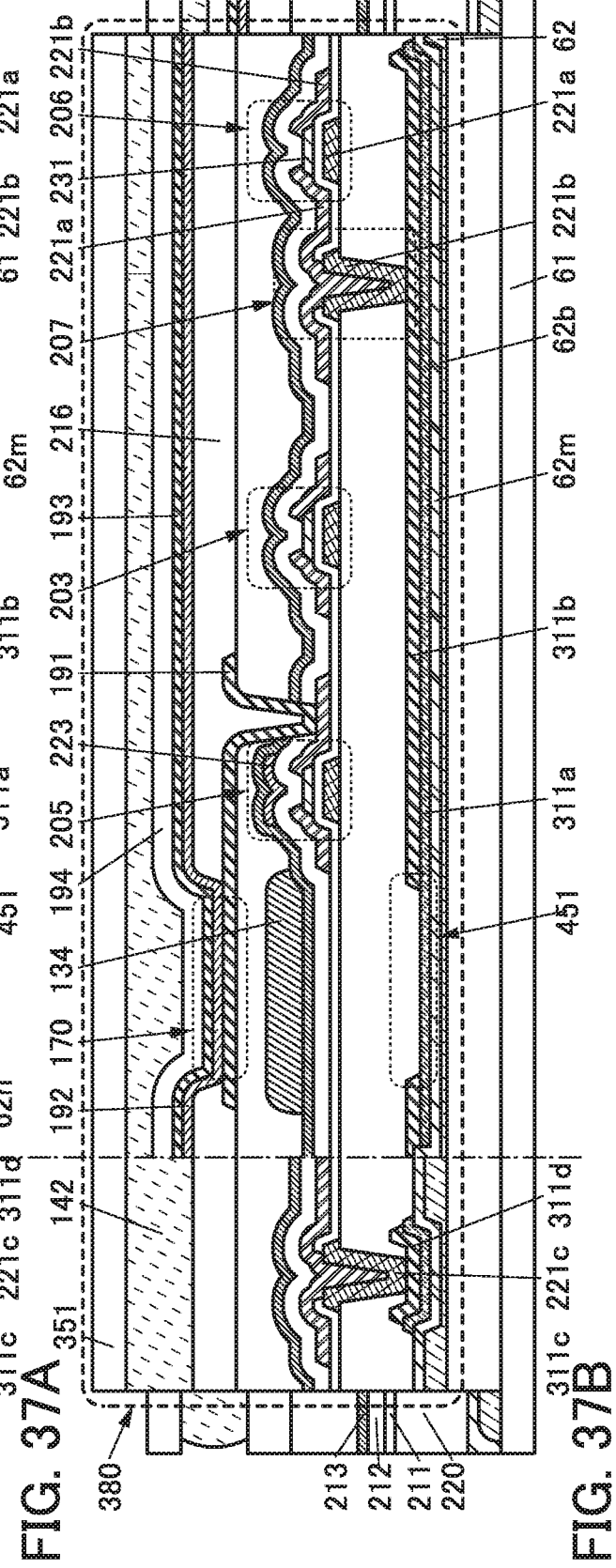
FIG. 37A
FIG. 37B

METHOD FOR MANUFACTURING DISPLAY
DEVICE, DISPLAY DEVICE, DISPLAY
MODULE, AND ELECTRONIC DEVICE

TECHNICAL FIELD

One embodiment of the present invention relates to a method for manufacturing a display device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition (composition of matter). Thus, more specifically, as the technical field of one embodiment of the present invention disclosed in this specification, a semiconductor device, a display device, a liquid crystal display device, a light-emitting device, a lighting device, a power storage device, a memory device, a driving method thereof, or a manufacturing method thereof can be given as an example.

BACKGROUND ART

In recent years, application of display devices to a variety of uses has been expected. Light-emitting devices including light-emitting elements, liquid crystal display devices including liquid crystal elements, and the like have been developed as display devices.

For example, a flexible light-emitting device using an organic EL (Electroluminescence) element is disclosed in Patent Document 1.

In Patent Document 2, a transflective liquid crystal display device having a region reflecting visible light and a region transmitting visible light is disclosed. The transflective liquid crystal display device can be used as a reflective liquid crystal display device in an environment where sufficient external light can be obtained and as a transmissive liquid crystal display device in an environment where sufficient external light cannot be obtained.

REFERENCE

Patent Document

[Patent Document 1] Japanese Published Patent Application No. 2014-197522
[Patent Document 2] Japanese Published Patent Application No. 2011-191750

SUMMARY OF THE INVENTION

Problems to be Solved by the Invention

An object of one embodiment of the present invention is to provide a method for manufacturing a display device with low power consumption. Another object of one embodiment of the present invention is to provide a method for manufacturing a display device with high visibility regardless of ambient brightness. Another object of one embodiment of the present invention is to provide a method for manufacturing an all-weather display device.

Another object of one embodiment of the present invention is to provide a method for manufacturing a display device with high convenience. Another object of one embodiment of the present invention is a method for manufacturing a thin or lightweight display device. Alternatively, another object of one embodiment of the present invention is to provide these manufacturing methods in a simpler manner.

Note that the description of these objects does not disturb the existence of other objects. One embodiment of the present invention does not necessarily achieve all the objects. Other objects can be derived from the description of the specification, the drawings, and the claims.

Means for Solving the Problems

One embodiment of the present invention is a method for manufacturing a display device, including a step of forming a first layer over a substrate by using a material containing a resin or a resin precursor, a step of forming a first region and a second region thinner than the first region in the first layer, a step of forming a first resin layer including a first region and a second region thinner than the first region by performing first heat treatment on the first layer while a gas containing oxygen is supplied, a step of forming a layer to be separated over the first resin layer, and a step of separating the layer to be separated and the substrate from each other. A step of forming, in contact with the first resin layer, a conductive layer which overlaps with the second region is included in the step of forming the layer to be separated. A step of exposing the conductive layer by removing the first resin layer is included after the step of separating the layer to be separated and the substrate from each other.

Another embodiment of the present invention is a method for manufacturing a display device, including a step of forming a first layer over a substrate by using a material containing a resin or a resin precursor, a step of performing first heat treatment on the first layer while a gas containing oxygen is supplied, a step of forming a first region and a second region thinner than the first region in the first layer subjected to the first heat treatment to form a first resin layer including a first region and a second region thinner than the first region, a step of forming a layer to be separated over the first resin layer, and a step of separating the layer to be separated and the substrate from each other. A step of forming, in contact with the first resin layer, a conductive layer which overlaps with the second region is included in the step of forming the layer to be separated. A step of exposing the conductive layer by removing the first resin layer is included after the step of separating the layer to be separated and the substrate from each other.

Another embodiment of the present invention is a method for manufacturing a display device, including a step of forming a first layer over a substrate by using a material containing a resin or a resin precursor, a step of forming a first region and a second region thinner than the first region in the first layer, a step of forming a first resin layer including a first region and a second region thinner than the first region by performing first heat treatment on the first layer while a gas containing oxygen is supplied, a step of forming an insulating layer covering an edge portion of the first resin layer over the substrate and over the first resin layer, a step of forming a layer to be separated over the insulating layer, and a step of separating the layer to be separated and the substrate from each other in such a manner that a separation trigger is formed by separating at least part of the first resin layer from the substrate. A step of forming, in contact with the insulating layer, a conductive layer which overlaps with the second region is included in the step of forming the layer to be separated. A step of exposing the conductive layer by removing the first resin layer is included after the step of separating the layer to be separated and the substrate from each other.

Another embodiment of the present invention is a method for manufacturing a display device, including a step of forming a first layer over a substrate by using a material containing a resin or a resin precursor, a step of performing first heat treatment on the first layer while a gas containing oxygen is supplied, a step of forming a first region and a second region thinner than the first region in the first layer subjected to the first heat treatment to form a first resin layer including a first region and a second region thinner than the first region, a step of forming an insulating layer covering an edge portion of the first resin layer over the substrate and over the first resin layer, a step of forming a layer to be separated over the insulating layer, and a step of separating the layer to be separated and the substrate from each other in such a manner that a separation trigger is formed by separating at least part of the first resin layer from the substrate. A step of forming, in contact with the first resin layer, a conductive layer which overlaps with the second region is included in the step of forming the layer to be separated. A step of exposing the conductive layer by removing the first resin layer is included after the step of separating the layer to be separated and the substrate from each other.

Another embodiment of the present invention is a method for manufacturing a display device, including a step of forming a first layer over a substrate by using a material containing a resin or a resin precursor, a step of forming a first region and a second region thinner than the first region in the first layer, a step of forming a first resin layer including a first region and a second region thinner than the first region by performing first heat treatment on the first layer while a gas containing oxygen is supplied, a step of forming a second layer covering an edge portion of the first resin layer over the substrate and over the first resin layer, a step of performing second heat treatment on the second layer in an atmosphere containing less oxygen than an atmosphere of the first heat treatment to form a second resin layer covering the edge portion of the first resin layer, a step of forming a layer to be separated over the second resin layer, and a step of separating the layer to be separated and the substrate from each other in such a manner that a separation trigger is formed by separating at least part of the first resin layer from the substrate. A step of forming, in contact with the insulating layer, a conductive layer which overlaps with the second region is included in the step of forming the layer to be separated. A step of exposing the conductive layer by removing the first resin layer is included after the step of separating the layer to be separated and the substrate from each other.

Another embodiment of the present invention is a method for manufacturing a display device, including a step of forming a first layer over a substrate by using a material containing a resin or a resin precursor, a step of performing first heat treatment on the first layer while a gas containing oxygen is supplied, a step of forming a first region and a second region thinner than the first region in the first layer subjected to the first heat treatment to form a first resin layer including a first region and a second region thinner than the first region, a step of forming a second layer covering an edge portion of the first resin layer over the substrate and over the first resin layer, a step of performing second heat treatment on the second layer in an atmosphere containing less oxygen than an atmosphere of the first heat treatment to form a second resin layer covering the edge portion of the first resin layer, a step of forming a layer to be separated over the second resin layer, and a step of separating the layer to be separated and the substrate from each other in such a manner that a separation trigger is formed by separating at least part of the first resin layer from the substrate. A step of forming, in contact with the first resin layer, a conductive layer which overlaps with the second region is included in the step of forming the layer to be separated. A step of exposing the conductive layer by removing the first resin layer is included after the step of separating the layer to be separated and the substrate from each other.

Another embodiment of the present invention is a method for manufacturing a display device including a first display element, a second display element, a first insulating layer, and a conductive layer. The first display element includes a first pixel electrode having a function of reflecting visible light, a liquid crystal, and a first common electrode having a function of transmitting visible light. The second display element includes a second pixel electrode having a function of transmitting visible light, a light-emitting layer, and a second common electrode having a function of reflecting visible light. The method includes a step of forming the first common electrode over a first substrate, a step of forming a resin layer including a first region and a second region thinner than the first region over a formation substrate by using a material containing a resin or a resin precursor, a step of forming the first pixel electrode over the resin layer, a step of forming the conductive layer covering the second region, performed concurrently with the step of forming the first pixel electrode, a step of forming the first insulating layer over the first pixel electrode, a step of forming the second pixel electrode, the light-emitting layer, and the second common electrode in this order over the insulating layer to form the second display element, a step of bonding the formation substrate and a second substrate to each other with an adhesive layer, a step of separating the formation substrate and the first pixel electrode from each other, and a step of positioning the liquid crystal between the first common electrode and the first pixel electrode and bonding the first substrate and the second substrate to each other with an adhesive layer to form the first display element. The resin layer is a layer formed through a process of first heat treatment in an atmosphere containing oxygen.

Another embodiment of the present invention is a method for manufacturing a display device including a first display element, a second display element, a first insulating layer, and a conductive layer. The first display element includes a first pixel electrode having a function of reflecting visible light, a liquid crystal, and a first common electrode having a function of transmitting visible light. The second display element includes a second pixel electrode having a function of transmitting visible light, a light-emitting layer, and a second common electrode having a function of reflecting visible light. The method includes a step of forming the first common electrode over a first substrate, a step of forming a resin layer including a first region and a second region thinner than the first region over a formation substrate by using a material containing a resin or a resin precursor, a step of forming a second insulating layer covering an edge portion of the resin layer, a step of forming the first pixel electrode over the insulating layer, a step of forming the conductive layer covering the second region, performed concurrently with the step of forming the first pixel electrode, a step of forming the first insulating layer over the first pixel electrode, a step of forming the second pixel electrode, the light-emitting layer, and the second common electrode in this order over the insulating layer to form the second display element, a step of bonding the formation substrate and a second substrate to each other with an adhesive layer, a step of separating the formation substrate and the first pixel electrode from each other, and a step of positioning the liquid crystal between the first common electrode and the first pixel electrode and bonding the first substrate and the second substrate to each other with an adhesive layer to form the first display element. The resin layer is a layer formed through a process of first heat treatment in an atmosphere containing oxygen.

Another embodiment of the present invention is the method for manufacturing the display device having the above structure, in which a material of the second insulating layer is an inorganic insulating material.

Another embodiment of the present invention is the method for manufacturing the display device having the above structure in which a material of the second insulating layer is a resin or a resin precursor.

Another embodiment of the present invention is the method for manufacturing the display device having the above structure in which a material of the second insulating layer is identical to a material of the resin layer.

Another embodiment of the present invention is the method for manufacturing the display device having the above structure in which the second insulating layer is a layer formed through second heat treatment in an atmosphere containing less oxygen than that of the first heat treatment.

Another embodiment of the present invention is a separation method in the method for manufacturing the display device having the above structure in which the second heat treatment is performed while a nitrogen gas is supplied.

Another embodiment of the present invention is a separation method in the method for manufacturing the display device having the above structure in which the second heat treatment is performed at a temperature lower than that of the first heat treatment while a mixed gas containing nitrogen and oxygen is supplied.

Another embodiment of the present invention is a separation method in the method for manufacturing the display device having the above structure in which the first heat treatment is performed while a mixed gas where the proportion of an oxygen gas flow rate in a whole gas flow rate is greater than or equal to 5% and less than or equal to 50% is supplied.

Another embodiment of the present invention is a separation method in the method for manufacturing the display device having the above structure in which the first heat treatment is performed at a temperature of greater than or equal to 350° C. and less than or equal to 450° C. while a mixed gas containing nitrogen and oxygen is supplied.

Another embodiment of the present invention is the method for manufacturing the display device having the above structure in which a step of exposing the conductive layer is further included after the step of separating the formation substrate and the first pixel electrode from each other.

Another embodiment of the present invention is the method for manufacturing the display device having the above structure, further including a step in which a wiring for inputting a signal or power is connected to the exposed conductive layer through a connection layer.

Another embodiment of the present invention is the method for manufacturing the display device having the above structure in which the exposed conductive layer is connected to the first common electrode through a connector.

Another embodiment of the present invention is the method for manufacturing a display device having the above structure in which a step of forming a transistor including a metal oxide in a channel formation region is included between the step of forming the first pixel electrode and the step of forming the second pixel electrode, and, in the step of forming the resin layer, the resin layer is heated at a temperature higher than a temperature for heating performed in the step of forming the transistor.

One embodiment of the present invention can provide a method for manufacturing a display device with low power consumption. One embodiment of the present invention can provide a method for manufacturing a display device with high visibility regardless of ambient brightness. One embodiment of the present invention can provide a method for manufacturing an all-weather display device. One embodiment of the present invention can provide a method for manufacturing a highly convenient display device. One embodiment of the present invention can provide a method for manufacturing a thin or lightweight display device.

BRIEF DESCRIPTION OF DRAWINGS

FIG. 7 Cross-sectional views illustrating an example of a method for manufacturing a display device.

FIG. 8 Cross-sectional views illustrating an example of a method for manufacturing a display device.

FIG. 9 Cross-sectional views illustrating an example of a method for manufacturing a display device.

FIG. 10 Cross-sectional views illustrating an example of a method for manufacturing a display device.

FIG. 13 Cross-sectional views illustrating an example of a method for manufacturing a display device.

FIG. 14 Cross-sectional views illustrating an example of a method for manufacturing a display device.

FIG. 15 Cross-sectional views illustrating an example of a method for manufacturing a display device.

FIG. 17 Cross-sectional views illustrating an example of a method for manufacturing a display device.

FIG. 19 Cross-sectional views illustrating an example of a method for manufacturing a display device.

FIG. 20 Cross-sectional views illustrating an example of a method for manufacturing the display device.

FIG. 21 Cross-sectional views illustrating an example of a method for manufacturing the display device.

FIG. 22 Cross-sectional views illustrating an example of a method for manufacturing the display device.

FIG. 28 Drawings illustrating an example of a display device and examples of pixels.

FIG. 30 A circuit diagram illustrating an example of a pixel circuit of a display device, and a drawing illustrating an example of a pixel.

FIG. 34 Cross-sectional views illustrating an example of a method for manufacturing a display device.

FIG. 35 Cross-sectional views illustrating an example of a method for manufacturing a display device.

FIG. 36 Cross-sectional views illustrating an example of a method for manufacturing a display device.

FIG. 37 Cross-sectional views illustrating an example of a method for manufacturing a display device.

MODE FOR CARRYING OUT THE INVENTION

Figure 1:
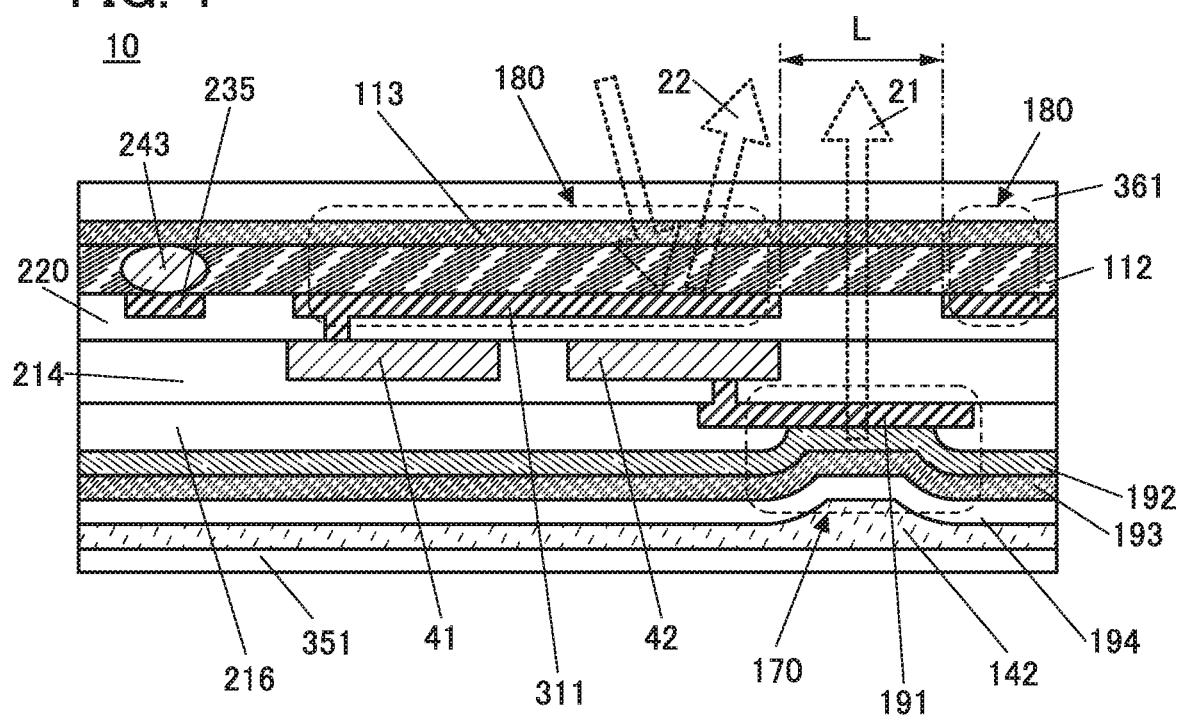
FIG. 1 A cross-sectional view illustrating an example of a display device.

Embodiments will be described in detail with reference to the drawings. Note that the present invention is not limited to the following description, and it will be easily understood by those skilled in the art that the modes and details can be changed in various ways without departing from the spirit and scope of the present invention. Therefore, the present invention should not be interpreted as being limited to the description in the following embodiments.

Note that in the structures of the invention described below, the same portions or portions having similar functions are denoted by the same reference numerals in different drawings, and are not repeatedly described. Furthermore, the same hatch pattern is used for portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

In this specification and the like, a metal oxide (metal oxide) means an oxide of metal in a broad sense. Metal oxides are classified into an oxide insulator, an oxide conductor (including a transparent oxide conductor), an oxide semiconductor (an Oxide Semiconductor or also simply referred to as an OS), and the like. For example, in the case where a metal oxide is used for a semiconductor layer of a transistor, the metal oxide is called an oxide semiconductor in some cases. That is, an OS FET can also be called a transistor including a metal oxide or an oxide semiconductor.

In addition, in this specification and the like, a metal oxide including nitrogen is also called a metal oxide (metal oxide) collectively in some cases. Moreover, a metal oxide including nitrogen may be called a metal oxynitride (metal oxynitride).

Furthermore, in this specification and the like, CAAC (c-axis aligned crystal) and CAC (Cloud-Aligned Composite) is sometimes stated. Note that CAAC refers to an example of a crystal structure, and CAC refers to an example of a function or a material composition.

An example of a crystal structure of an oxide semiconductor or a metal oxide is described. Note that an oxide semiconductor deposited by a sputtering method using an In—Ga—Zn oxide target (In:Ga:Zn=4:2:4.1 [atomic ratio]) is described below as an example. An oxide semiconductor formed by a sputtering method using the above-mentioned target at a substrate temperature of higher than or equal to 100° C. and lower than or equal to 130° C. is referred to as sIGZO, and an oxide semiconductor formed by a sputtering method using the above-mentioned target with the substrate temperature set at room temperature (R.T.) is referred to as tIGZO. For example, sIGZO has one or both crystal structures of nc (nano crystal) and CAAC. Furthermore, tIGZO has a crystal structure of nc. Note that room temperature (R.T.) herein also refers to a temperature of the time when a substrate is not heated intentionally.

In addition, in this specification and the like, a CAC-OS or a CAC-metal oxide has a function of a conductor in part of the material and has a function of a dielectric (or insulator) in another part of the material, and has a function of a semiconductor as a whole. Note that in the case where a CAC-OS or a CAC-metal oxide is used in a semiconductor layer of a transistor, the conductor has a function of letting electrons (or holes) serving as carriers flow, and the dielectric has a function of not letting electrons serving as carriers flow. By the complementary action of the function as a conductor and the function as a dielectric, a switching function (On/Off function) can be given to the CAC-OS or CAC-metal oxide. In the CAC-OS or CAC-metal oxide, both of the functions can be maximized by separating these functions.

Moreover, in this specification and the like, a CAC-OS or a CAC-metal oxide includes conductor regions and dielectric regions. The conductor regions have the above-described function of the conductor, and the dielectric regions have the above-described function of the dielectric. In some cases, the conductor regions and the dielectric regions in the material are separated at the nanoparticle level. In some cases, the conductor regions and the dielectric regions are unevenly distributed in the material. The conductor regions are sometimes observed to be coupled in a cloud-like manner with their boundaries blurred, in some cases.

In other words, a CAC-OS or a CAC-metal oxide can also be called a matrix composite (matrix composite) or a metal matrix composite (metal matrix composite).

Furthermore, in the CAC-OS or CAC-metal oxide, the conductor regions and the dielectric regions each have a size of more than or equal to 0.5 nm and less than or equal to 10 nm, preferably more than or equal to 0.5 nm and less than or equal to 3 nm, and are dispersed in the material, in some cases.

Embodiment 1

In this embodiment, a display device of one embodiment of the present invention will be described with reference to FIG. 1 to FIG. 23.

The display device of this embodiment includes a first display element reflecting visible light and a second display element emitting visible light.

The display device of this embodiment has a function of displaying an image using one or both of light reflected by the first display element and light emitted from the second display element.

As the first display element, an element which performs display by reflecting external light can be used. Such an element does not include a light source; thus, power consumed in performing display can be significantly reduced.

As the first display element, typically, a reflective liquid crystal element can be used. Alternatively, as the first display element, an element or the like using a microcapsule method, an electrophoretic method, an electrowetting method, an Electronic Liquid Powder (registered trademark) method, or the like can be used, other than a shutter type MEMS (Micro Electro Mechanical System) element or an optical interference type MEMS element.

As the second display element, a light-emitting element is preferably used. Since the luminance and the chromaticity of light emitted from such a display element are not affected by external light, display of a clear image that has high color reproducibility (wide color gamut) and a high contrast can be performed.

As the second display element, a self-luminous light-emitting element such as an OLED (Organic Light Emitting Diode), an LED (Light Emitting Diode), or a QLED (Quantum-dot Light Emitting Diode) can be used.

The display device of this embodiment has a first mode in which an image is displayed using only the first display element, a second mode in which an image is displayed using only the second display element, and a third mode in which an image is displayed using the first display element and the second display element, and can be automatically or manually switched between these modes.

In the first mode, an image is displayed using the first display element and external light. The first mode, which does not need a light source, is an extremely low power consumption mode. When sufficient external light enters the display device (e.g., in a bright environment), for example, display can be performed by using light reflected by the first display element. The first mode is effective in the case where external light is white light or light near white light and is sufficiently strong, for example. The first mode is a mode suitable for displaying text. Furthermore, the first mode enables eye-friendly display owing to the use of reflected external light, by which eyestrain is not easily caused.

In the second mode, an image is displayed using light emission from the second display element. Thus, display of an extremely vivid image (with high contrast and excellent color reproducibility) can be performed regardless of the illuminance and the chromaticity of external light. The second mode is effective in the case of extremely low illuminance, such as in a night environment or in a dark room, for example. When display of a bright image is performed in a dark environment, a user may feel that the image is too bright. To prevent this, display with reduced luminance is preferably performed in the second mode. Accordingly, glare can be reduced, and power consumption can also be reduced. The second mode is a mode suitable for displaying a vivid (still and moving) image or the like.

The third mode performs display using both reflected light from the first display element and light emission from the second display element. While the third mode performs display of a more vivid image than the first mode, the power consumption can be lower than that in the second mode. The third mode is effective in the case where the illuminance is relatively low or in the case where the chromaticity of external light is not white, for example, in an environment under indoor illumination or in a time period such as morning or evening. In addition, an image that makes us feel as if we are looking at paintings can be displayed with the use of a mixture of reflected light and light emission.

With such a structure, a highly convenient display device with high visibility regardless of the ambient brightness or an all-weather display device can be achieved.

FIG. 1 is a cross-sectional view of a display device 10. The display device 10 includes a liquid crystal element 180 as the first display element and a light-emitting element 170 as the second display element.

The display device 10 illustrated in FIG. 1 includes the liquid crystal element 180, the light-emitting element 170, a transistor 41, a transistor 42, and the like between a pair of substrates (a substrate 351 and a substrate 361).

The liquid crystal element 180 includes an electrode 311 having a function of reflecting visible light, a liquid crystal 112, and an electrode 113 having a function of transmitting visible light. The liquid crystal 112 is positioned between the electrode 311 and the electrode 113.

The liquid crystal element 180 has a function of reflecting visible light. The liquid crystal element 180 emits reflected light 22 to the substrate 361 side.

The electrode 311 is electrically connected to a source or a drain of the transistor 41 through an opening provided in an insulating layer 220. The electrode 311 functions as a pixel electrode. The electrode 113 is electrically connected to a conductive layer 235 via a connector 243. The electrode 311 and the conductive layer 235 can be obtained by processing the same conductive film.

The light-emitting element 170 includes an electrode 191, an EL layer 192, and an electrode 193. The EL layer 192 is positioned between the electrode 191 and the electrode 193. The EL layer 192 contains at least a light-emitting substance. The electrode 191 has a function of transmitting visible light. The electrode 193 preferably has a function of reflecting visible light.

The light-emitting element 170 has a function of emitting visible light. Specifically, the light-emitting element 170 is an electroluminescent element that emits light (light emission 21) to the substrate 361 side by applying voltage between the electrode 191 and the electrode 193.

The electrode 191 is electrically connected to a source or a drain of the transistor 42 through an opening provided in an insulating layer 214. The electrode 191 functions as a pixel electrode. An end portion of the electrode 191 is covered with an insulating layer 216.

The light-emitting element 170 is preferably covered with an insulating layer 194. In FIG. 1, the insulating layer 194 is provided in contact with the electrode 193. With provision of the insulating layer 194, entry of an impurity to the light-emitting element 170 can be suppressed, leading to an increase in the reliability of the light-emitting element 170. The substrate 351 is bonded to the insulating layer 194 with an adhesive layer 142.

The transistor 41 and the transistor 42 are positioned on the same plane. The transistor 41 has a function of controlling the driving of the liquid crystal element 180. The transistor 42 has a function of controlling the driving of the light-emitting element 170.

A circuit electrically connected to the liquid crystal element 180 is preferably formed on the same plane on which a circuit electrically connected to the light-emitting element 170 is formed. Accordingly, the thickness of the display device can be made smaller than that in the case where the two circuits are formed on different planes. Furthermore, since the two transistors can be formed in the same process, a manufacturing process can be simplified as compared to the case where the two transistors are formed on different planes.

The electrode 311, which serves as the pixel electrode of the liquid crystal element 180, is positioned on the opposite side of the electrode 191, which serves as the pixel electrode of the light-emitting element 170, with gate insulating layers included in the transistors 41 and 42 interposed therebetween.

Here, in the case where the transistor 41 including an oxide semiconductor in its channel formation region and having extremely low off-state current is used, the case where a memory element electrically connected to the transistor 41 is used, or the like, the gradation can be maintained even if writing operation to a pixel is stopped in displaying a still image using the liquid crystal element 180. In other words, an image can be kept displayed even with an extremely low frame rate. In one embodiment of the present invention, the frame rate can be made extremely low and driving with low power consumption can be performed.

Next, structure examples of the display device of this embodiment will be described with reference to FIG. 2 to FIG. 7.

Structure Example 1

Figure 2:
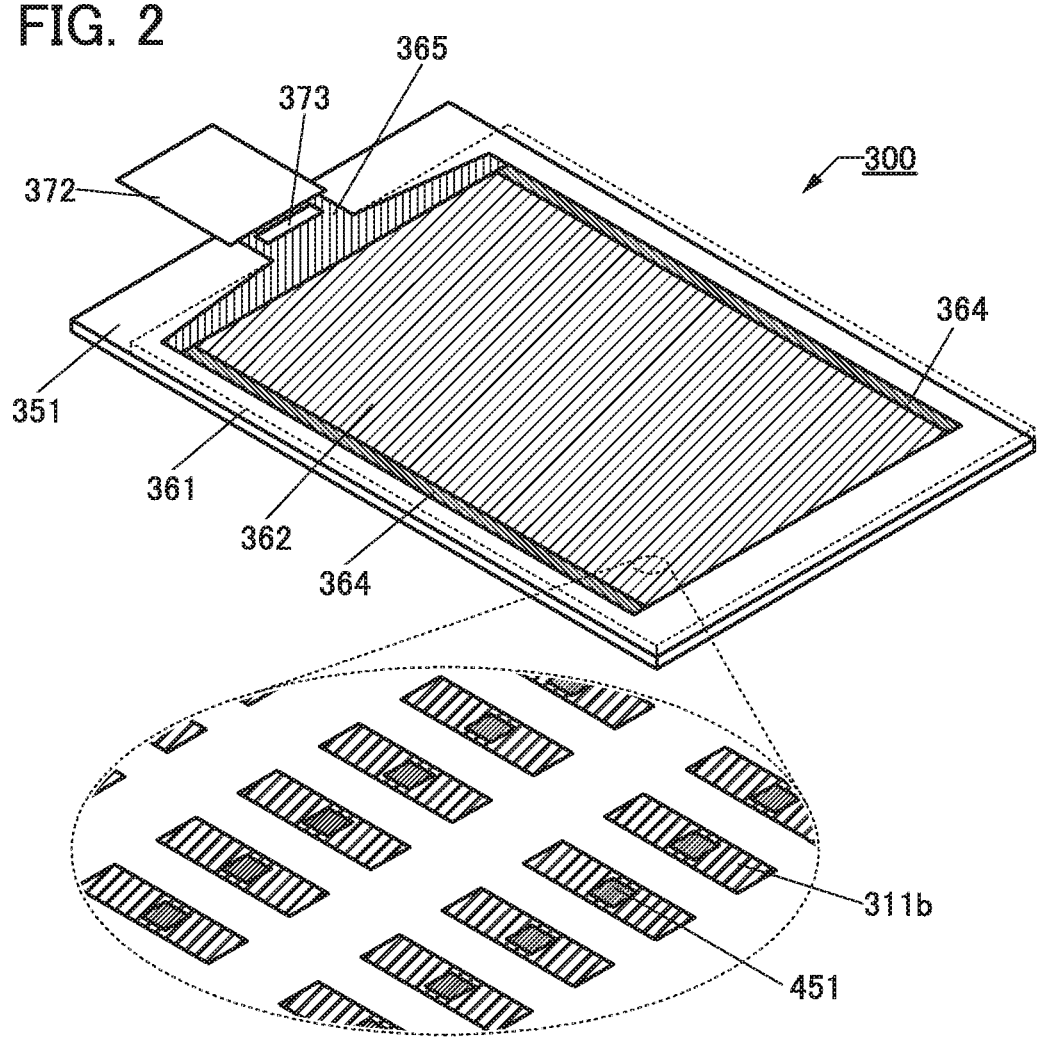
FIG. 2 A cross-sectional view illustrating an example of a display device.

FIG. 2 is a schematic perspective view of a display device 300. In the display device 300, the substrate 351 and the substrate 361 are bonded to each other. In FIG. 2, the substrate 361 is denoted by a dashed line.

The display device 300 includes a display portion 362, a circuit 364, a wiring 365, and the like. FIG. 2 illustrates an example in which an IC (integrated circuit) 373 and an FPC 372 are mounted on the display device 300. Thus, the structure illustrated in FIG. 2 can be regarded as a display module including the display device 300, the IC, and the FPC.

As the circuit 364, for example, a scan line driver circuit can be used.

The wiring 365 has a function of supplying a signal and power to the display portion 362 and the circuit 364. The signal and power are input to the wiring 365 from the outside through the FPC 372 or from the IC 373.

FIG. 2 illustrates an example in which the IC 373 is provided over the substrate 351 by a COG (Chip On Glass) method, a COF (Chip on Film) method, or the like. An IC including a scan line driver circuit, a signal line driver circuit, or the like can be used for the IC 373, for example. Note that the display device 300 and the display module are not necessarily provided with an IC. In addition, the IC may be mounted on the FPC by a COF method or the like.

FIG. 2 illustrates an enlarged view of part of the display portion 362. Electrodes 311*b* included in a plurality of display elements are arranged in a matrix in the display portion 362. The electrode 311*b* has a function of reflecting visible light, and functions as a reflective electrode of the liquid crystal element 180.

In addition, as illustrated in FIG. 2, the electrode 311*b* includes an opening 451. Furthermore, the display portion 362 includes the light-emitting element 170 that is positioned closer to the substrate 351 than the electrode 311*b*. Light from the light-emitting element 170 is emitted to the substrate 361 side through the opening 451 in the electrode 311*b*.

Figure 3:
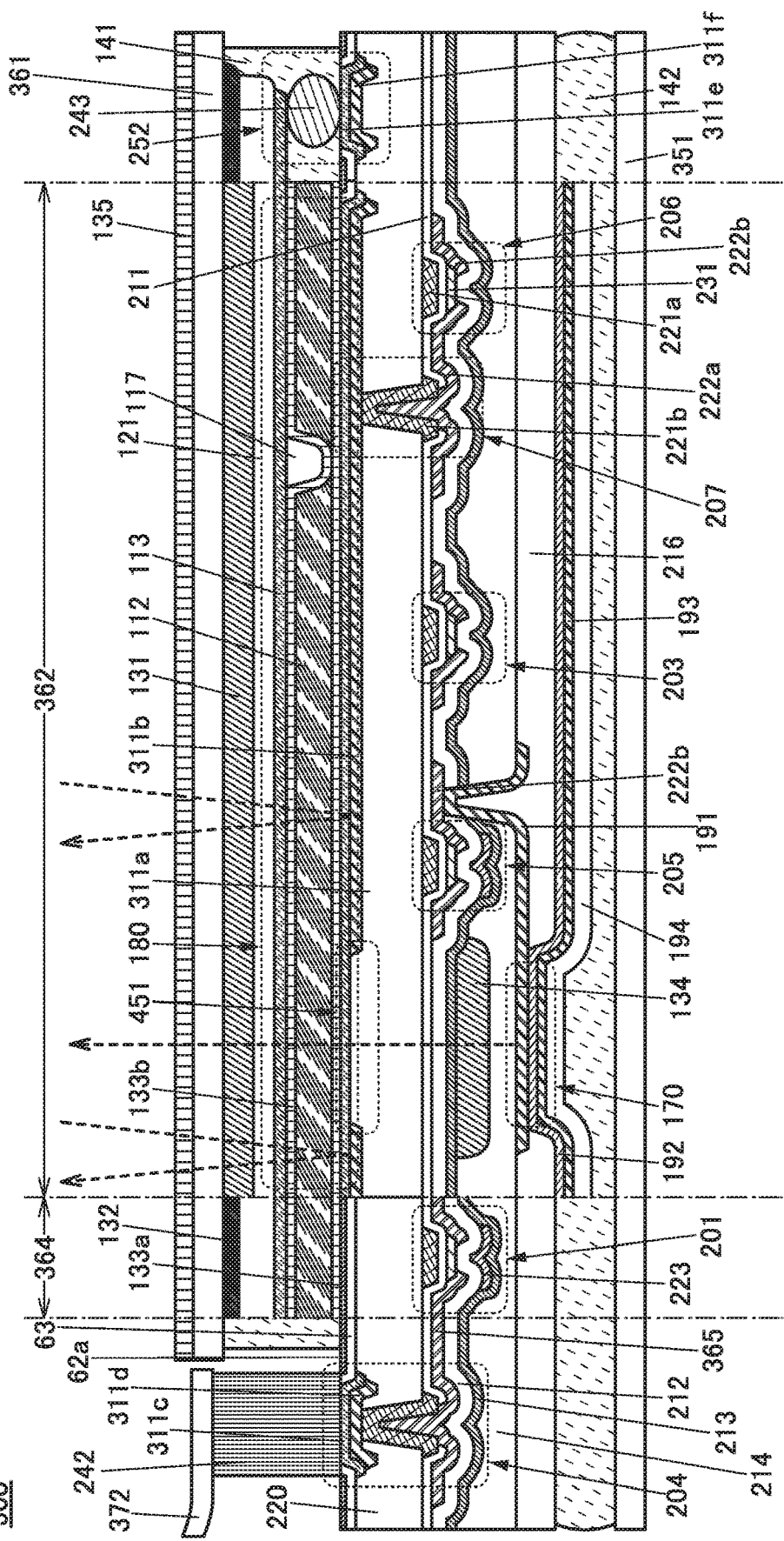
FIG. 3 A cross-sectional view illustrating an example of a display device.

FIG. 3 illustrates an example of cross-sections of part of a region including the FPC 372, part of a region including the circuit 364, and part of a region including the display portion 362 of the display device 300 illustrated in FIG. 2.

The display device 300 illustrated in FIG. 3 includes a transistor 201, a transistor 203, a transistor 205, a transistor 206, the liquid crystal element 180, the light-emitting element 170, the insulating layer 220, a coloring layer 131, a coloring layer 134, and the like, between the substrate 351 and the substrate 361. The substrate 361 and the insulating layer 220 are bonded to each other with an adhesive layer 141. The substrate 351 and the insulating layer 220 are bonded to each other with the adhesive layer 142.

The substrate 361 is provided with the coloring layer 131, a light-blocking layer 132, an insulating layer 121, the electrode 113 functioning as a common electrode of the liquid crystal element 180, an alignment film 133*b*, an insulating layer 117, and the like. A polarizing plate 135 is provided on an outer surface of the substrate 361. The insulating layer 121 may have a function of a planarization layer. The insulating layer 121 enables the electrode 113 to have an almost flat surface, resulting in a uniform alignment state of the liquid crystal 112. The insulating layer 117 functions as a spacer for holding a cell gap of the liquid crystal element 180.

The liquid crystal element 180 is a reflective liquid crystal element. The liquid crystal element 180 has a stacked-layer structure of an electrode 311*a*, the liquid crystal 112, and the electrode 113. The electrode 311*b* that reflects visible light is provided in contact with a surface of the electrode 311*a* on the substrate 351 side. The electrode 311*b* includes the opening 451. The electrode 311*a* and the electrode 113 transmit visible light. An alignment film 133*a* is provided between the liquid crystal 112 and the electrode 311*a*. The alignment film 133*b* is provided between the liquid crystal 112 and the electrode 113.

In the liquid crystal element 180, the electrode 311*b* has a function of reflecting visible light, and the electrode 113 has a function of transmitting visible light. Light entering from the substrate 361 side is polarized by the polarizing plate 135, transmitted through the electrode 113, the liquid crystal 112, and the electrode 311*a*, and reflected by the electrode 311*b*. Then, the light is transmitted through the electrode 311*a*, the liquid crystal 112, and the electrode 113 again to reach the polarizing plate 135. In this case, alignment of the liquid crystal can be controlled with a voltage that is applied between the electrode 311*b* and the electrode 113, and thus optical modulation of light can be controlled. In other words, the intensity of light emitted through the polarizing plate 135 can be controlled. Light excluding light in a particular wavelength region is absorbed by the coloring layer 131, and thus, extracted light exhibits light of desired color, for example, red.

Note that a resin layer 62*a* and an insulating layer 63 do not exist between the electrode 311*a* and the liquid crystal 112, which are formed in the display portion 362, and thus an adverse effect due to refraction of light or coloring of the resin layer 62*a* or the insulating layer 63 can be reduced. Therefore, this structure is preferable. The resin layer 62*a* and the insulating layer 63 can be easily removed in this structure because the electrode 311*a* and the electrode 311*b* are formed to cover recess portions provided in the resin layer 62 and the insulating layer 63 similar to a conductive layer 311*c*, a conductive layer 311*d*, a conductive layer 311*e*, and a conductive layer 311*f*.

As illustrated in FIG. 3, the electrode 311*a* that transmits visible light is preferably provided across the opening 451. Accordingly, the liquid crystal 112 is aligned in a region overlapping with the opening 451 as in the other regions, in which case generation of an alignment defect of the liquid crystals in a boundary portion of these regions and undesired light leakage can be suppressed.

At a connection portion 207, the electrode 311*b* is electrically connected to a conductive layer 222*a* included in the transistor 206 via a conductive layer 221*b*. The transistor 206 has a function of controlling the driving of the liquid crystal element 180.

A connection portion 252 is provided in part of a region where the adhesive layer 141 is provided. In the connection portion 252, the conductive layer 311*e* obtained by processing the same conductive film as the electrode 311*a* is electrically connected to part of the electrode 113 with the connector 243. Accordingly, a signal or a potential input from the FPC 372 connected to the substrate 351 side can be supplied to the electrode 113 formed on the substrate 361 side through the connection portion 252.

In the connection portion 252, the conductive layer 311*e* and the conductive layer 311*f* are formed with a material similar to that of the electrode 311*a* and the electrode 311*b* to cover a recess portion provided in the resin layer 62*a* and the insulating layer 63, and the connector 243 is in contact with the surface of the exposed conductive layer 311*e*. The conductive layer 311*e* and the conductive layer 311*f* are formed to cover the recess portion provided in the resin layer 62*a* and the insulating layer 63, whereby the conductive layer 311*e* can be exposed easily.

As the connector 243, for example, a conductive particle can be used. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. A material capable of elastic deformation or plastic deformation is preferably used for the connector 243. As illustrated in FIG. 3, the connector 243, which is the conductive particle, has a shape that is vertically crushed in some cases. Thus, the contact area between the connector 243 and a conductive layer electrically connected to this can be increased, so that contact resistance can be reduced and the generation of problems such as disconnection can be suppressed.

The connector 243 is preferably provided so as to be covered with the adhesive layer 141. For example, the connectors 243 are dispersed in the adhesive layer 141 which is not yet cured.

The light-emitting element 170 is a bottom-emission light-emitting element. The light-emitting element 170 has a stacked-layer structure in which the electrode 191, the EL layer 192, and the electrode 193 are stacked in this order from the insulating layer 220 side. The electrode 191 is connected to a conductive layer 222*b* included in the transistor 205 through an opening provided in the insulating layer 214. The transistor 205 has a function of controlling the driving of the light-emitting element 170. The insulating layer 216 covers an end portion of the electrode 191. The electrode 193 includes a material that reflects visible light, and the electrode 191 includes a material that transmits visible light. The insulating layer 194 is provided to cover the electrode 193. Light from the light-emitting element 170 is emitted to the substrate 361 side through the coloring layer 134, the insulating layer 220, the opening 451, the electrode 311*a*, and the like.

The liquid crystal element 180 and the light-emitting element 170 can exhibit various colors when the color of the coloring layer varies among pixels. The display device 300 can perform color display using the liquid crystal element 180. The display device 300 can perform color display using the light-emitting element 170.

The transistor 201, the transistor 203, the transistor 205, and the transistor 206 are formed on a plane of the insulating layer 220 on the substrate 351 side. These transistors can be fabricated through the same process.

The transistor 203 is a transistor that controls whether the pixel is selected or not (also referred to as a switching transistor or a selection transistor). The transistor 205 is a transistor that controls current flowing to the light-emitting element 170 (also referred to as a driving transistor).

Insulating layers such as an insulating layer 211, an insulating layer 212, an insulating layer 213, and the insulating layer 214 are provided on the substrate 351 side of the insulating layer 220. Part of the insulating layer 211 functions as a gate insulating layer of each transistor. The insulating layer 212 is provided to cover the transistor 206 and the like. The insulating layer 213 is provided to cover the transistor 205 and the like. The insulating layer 214 functions as a planarization layer. Note that the number of insulating layers covering the transistor is not limited and may be one or two or more.

A material through which impurities such as water or hydrogen do not easily diffuse is preferably used for at least one of the insulating layers that cover the transistors. Thus, such an insulating layer can function as a barrier film. Such a structure can effectively suppress diffusion of the impurities into the transistors from the outside, and a highly reliable display device can be provided.

Each of the transistor 201, the transistor 203, the transistor 205, and the transistor 206 includes part of a conductive layer 221*a* functioning as a gate, part of the insulating layer 211 functioning as the gate insulating layer, the conductive layer 222*a* and the conductive layer 222*b* functioning as a source and a drain, and a semiconductor layer 231. Here, a plurality of layers obtained by processing the same conductive film are shown with the same hatching pattern.

The transistor 201 and the transistor 205 each include a conductive layer 223 functioning as a gate, in addition to the components of the transistor 203 and the transistor 206.

The structure in which the semiconductor layer where a channel is formed is provided between two gates is used for the transistor 201 and the transistor 205. Such a structure enables the control of the threshold voltages of transistors. The two gates may be connected to each other and supplied with the same signal to operate the transistors. Such transistors can have higher field-effect mobility and thus have higher on-state current than other transistors. Consequently, a circuit capable of high-speed operation can be manufactured. Furthermore, the area occupied by a circuit portion can be reduced. The use of the transistor having high on-state current can reduce signal delay in wirings and can suppress display unevenness even when the number of wirings is increased when a display device is increased in size or definition.

Alternatively, by supplying a potential for controlling the threshold voltage to one of the two gates and a potential for driving to the other, the threshold voltage of the transistors can be controlled.

There is no limitation on the structure of the transistors included in the display device. The transistor included in the circuit 364 and the transistors included in the display portion 362 may have the same structure or different structures. A plurality of transistors included in the circuit 364 may have the same structure or a combination of two or more kinds of structures. Similarly, a plurality of transistors included in the display portion 362 may have the same structure or a combination of two or more kinds of structures.

It is preferable to use a conductive material containing an oxide for the conductive layer 223. By the formation of a conductive film that forms the conductive layer 223 under an atmosphere containing oxygen, oxygen can be supplied to the insulating layer 212. The proportion of an oxygen gas in a deposition gas is preferably higher than or equal to 90% and lower than or equal to 100%. Oxygen supplied to the insulating layer 212 is then supplied to the semiconductor layer 231 by subsequent heat treatment; as a result, reduction of oxygen vacancies in the semiconductor layer 231 can be achieved.

It is particularly preferable to use a low-resistance oxide semiconductor for the conductive layer 223. In that case, an insulating film that releases hydrogen, such as a silicon nitride film, is preferably used for the insulating layer 213. Hydrogen can be supplied to the conductive layer 223 during the formation of the insulating layer 213 or by the subsequent heat treatment, whereby the electric resistance of the conductive layer 223 can be effectively reduced.

The coloring layer 134 is provided in contact with the insulating layer 213. The coloring layer 134 is covered with the insulating layer 214.

A connection portion 204 is provided in a region of the substrate 351 that does not overlap with the substrate 361. In the connection portion 204, the wiring 365 is electrically connected to the FPC 372 via a connection layer 242. In the connection portion 204, the conductive layer 311$c$ and the conductive layer 311$d$ are formed with a material similar to those of the electrode 311$a$ and the electrode 311$b$ to cover a recess portion provided in the resin layer 62$a$ and the insulating layer 63, and the conductive layer 311$c$ is exposed on the top surface of the connection portion 204. Thus, the connection portion 204 and the FPC 372 can be electrically connected to each other via the connection layer 242. The conductive layer 311$c$ and the conductive layer 311$d$ are formed to cover the recess portion provided in the resin layer 62$a$ and the insulating layer 63, whereby the conductive layer 311$c$ can be exposed easily on the top surface of the connection portion 204.

As the polarizing plate 135 provided on the outer surface of the substrate 361, a linear polarizing plate or a circularly polarizing plate can be used. An example of a circularly polarizing plate is a stack including a linear polarizing plate and a quarter-wave retardation plate. Thus, reflection of external light can be suppressed. The cell gap, alignment, drive voltage, and the like of the liquid crystal element used as the liquid crystal element 180 is controlled depending on the kind of the polarizing plate so that desirable contrast is obtained.

Note that a variety of optical members can be arranged on the outer surface of the substrate 361. Examples of the optical members include a polarizing plate, a retardation plate, a light diffusion plate, a light diffusion layer (e.g., a diffusion film), an anti-reflective layer, and a light-condensing film. Furthermore, an antistatic film suppressing the attachment of dust, a water repellent film suppressing the attachment of stain, a hard coat film suppressing generation of a scratch caused by the use, or the like may be arranged on the outer surface of the substrate 361.

For each of the substrates 351 and 361, glass, quartz, ceramic, sapphire, an organic resin, or the like can be used. When the substrate 351 and the substrate 361 are formed using a flexible material, the flexibility of the display device can be increased.

A liquid crystal element using, for example, a vertical alignment (VA: Vertical Alignment) mode can be used as the liquid crystal element 180. As the vertical alignment mode, a MVA (Multi-Domain Vertical Alignment) mode, a PVA (Patterned Vertical Alignment) mode, an ASV (Advanced Super View) mode, or the like can be used.

A liquid crystal element using a variety of modes can be used as the liquid crystal element 180. For example, a liquid crystal element using, in addition to a VA mode, a TN (Twisted Nematic) mode, an IPS (In-Plane Switching) mode, a FFS (Fringe Field Switching) mode, an ASM (Axially Symmetric aligned Micro-cell) mode, an OCB (Optically Compensated Birefringence) mode, a FLC (Ferroelectric Liquid Crystal) mode, an AFLC (AntiFerroelectric Liquid Crystal) mode, or the like can be used.

The liquid crystal element is an element that controls transmission or non-transmission of light by an optical modulation effect of the liquid crystal. The optical modulation effect of the liquid crystal is controlled by an electric field applied to the liquid crystal (including a horizontal electric field, a vertical electric field, or an oblique electric field). As the liquid crystal used for the liquid crystal element, a thermotropic liquid crystal, a low-molecular liquid crystal, a high-molecular liquid crystal, a polymer dispersed liquid crystal (PDLC: Polymer Dispersed Liquid Crystal), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, a positive liquid crystal or a negative liquid crystal may be used, and an appropriate liquid crystal material is used depending on the mode or design to be used.

To control the alignment of the liquid crystal, the alignment films can be provided. Note that in the case where a horizontal electric field mode is employed, a liquid crystal exhibiting a blue phase for which no alignment film is used may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which a chiral material is mixed to account for several weight percent or more is used for the liquid crystal in order to improve the temperature range. The liquid crystal composition that includes a liquid crystal exhibiting a blue phase and a chiral material has a short response time and is optically isotropic. In addition, the liquid crystal composition that includes a liquid crystal exhibiting a blue phase and a chiral material does not need alignment treatment and has small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where the reflective liquid crystal element is used, the polarizing plate 135 is provided on the display surface side. Besides, a light diffusion plate is preferably provided on the display surface side to improve visibility.

A front light may be provided on the outer side of the polarizing plate 135. As the front light, an edge-light front light is preferably used. A front light including an LED (Light Emitting Diode) is preferably used because power consumption can be reduced.

As the adhesive layer, any of a variety of curable adhesives such as a reactive curable adhesive, a thermosetting adhesive, an anaerobic adhesive, and a photocurable adhesive such as an ultraviolet curable adhesive can be used. As these adhesives, an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, and the like can be given. In particular, a material with low moisture permeability, such as an epoxy resin, is preferable. Alternatively, a two-component-mixture-type resin may be used. Further alternatively, an adhesive sheet or the like may be used.

As the connection layer 242, an anisotropic conductive film (ACF: Anisotropic Conductive Film), an anisotropic conductive paste (ACP: Anisotropic Conductive Paste), or the like can be used.

The light-emitting element 170 may be a top emission, bottom emission, or dual emission light-emitting element, or the like. A conductive film that transmits visible light is used as the electrode through which light is extracted. A conductive film that reflects visible light is preferably used as the electrode through which light is not extracted.

The EL layer 192 includes at least a light-emitting layer. In addition to the light-emitting layer, the EL layer 192 may further include a layer containing a substance with a high hole-injection property, a layer containing a substance with a high hole-transport property, a layer containing a hole-blocking material, a layer containing a substance with a high electron-transport property, a layer containing a substance with a high electron-injection property, a layer containing a substance with a bipolar property (a substance with a high electron- and hole-transport property), or the like.

Either a low molecular compound or a high molecular compound can be used for the EL layer 192, and an inorganic compound may also be included. The layers that form the EL layer 192 can be formed by any of the following methods: an evaporation method (including a vacuum evaporation method), a transfer method, a printing method, an inkjet method, a coating method, and the like.

The EL layer 192 may contain an inorganic compound such as quantum dots. When quantum dots are used for the light-emitting layer, quantum dots can function as light-emitting materials, for example. Note that as the quantum dot material, a colloidal quantum dot material, an alloyed quantum dot material, a core-shell quantum dot material, a core quantum dot material, or the like can be used. A material containing elements belonging to Groups 12 and 16, elements belonging to Groups 13 and 15, or elements belonging to Groups 14 and 16 may be used. Alternatively, a quantum dot material containing an element such as cadmium, selenium, zinc, sulfur, phosphorus, indium, tellurium, lead, gallium, arsenic, or aluminum may be used.

With the use of the combination of a color filter (coloring layer) and a microcavity structure (optical adjustment layer), light with high color purity can be extracted from the display device. The thickness of the optical adjustment layer varies depending on the color of the pixel.

As materials for a conductive layer such as a wiring or an electrode that forms a display device in addition to a gate, a source, and a drain of a transistor, metals such as aluminum, titanium, chromium, nickel, copper, yttrium, zirconium, molybdenum, silver, tantalum, and tungsten, or an alloy containing any of these metals as its main component can be given. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stacked film of the above materials can be used for the conductive layers. For example, a stacked film of indium tin oxide and an alloy of silver and magnesium, or the like is preferably used because the conductivity can be increased. They can also be used for conductive layers such as a variety of wirings and electrodes that form a display device, and conductive layers (conductive layers functioning as a pixel electrode or a common electrode) included in a display element.

As an insulating material that can be used for each insulating layer, for example, a resin such as acrylic or epoxy resin, and an inorganic insulating material such as silicon oxide, silicon oxynitride, silicon nitride oxide, silicon nitride, or aluminum oxide can be given.

As a material that can be used for the coloring layers, a metal material, a resin material, a resin material containing a pigment or dye, and the like can be given.

Structure Example 2

Figure 4:
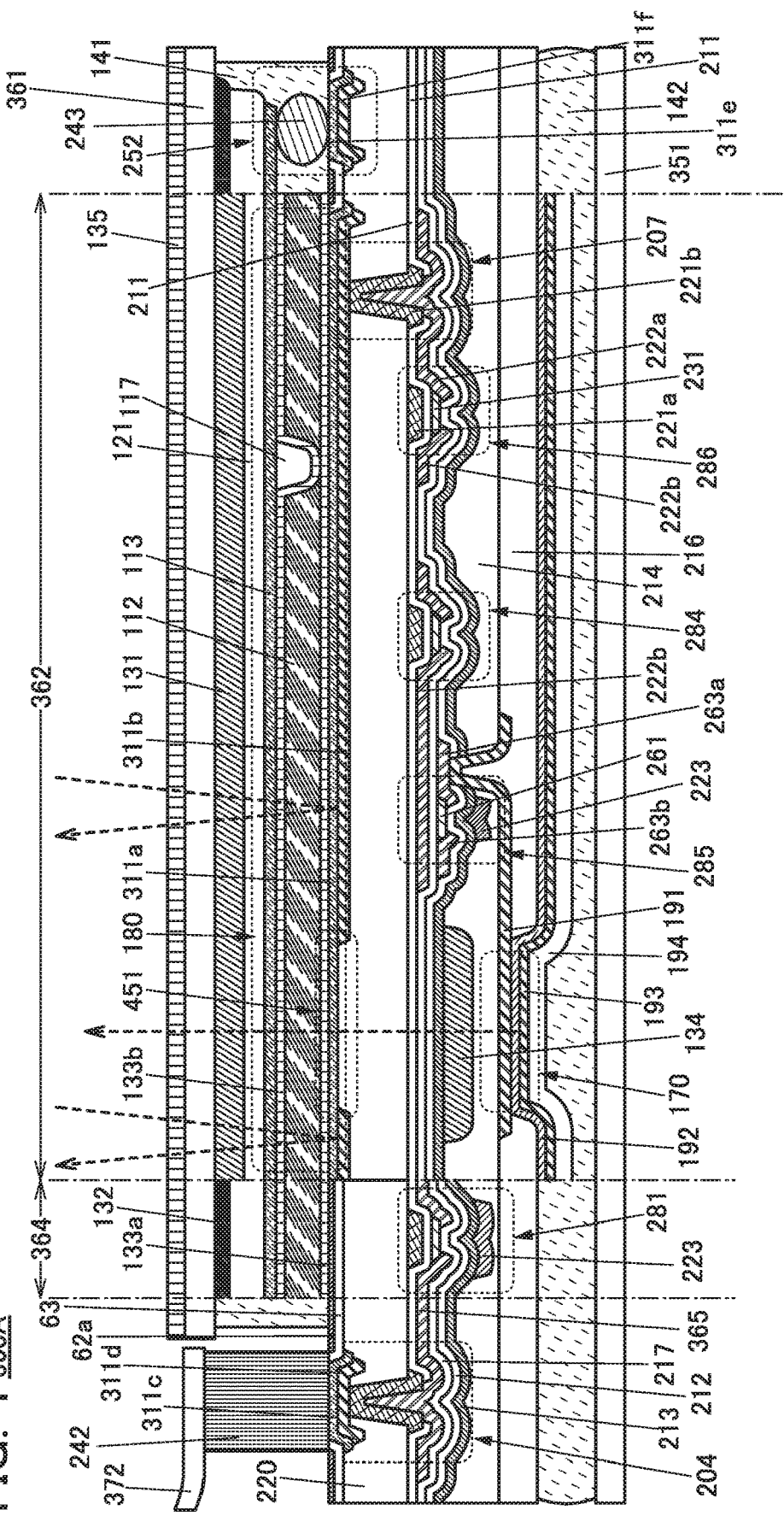
FIG. 4 A cross-sectional view illustrating an example of a display device.

A display device 300A illustrated in FIG. 4 is mainly different from the display device 300 in that the transistor 201, the transistor 203, the transistor 205, and the transistor 206 are not included but a transistor 281, a transistor 284, a transistor 285, and a transistor 286 are included.

Two transistors included in the display device may be partly stacked like the transistor 284 and the transistor 285. Accordingly, the area occupied by a pixel circuit can be reduced, leading to an increase in resolution. Furthermore, the light-emitting area of the light-emitting element 170 can be increased, leading to an improvement in aperture ratio. The light-emitting element 170 with a high aperture ratio requires low current density to obtain luminance needed; thus, the reliability is improved.

Each of the transistors 281, 284, and 286 includes the conductive layer 221a, the insulating layer 211, the semiconductor layer 231, the conductive layer 222a, and the conductive layer 222b. The conductive layer 221a overlaps with the semiconductor layer 231 with the insulating layer 211 positioned therebetween. The conductive layer 222a and the conductive layer 222b are electrically connected to the semiconductor layer 231. The transistor 281 includes the conductive layer 223.

The transistor 285 includes the conductive layer 222b, an insulating layer 217, a semiconductor layer 261, the conductive layer 223, the insulating layer 212, the insulating layer 213, a conductive layer 263a, and a conductive layer 263b. The conductive layer 222b overlaps with the semiconductor layer 261 with the insulating layer 217 positioned therebetween. The conductive layer 223 overlaps with the semiconductor layer 261 with the insulating layer 212 and the insulating layer 213 positioned therebetween. The conductive layer 263a and the conductive layer 263b are electrically connected to the semiconductor layer 261.

The conductive layer 221a functions as a gate. The insulating layer 211 functions as a gate insulating layer. The conductive layer 222a functions as one of a source and a drain. The conductive layer 222b included in the transistor 286 functions as the other of the source and the drain.

The conductive layer 222b shared by the transistor 284 and the transistor 285 has a portion functioning as the other of a source and a drain of the transistor 284 and a portion functioning as a gate of the transistor 285. The insulating layer 217, the insulating layer 212, and the insulating layer 213 function as gate insulating layers. One of the conductive layer 263a and the conductive layer 263b functions as a source and the other functions as a drain. The conductive layer 223 functions as a gate.

Structure Example 3

Figure 5A:
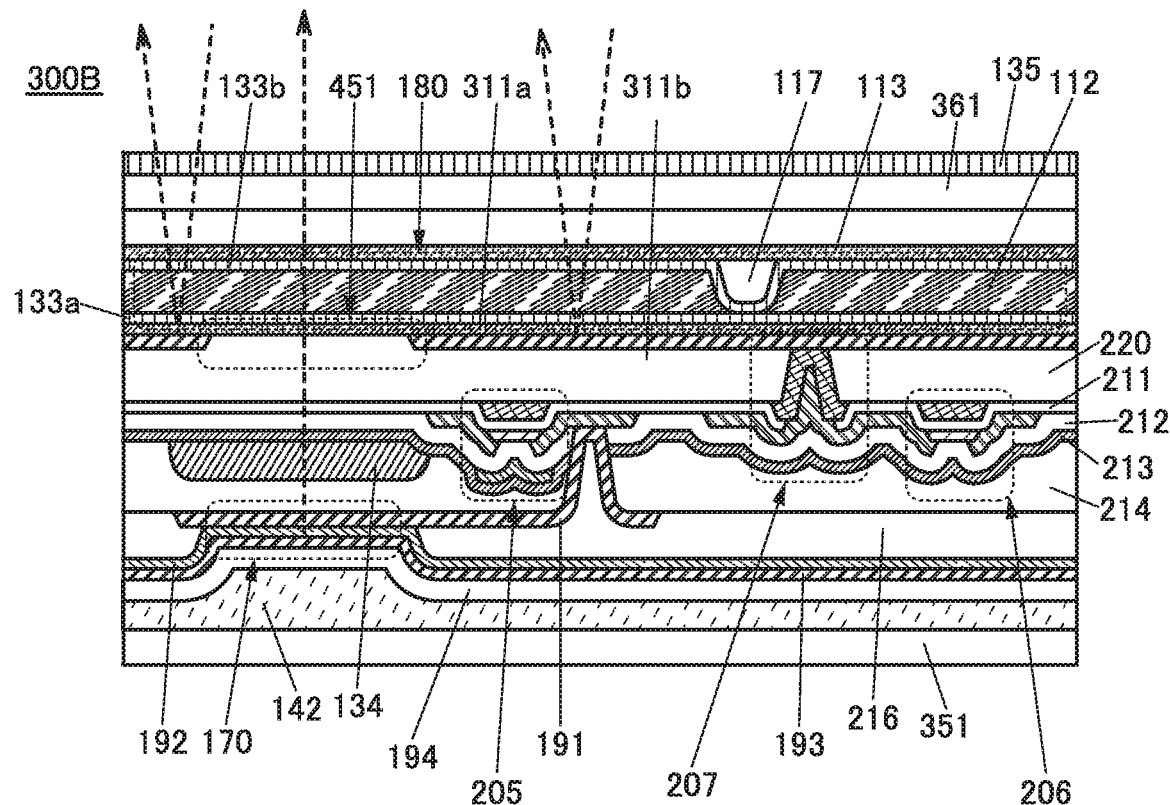
FIG. 5 Cross-sectional views illustrating an example of a display device.

FIG. 5(A) is a cross-sectional view illustrating a display portion of a display device 300B.

The display device 300B is different from the display device 300 in that the coloring layer 131 is not provided. Other components are similar to those of the display device 300 and thus are not described in detail.

The liquid crystal element 180 emits white light. Since the coloring layer 131 is not provided, the display device 300 can display a black-and-white image or a grayscale image using the liquid crystal element 180.

Structure Example 4

Figure 5B:
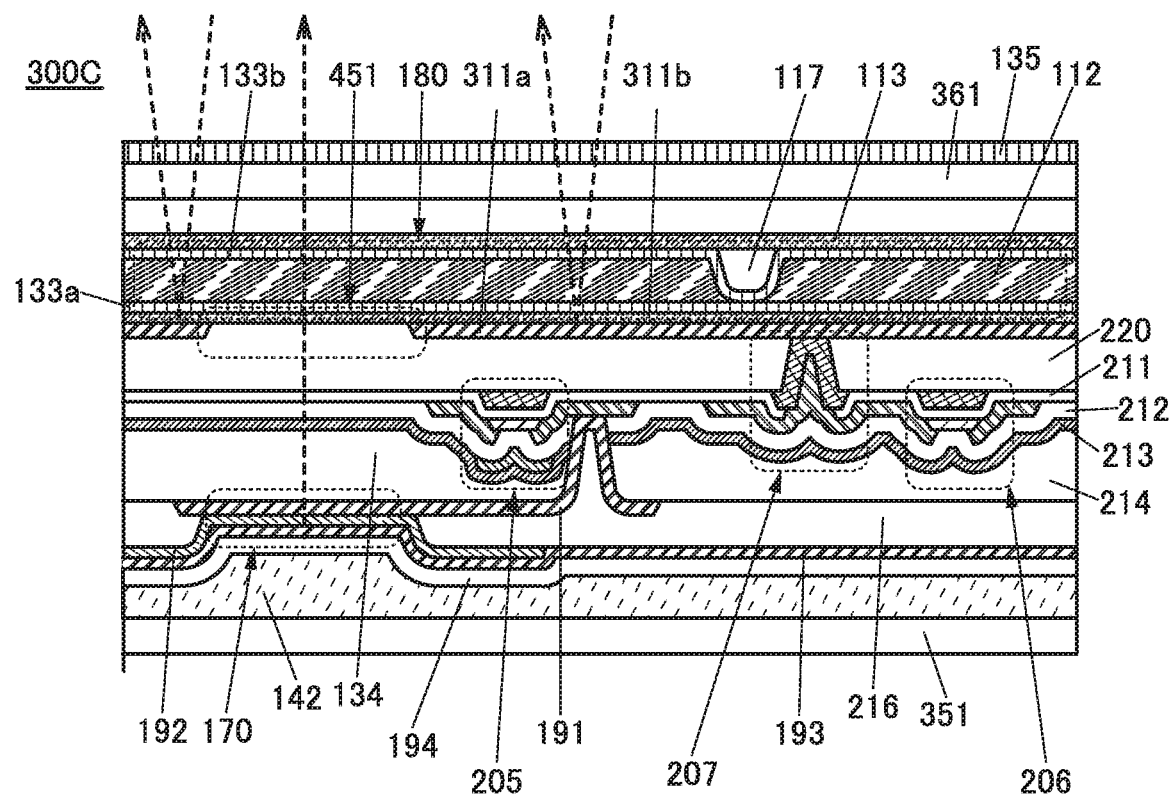

A display device 300C illustrated in FIG. 5(B) is different from the display device 300B in that the EL layer 192 is separately provided for each color and the coloring layer 134 is not provided. Other components are similar to those of the display device 300B and thus are not described in detail.

In the light-emitting element 170 employing a separate coloring method, at least one layer (typified by the light-emitting layer) included in the EL layer 192 is separately provided for each color. All layers included in the EL layer may be separately provided for each color.

There is no particular limitation on the structure of the transistor included in the display device of one embodiment of the present invention. For example, a planar transistor may be used, a staggered transistor may be used, or an inverted staggered transistor may be used. In addition, a top-gate transistor or a bottom-gate transistor may be used. Alternatively, gate electrodes may be provided above and below a channel.

FIGS. 6(A) to (E) illustrate structure examples of transistors.

Figure 6A:
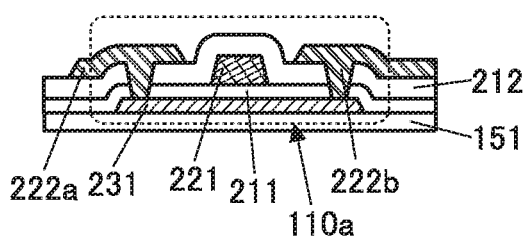
FIG. 6 Cross-sectional views illustrating examples of transistors.

A transistor 110a illustrated in FIG. 6(A) is a top-gate transistor.

The transistor 110a includes a conductive layer 221, the insulating layer 211, the semiconductor layer 231, the insulating layer 212, the conductive layer 222a, and the conductive layer 222b. The semiconductor layer 231 is provided over an insulating layer 151. The conductive layer 221 overlaps with the semiconductor layer 231 with the insulating layer 211 positioned therebetween. The conductive layer 222a and the conductive layer 222b are electrically connected to the semiconductor layer 231 through openings provided in the insulating layer 211 and the insulating layer 212.

The conductive layer 221 functions as a gate. The insulating layer 211 functions as a gate insulating layer. One of the conductive layer 222a and the conductive layer 222b functions as a source and the other functions as a drain.

In the transistor 110a, the conductive layer 221 can be physically distanced from the conductive layer 222a or the conductive layer 222b easily; thus, the parasitic capacitance between them can be reduced.

Figure 6B:
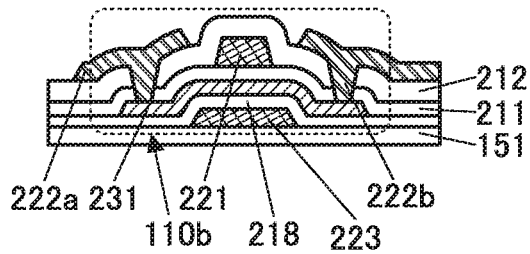

A transistor 110b illustrated in FIG. 6(B) includes, in addition to the components of the transistor 110a, the conductive layer 223 and an insulating layer 218. The conductive layer 223 is provided over the insulating layer 151 and overlaps with the semiconductor layer 231. The insulating layer 218 covers the conductive layer 223 and the insulating layer 151.

The conductive layer 223 functions as one of a pair of gates. Thus, the on-state current of the transistor can be increased and the threshold voltage can be controlled.

Figure 6C:
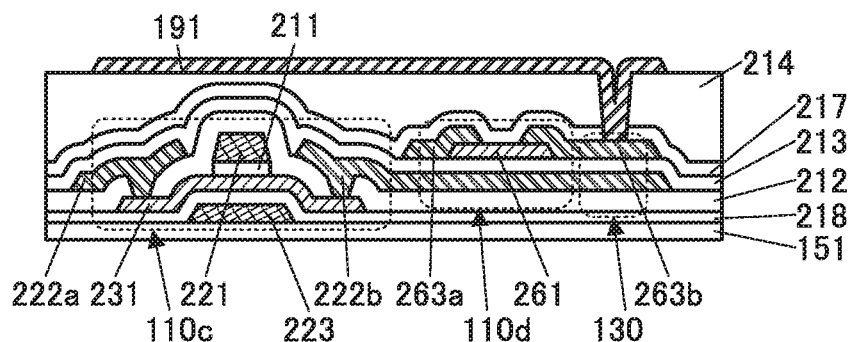
Figure 6D:
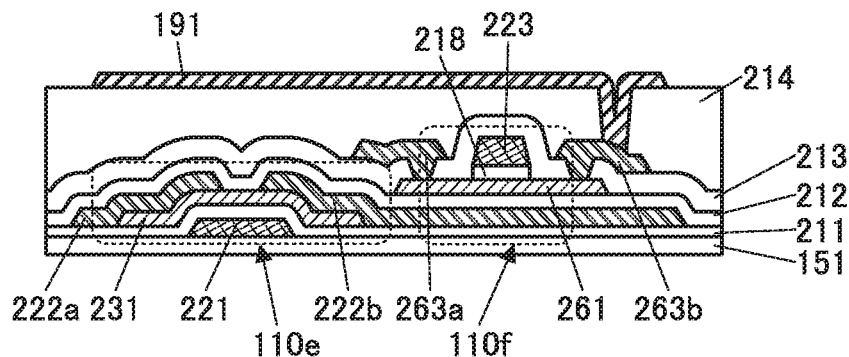
Figure 6E:
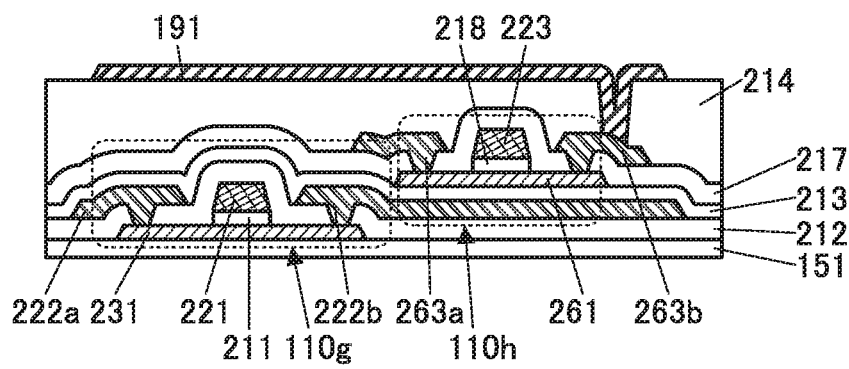

FIGS. 6(C) to (E) each illustrate an example of a stacked-layer structure of two transistors. The structures of the two stacked transistors can be independently determined, and the combination of the structures is not limited to those illustrated in FIGS. 6(C) to (E).

FIG. 6(C) illustrates a stacked-layer structure of a transistor 110c and a transistor 110d. The transistor 110c includes two gates. The transistor 110d has a bottom-gate structure. Note that the transistor 110c may include one gate (top-gate structure). The transistor 110d may include two gates.

The transistor 110c includes the conductive layer 223, the insulating layer 218, the semiconductor layer 231, the conductive layer 221, the insulating layer 211, the conductive layer 222a, and the conductive layer 222b. The conductive layer 223 is provided over the insulating layer 151. The conductive layer 223 overlaps with the semiconductor layer 231 with the insulating layer 218 positioned therebetween. The insulating layer 218 covers the conductive layer 223 and the insulating layer 151. The conductive layer 221 overlaps with the semiconductor layer 231 with the insulating layer 211 positioned therebetween. Although FIG. 6(C) illustrates an example where the insulating layer 211 is provided only in a region overlapping with the conductive layer 221, the insulating layer 211 may be provided so as to cover an end portion of the semiconductor layer 231, as illustrated in FIG. 6(B) and the like. The conductive layer 222a and the conductive layer 222b are electrically connected to the semiconductor layer 231 through openings provided in the insulating layer 212.

The transistor 110d includes the conductive layer 222b, the insulating layer 213, the semiconductor layer 261, the conductive layer 263a, and the conductive layer 263b. The conductive layer 222b includes a region overlapping with the semiconductor layer 261 with the insulating layer 213 positioned therebetween. The insulating layer 213 covers the conductive layer 222b. The conductive layer 263a and the conductive layer 263b are electrically connected to the semiconductor layer 261.

The conductive layer 221 and the conductive layer 223 each function as a gate of the transistor 110c. The insulating layer 218 and the insulating layer 211 each function as a gate insulating layer of the transistor 110c. The conductive layer 222a functions as one of a source and a drain of the transistor 110c.

The conductive layer 222b has a portion functioning as the other of the source and the drain of the transistor 110c and a portion functioning as a gate of the transistor 110d. The insulating layer 213 functions as a gate insulating layer of the transistor 110d. One of the conductive layer 263a and the conductive layer 263b functions as a source of the transistor 110d and the other functions as a drain of the transistor 110d.

The transistor 110c and the transistor 110d are preferably applied to a pixel circuit of the light-emitting element 170. For example, the transistor 110c can be used as a selection transistor and the transistor 110d can be used as a driving transistor.

The conductive layer 263b is electrically connected to the electrode 191 functioning as a pixel electrode of the light-emitting element through an opening provided in the insulating layer 217 and the insulating layer 214.

FIG. 6(D) illustrates a stacked-layer structure of a transistor 110e and a transistor 110f. The transistor 110e has a bottom-gate structure. The transistor 110f includes two gates. The transistor 110e may include two gates.

The transistor 110e includes the conductive layer 221, the insulating layer 211, the semiconductor layer 231, the conductive layer 222a, and the conductive layer 222b. The conductive layer 221 is provided over the insulating layer 151. The conductive layer 221 overlaps with the semiconductor layer 231 with the insulating layer 211 positioned therebetween. The insulating layer 211 covers the conductive layer 221 and the insulating layer 151. The conductive layer 222a and the conductive layer 222b are electrically connected to the semiconductor layer 231.

The transistor 110f includes the conductive layer 222b, the insulating layer 212, the semiconductor layer 261, the conductive layer 223, the insulating layer 218, the insulating layer 213, the conductive layer 263a, and the conductive layer 263b. The conductive layer 222b includes a region overlapping with the semiconductor layer 261 with the insulating layer 212 positioned therebetween. The insulating layer 212 covers the conductive layer 222b. The conductive layer 263a and the conductive layer 263b are electrically connected to the semiconductor layer 261 through openings provided in the insulating layer 213. The conductive layer 223 overlaps with the semiconductor layer 261 with the insulating layer 218 positioned therebetween. The insulating layer 218 is provided in a region overlapping with the conductive layer 223.

The conductive layer 221 functions as a gate of the transistor 110e. The insulating layer 211 functions as a gate insulating layer of the transistor 110e. The conductive layer 222a functions as one of a source and a drain of the transistor 110e.

The conductive layer 222b has a portion functioning as the other of the source and the drain of the transistor 110e and a portion functioning as a gate of the transistor 110f. The conductive layer 223 functions as a gate of the transistor 110f. The insulating layer 212 and the insulating layer 218 each function as a gate insulating layer of the transistor 110f. One of the conductive layer 263a and the conductive layer 263b functions as a source of the transistor 110f and the other functions as a drain of the transistor 110f.

The conductive layer 263b is electrically connected to the electrode 191 functioning as a pixel electrode of a light-emitting element through an opening provided in the insulating layer 214.

FIG. 6(E) illustrates a stacked-layer structure of a transistor 110g and a transistor 110h. The transistor 110g has a top-gate structure. The transistor 110h includes two gates. Note that the transistor 110g may include two gates.

The transistor 110g includes the semiconductor layer 231, the conductive layer 221, the insulating layer 211, the conductive layer 222a, and the conductive layer 222b. The semiconductor layer 231 is provided over the insulating layer 151. The conductive layer 221 overlaps with the semiconductor layer 231 with the insulating layer 211 positioned therebetween. The insulating layer 211 overlaps with the conductive layer 221. The conductive layer 222a and the conductive layer 222b are electrically connected to the semiconductor layer 231 through openings provided in the insulating layer 212.

The transistor 110h includes the conductive layer 222b, the insulating layer 213, the semiconductor layer 261, the conductive layer 223, the insulating layer 218, the insulating layer 217, the conductive layer 263a, and the conductive layer 263b. The conductive layer 222b includes a region overlapping with the semiconductor layer 261 with the insulating layer 213 positioned therebetween. The insulating layer 213 covers the conductive layer 222b. The conductive layer 263a and the conductive layer 263b are electrically connected to the semiconductor layer 261 through openings provided in the insulating layer 217. The conductive layer 223 overlaps with the semiconductor layer 261 with the insulating layer 218 positioned therebetween. The insulating layer 218 is provided in a region overlapping with the conductive layer 223.

The conductive layer 221 functions as a gate of the transistor 110g. The insulating layer 211 functions as a gate insulating layer of the transistor 110g. The conductive layer 222a functions as one of a source and a drain of the transistor 110g.

The conductive layer 222b has a portion functioning as the other of the source and the drain of the transistor 110g and a portion functioning as a gate of the transistor 110h. The conductive layer 223 functions as a gate of the transistor 110h. The insulating layer 213 and the insulating layer 218 each function as a gate insulating layer of the transistor 110h. One of the conductive layer 263a and the conductive layer 263b functions as a source of the transistor 110h and the other functions as a drain of the transistor 110h.

The conductive layer 263b is electrically connected to the electrode 191 functioning as a pixel electrode of a light-emitting element through an opening provided in the insulating layer 214.

The method for manufacturing the display device of this embodiment will be specifically described below with reference to FIG. 7 to FIG. 23.

Note that thin films included in the display device (insulating films, semiconductor films, conductive films, or the like) can be formed by any of a sputtering method, a chemical vapor deposition (CVD: Chemical Vapor Deposition) method, a vacuum evaporation method, a pulsed laser deposition (PLD: Pulse Laser Deposition) method, an atomic layer deposition (ALD: Atomic Layer Deposition) method, and the like. As the CVD method, a plasma-enhanced chemical vapor deposition (PECVD) method or a thermal CVD method may be used. As an example of the thermal CVD method, a metal organic chemical vapor deposition (MOCVD: Metal Organic CVD) method may be used.

Alternatively, thin films that form the display device (insulating films, semiconductor films, conductive films, or the like) can be formed by a method such as spin coating, dipping, spray coating, ink jetting, dispensing, screen printing, offset printing, a doctor knife, a slit coater, a roll coater, a curtain coater, and a knife coater.

When thin films that form the display device are processed, a lithography method or the like can be used for the processing. Alternatively, island-shaped thin films may be formed by a film formation method using a blocking mask. Alternatively, a nanoimprinting method, a sandblasting method, a lift-off method, or the like may be used for the processing of thin films. As a photolithography method, there are a method in which a resist mask is formed over a thin film to be processed, the thin film is processed by etching or the like, and the resist mask is removed, and a method in which a photosensitive thin film is formed, and exposed to light and developed to be processed into a desired shape.

In the case of using light in the lithography method, any of an i-line (a wavelength of 365 nm), a g-line (a wavelength of 436 nm), and an h-line (a wavelength of 405 nm), or combined light of any of them can be used for exposure. Besides, ultraviolet light, KrF laser light, ArF laser light, or the like can be used. Exposure may be performed by liquid immersion exposure technique. As the light used for the exposure, extreme ultra-violet light (EUV: Extreme Ultraviolet) or X-rays may be used. Instead of the light used for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is not needed.

For etching of thin films, a dry etching method, a wet etching method, a sandblast method, or the like can be used.
<Example of Method for Manufacturing Display Device>

An example of a method for manufacturing the display device 300 illustrated in FIG. 3 will be described below. The manufacturing method will be described with reference to FIG. 7 to FIG. 23, particularly focusing on the display portion 362 and the external connection portion of the display device 300.

First, the coloring layer 131 is formed over the substrate 361 (FIG. 7(A)). The coloring layer 131 is formed using a photosensitive material and thus can be processed into an island shape by a photolithography method or the like. Note that in the circuit 364 and the like illustrated in FIG. 3, the light-blocking layer 132 is provided over the substrate 361.

Next, the insulating layer 121 is formed over the coloring layer 131 and the light-blocking layer 132.

The insulating layer 121 preferably functions as a planarization layer. For the insulating layer 121, an acrylic resin, an epoxy resin, a polyamide resin, a polyimide-amide resin, a siloxane resin, a benzocyclobutene-based resin, a phenol resin, and the like can be given.

An inorganic insulating film may be used for the insulating layer 121. When an inorganic insulating film is used for the insulating layer 121, a silicon nitride film, a silicon oxynitride film, a silicon oxide film, a silicon nitride oxide film, an aluminum oxide film, or an aluminum nitride film can be used, for example. Moreover, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack of two or more of the above insulating films may also be used.

Next, the electrode 113 is formed. The electrode 113 can be formed in the following manner: after a conductive film is formed, a resist mask is formed, the conductive film is etched, and then the resist mask is removed. The electrode 113 is formed using a conductive material that transmits visible light.

Next, the insulating layer 117 is formed over the electrode 113. An organic insulating film is preferably used for the insulating layer 117.

Subsequently, the alignment film 133*b* is formed over the electrode 113 and the insulating layer 117 (FIG. 7(A)). The alignment film 133*b* can be formed by forming a thin film of a resin or the like and then performing rubbing treatment.

In addition, steps illustrated from FIG. 7(B) to FIG. 11 are performed independently of the steps described using FIG. 7(A).

First, a first resin layer 62*p* is formed over a formation substrate 61. The first resin layer 62*p* can be formed using a variety of resin materials (including resin precursors). The variety of resin materials preferably have a thermosetting property, and may have or may not have photosensitivity.

When the resin material has photosensitivity, a recess portion can be formed by a lithography method using light.

The first resin layer 62*p* is preferably formed using a material containing a polyimide resin or a polyimide resin precursor. Examples of the resin material include a material containing a polyimide resin and a solvent, and a material containing a polyamic acid and a solvent. Polyimide is a material suitably used for a planarization film or the like of a display device, and thus, the film formation apparatus and the material can be shared. Consequently, an additional apparatus and material are not necessary to achieve the structure of one embodiment of the present invention, which is advantageous in terms of cost.

Other examples of the material that can be used to form the first resin layer 62*p* include an acrylic resin, an epoxy resin, a polyamide resin, a polyimide-amide resin, a siloxane resin, a benzocyclobutene-based resin, a phenol resin, and precursors of these resins.

Examples of the method for forming the first resin layer 62*p* include spin coating, dipping, spray coating, ink-jetting, dispensing, screen printing, offset printing, a doctor knife, a slit coater, a roll coater, a curtain coater, and a knife coater.

Note that the first resin layer 62*p* is preferably formed with a spin coater. With the use of a spin coating method, a thin film can be uniformly formed over a large-sized substrate.

Note that in one embodiment of the present invention, part of the first resin layer 62*p* in the thickness direction in a portion corresponding to the connection portion and the pixel portion is removed, whereby a first region and a second region that is thinner than the first region (also referred to as a recess portion) are formed in the first resin layer 62*p*. Note that a resin layer 62 in the pixel portion does not necessarily have a recess portion.

The thickness of the first region of the resin layer 62 is greater than or equal to 0.1 µm and less than 20 µm, preferably greater than or equal to 0.1 µm and less than or equal to 10 µm, further preferably greater than or equal to 0.1 µm and less than or equal to 3 µm, still further preferably greater than or equal to 0.5 µm and less than or equal to 2 µm.

The thermal expansion coefficient of the resin layer 62 is preferably greater than or equal to 0.1 ppm/° C. and less than or equal to 50 ppm/° C., further preferably greater than or equal to 0.1 ppm/° C. and less than or equal to 20 ppm/° C., still further preferably greater than or equal to 0.1 ppm/° C. and less than or equal to 10 ppm/° C. A lower thermal expansion coefficient of the resin layer 62 can further prevent occurrence of a crack in a layer included in a transistor or the like and breakage of the transistor or the like that are due to heating.

In the case where the resin layer 62 remains on an optical path through which light from the display device travels, the resin layer 62 preferably has a high visible-light transmitting property.

When a photosensitive material is used as the material of the resin layer 62, the second region can be formed by a lithography method using light. Specifically, heat treatment for removing the solvent contained in the first resin layer 62p (also referred to as pre-baking treatment) is performed on the first resin layer 62p, and after that, light exposure is performed with the use of a photomask. Then, development treatment is performed, whereby an unnecessary portion can be removed. In the light exposure, the amount of light exposure is reduced as compared with that in conditions for forming an opening in the resin layer 62, whereby the resin layer 62 having a recess portion can be formed. For example, there are methods such as shortening the light exposure time, reducing the light intensity, and changing the focus of light, as compared with those in the light exposure conditions for forming an opening in the resin layer 62. A multi-tone mask may be used.

Alternatively, after the first resin layer 62p is formed, a recess portion may be formed by performing embossing, in which a mold with a desired shape is pressed against the deposited film, before first heat treatment described later. In this case, the recess portion can be formed even when the first resin layer 62p is formed using a non-photosensitive material. In the case where the pre-baking treatment is performed, embossing is performed before the pre-baking treatment, or after the pre-baking treatment and before the first heat treatment.

When a side surface of the second region (recess portion) is made tapered, the coverage with a film formed over the recess portion of the resin layer 62 is improved; thus, it is preferred that a positive resin be used in the case of using a photosensitive resin, and that a mold having a tapered shape be used in the case of performing embossing.

When the second region that is thinner than the first region is provided in the resin layer 62 in the above manner and then a conductive layer is positioned so as to cover the second region, the conductive layer can be easily exposed in a later step. Moreover, even when the resin layer is removed until the conductive layer is exposed, part of the resin layer remains, and thus, the remaining resin layer can be used as a protective layer.

After the recess portion (second region) is formed in the first resin layer 62p, the first heat treatment is performed. The first heat treatment is preferably performed in an oxygen-containing atmosphere.

The larger the amount of oxygen contained in the first resin layer 62p is, the smaller the force required for separation of the resin layer 62 can be. As the proportion of oxygen in the atmosphere for the first heat treatment is higher, a larger amount of oxygen can be contained in the resin layer 62 and the peelability of the resin layer 62 can be increased.

The first heat treatment can be performed with the atmosphere in a chamber of a heating apparatus set to an oxygen-containing atmosphere, for example. Alternatively, the first heat treatment can be performed using a hot plate or the like in an air atmosphere.

For example, the oxygen partial pressure of the atmosphere at the time of the first heat treatment is preferably higher than or equal to 5% and lower than 100%, further preferably higher than or equal to 10% and lower than 100%, still further preferably higher than or equal to 15% and lower than 100%.

The first heat treatment is preferably performed while a gas containing oxygen is supplied into the chamber of the heating apparatus. The first heat treatment is preferably performed while only an oxygen gas or a mixed gas containing an oxygen gas is supplied, for example. Specifically, a mixed gas containing oxygen and nitrogen or a rare gas (e.g., argon) can be used.

Degradation of some heating apparatus may occur when the proportion of oxygen in the atmosphere becomes high. Thus, when a mixed gas containing an oxygen gas is used, the proportion of the oxygen gas flow rate in the total flow rate of the mixed gas is preferably higher than or equal to 5% and lower than or equal to 50%, further preferably higher than or equal to 10% and lower than or equal to 50%, still further preferably higher than or equal to 15% and lower than or equal to 50%.

The temperature of the first heat treatment is preferably higher than or equal to 200° C. and lower than or equal to 500° C., further preferably higher than or equal to 250° C. and lower than or equal to 475° C., still further preferably higher than or equal to 300° C. and lower than or equal to 450° C.

The higher the temperature of the first heat treatment is, the higher the peelability of the resin layer 62 can be.

By the first heat treatment, released gas components (e.g., hydrogen and water) in the resin layer 62 can be reduced. In particular, the heating is preferably performed at a temperature higher than or equal to the formation temperature of each layer formed over the resin layer 62. Thus, a gas released from the resin layer 62 in the manufacturing process of the transistor can be significantly reduced.

For example, in the case where the formation temperature of the transistor is up to 350° C., a film to be the resin layer 62 is preferably heated at a temperature higher than or equal to 350° C. and lower than or equal to 450° C., further preferably lower than or equal to 400° C., still further preferably lower than or equal to 375° C. Thus, a gas released from the resin layer 62 in the manufacturing process of the transistor can be significantly reduced.

The maximum temperature in manufacture of the transistor is preferably made equal to the temperature of the first heat treatment, in which case the maximum temperature in manufacture of the display device can be prevented from being increased by performing the first heat treatment.

In addition, the longer the duration of the first heat treatment is, the higher the peelability of the resin layer 62 can be.

Even when the heating temperature is relatively low, increasing the treatment time sometimes achieves separability equivalent to that under a condition with a higher heating temperature. It is thus preferable to increase the treatment time when the heating temperature cannot be increased owing to the structure of the heating apparatus.

The duration of the first heat treatment is preferably longer than or equal to 5 minutes and shorter than or equal to 24 hours, further preferably longer than or equal to 30 minutes and shorter than or equal to 12 hours, still further preferably longer than or equal to 1 hour and shorter than or equal to 6 hours, for example. Note that the duration of the first heat treatment is not particularly limited to these. It may be shorter than 5 minutes, for example, when the first heat treatment is performed by an RTA (Rapid Thermal Annealing) method.

As the heating apparatus, it is possible to use a variety of apparatuses such as an electric furnace and an apparatus for heating an object by heat conduction or heat radiation from a heating element such as a resistance heating element. For example, an RTA apparatus such as a GRTA (Gas Rapid Thermal Anneal) apparatus or an LRTA (Lamp Rapid Thermal Anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. The use of an RTA apparatus can shorten the treatment time and thus is preferred for mass production. Alternatively, the heat treatment may be performed using an in-line heating apparatus.

Here, for example, in the case where a resin is used for a planarization layer or the like of a display device, in general, heating is commonly performed in conditions with little oxygen and at a temperature as low as possible in the temperature range where the resin is cured, in order to prevent oxidation and deterioration of the resin. However, in one embodiment of the present invention, heating is performed at a relatively high temperature (e.g., a temperature higher than or equal to 200° C.) in the state where a surface of the resin layer $62p$ that is to be the resin layer 62 is exposed to an atmosphere where oxygen is actively contained. This can impart high peelability to the resin layer 62.

Note that the thickness of the resin layer 62 is sometimes changed from the thickness of the first resin layer $62p$ by the heat treatment. For example, in some cases, the volume decreases when the solvent contained in the first resin layer $62p$ is removed or when the density increases with proceeding curing, which makes the resin layer 62 thinner than the first resin layer $62p$. Alternatively, in other cases, the volume increases when oxygen is included at the time of the heat treatment, which makes the resin layer 62 thicker than the first resin layer $62p$.

Before the first heat treatment is performed, heat treatment for removing the solvent contained in the first resin layer $62p$ (also referred to as pre-baking treatment) may be performed on the first resin layer $62p$. The temperature of the pre-baking treatment can be set as appropriate according to the material that is used. For example, it can be higher than or equal to 50° C. and lower than or equal to 180° C., higher than or equal to 80° C. and lower than or equal to 150° C., or higher than or equal to 90° C. and lower than or equal to 120° C. Alternatively, the first heat treatment may double as the pre-baking treatment, and the solvent contained in the first resin layer may be removed by the first heat treatment.

Alternatively, the first region and the second region may be formed in such a manner that a resin material is applied by spin coating to have a thickness to be the thickness of the resin layer in the second region, the first heat treatment is performed, and then a resin layer is selectively formed at a place to be the first region by a printing method or the like.

Note that the formation substrate 61 has stiffness high enough for easy transfer and has resistance to heat applied in the manufacturing process. Examples of a material that can be used for the formation substrate 61 include glass, quartz, ceramics, sapphire, a resin, a semiconductor, a metal, and an alloy. Examples of the glass include alkali-free glass, barium borosilicate glass, and aluminoborosilicate glass.

The resin layer 62 has flexibility; the use of the formation substrate 61 having lower flexibility than the resin layer 62 facilitates transfer of the resin layer 62.

Next, the insulating layer 63 is formed at a temperature lower than or equal to the upper temperature limit of the resin layer 62 (FIG. 7(C)). In addition, the insulating layer 63 is preferably formed at a temperature lower than the heating temperature in the above-described heating step for the resin layer 62.

The insulating layer 63 can be used as a barrier layer that prevents diffusion of impurities contained in the resin layer 62 into a transistor and a display element formed later. For example, the insulating layer 63 preferably prevents moisture and the like contained in the resin layer 62 from diffusing into the transistor and the display element when the resin layer 62 is heated. Thus, the insulating layer 63 preferably has a high barrier property.

As the insulating layer 63, an inorganic insulating film such as a silicon nitride film, a silicon oxynitride film, a silicon oxide film, a silicon nitride oxide film, an aluminum oxide film, or an aluminum nitride film can be used, for example. Moreover, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack of two or more of the above insulating films may also be used. It is particularly preferred that, as the insulating layer 63, a silicon nitride film be formed and a silicon oxide film be formed over the silicon nitride film. An inorganic insulating film is preferably formed at high temperatures because the film can have higher density and a higher barrier property as the deposition temperature is higher.

In the case of using an inorganic insulating film for the insulating layer 63, the temperature at the time of the formation is preferably higher than or equal to room temperature (25° C.) and lower than or equal to 350° C., further preferably higher than or equal to 100° C. and lower than or equal to 300° C.

In the case where the surface of the resin layer 62 has unevenness, the insulating layer 63 preferably covers the unevenness. The insulating layer 63 may function as a planarization layer that fills the unevenness. For example, as the insulating layer 63, a stack of an organic insulating material and an inorganic insulating material is preferably used. Examples of the organic insulating material include the resins that can be used for the resin layer 62.

In the case of using an organic insulating film for the insulating layer 63, the temperature at the time of the formation is preferably higher than or equal to room temperature and lower than or equal to 350° C., further preferably higher than or equal to room temperature and lower than or equal to 300° C.

Note that the formation of the insulating layer 63 can suppress expansion and contraction of the resin layer 62 caused by the subsequent steps for manufacturing the display device, resulting in higher yield.

Next, the electrode 311$a$ and the conductive layer 311$c$ are formed over the insulating layer 63, and the electrode 311$b$ and the conductive layer 311$d$ are formed over the electrode 311$a$ and the conductive layer 311$c$, respectively (FIG. 7(D)). The electrode 311$b$ has the opening 451 over the electrode 311$a$. The electrode 311$a$, the electrode 311$b$, the conductive layer 311$c$, and the conductive layer 311$d$ can each be formed in the following manner: after a conductive film is formed, a resist mask is formed, the conductive film is etched, and then the resist mask is removed. The electrode 311$a$ is formed using a conductive material that transmits visible light. The electrode 311$b$ is formed using a conductive material that reflects visible light. Moreover, the conductive layer 311c is formed using the same material as the electrode 311a, and the conductive layer 311d is formed using the same material as the electrode 311b.

Subsequently, the insulating layer 220 is formed (FIG. 8(A)). Then, an opening that reaches the electrode 311b and the conductive layer 311d is provided in the insulating layer 220.

The insulating layer 220 can be used as a barrier layer that prevents diffusion of impurities contained in the resin layer 62 into the transistor and the display element formed later. In the case of using an organic material for the resin layer 62, the insulating layer 220 preferably prevents diffusion of moisture and the like contained in the resin layer 62 into the transistor and the display element when the resin layer 62 is heated. Thus, the insulating layer 220 preferably has a high barrier property.

For the insulating layer 220, the inorganic insulating film, the resin, and the like that can be used for the insulating layer 121 can be employed.

Next, the transistor 203, the transistor 205, and the transistor 206 are formed over the insulating layer 220.

There is no particular limitation on a semiconductor material used for the transistors, and for example, a Group 14 element, a compound semiconductor, or an oxide semiconductor can be used for a semiconductor layer. Typically, a semiconductor containing silicon, a semiconductor containing gallium arsenide, a metal oxide containing indium, or the like can be used.

The case where a bottom-gate transistor including a metal oxide layer as the semiconductor layer 231 is fabricated as the transistor 203 and the transistor 206 is shown here. The transistor 205 has a structure in which the conductive layer 223 and the insulating layer 212 are added to the structure of the transistor 203 and the transistor 206, and includes two gates.

A metal oxide is preferably used for the semiconductor of the transistors. The use of a semiconductor material having a wider band gap and a lower carrier density than silicon can reduce the off-state current of the transistors.

Specifically, first, the conductive layer 221a, the conductive layer 221b, and a conductive layer 221c are formed over the insulating layer 220. The conductive layer 221a, the conductive layer 221b, and the conductive layer 221c can be formed in the following manner: after a conductive film is formed, a resist mask is formed, the conductive film is etched, and then the resist mask is removed. Here, the conductive layer 221b and the conductive layer 221c are connected to the electrode 311b and the conductive layer 311d, respectively, through the openings in the insulating layer 220.

Next, the insulating layer 211 is formed.

For the insulating layer 211, for example, an inorganic insulating film such as a silicon nitride film, a silicon oxynitride film, a silicon oxide film, a silicon nitride oxide film, an aluminum oxide film, or an aluminum nitride film can be used. Moreover, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack of two or more of the above insulating films may also be used.

An inorganic insulating film is preferably formed at high temperatures because the film can have higher density and a higher barrier property as the deposition temperature is higher. The substrate temperature at the time of depositing the inorganic insulating film is preferably higher than or equal to room temperature (25° C.) and lower than or equal to 350° C., further preferably higher than or equal to 100° C. and lower than or equal to 300° C.

Then, the semiconductor layer 231 is formed. In this embodiment, a metal oxide layer is formed as the semiconductor layer 231. The metal oxide layer can be formed in the following manner: after a metal oxide film is formed, a resist mask is formed, the metal oxide film is etched, and then the resist mask is removed.

The substrate temperature at the time of depositing the metal oxide film is preferably lower than or equal to 350° C., further preferably higher than or equal to room temperature and lower than or equal to 200° C., still further preferably higher than or equal to room temperature and lower than or equal to 130° C. Note that the substrate temperature is preferably lower than the heating temperature at the time of forming the resin layer 62, in which case the influence of a gas released from the resin layer 62 can be reduced. Note that the same applies to the case where the insulating layer 220 is formed using a resin.

The metal oxide film can be deposited using either an inert gas or an oxygen gas. Note that there is no particular limitation on the flow rate ratio of oxygen (the partial pressure of oxygen) at the time of depositing the metal oxide film. However, to obtain a transistor having high field-effect mobility, the flow rate ratio of oxygen (the partial pressure of oxygen) at the time of depositing the metal oxide film is preferably higher than or equal to 0% and lower than or equal to 30%, further preferably higher than or equal to 5% and lower than or equal to 30%, still further preferably higher than or equal to 7% and lower than or equal to 15%.

The metal oxide film preferably contains at least indium or zinc. In particular, the metal oxide film preferably contains indium and zinc.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

The metal oxide film can be formed by a sputtering method. Alternatively, a PLD method, a PECVD method, a thermal CVD method, an ALD method, or a vacuum evaporation method, for example, may be used.

Note that an example of a metal oxide will be described in Embodiment 4.

Next, the conductive layer 222a and the conductive layer 222b are formed. The conductive layer 222a and the conductive layer 222b can be formed in the following manner: after a conductive film is formed, a resist mask is formed, the conductive film is etched, and then the resist mask is removed. The conductive layer 222a and the conductive layer 222b are each connected to the semiconductor layer 231. Here, the conductive layer 222a included in the transistor 206 is electrically connected to the conductive layer 221b. Thus, the electrode 311b and the conductive layer 222a can be electrically connected to each other in the connection portion 207.

Note that during the processing of the conductive layer 222a and the conductive layer 222b, part of the semiconductor layer 231 that is not covered by the resist mask is sometimes reduced in thickness by etching.

In the above manner, the transistor 206 can be fabricated. In the transistor 206, part of the conductive layer 221a functions as a gate, part of the insulating layer 211 functions as a gate insulating layer, and the conductive layer 222a and the conductive layer 222b function as a corresponding one of a source and a drain. The transistor 203 can also be formed in a similar manner.

Next, the insulating layer 212 that covers the transistor 206 is formed, and the conductive layer 223 is formed over the insulating layer 212.

The insulating layer 212 can be formed by a method similar to that for the insulating layer 211.

The conductive layer 223 included in the transistor 205 can be formed in the following manner: after a conductive film is formed, a resist mask is formed, the conductive film is etched, and then the resist mask is removed.

In the above manner, the transistor 205 can be fabricated. In the transistor 205, part of the conductive layer 221a and part of the conductive layer 223 function as gates, part of the insulating layer 211 and part of the insulating layer 212 function as gate insulating layers, and the conductive layer 222a and the conductive layer 222b function as a corresponding one of a source and a drain.

Next, the insulating layer 213 is formed. The insulating layer 213 can be formed by a method similar to that for the insulating layer 211.

In addition, for the insulating layer 212, an oxide insulating film deposited in an oxygen-containing atmosphere, such as a silicon oxide film or a silicon oxynitride film, is preferably used. Furthermore, an insulating film through which oxygen is less likely to diffuse and pass, such as a silicon nitride film, is preferably stacked as the insulating layer 213 over the silicon oxide film or the silicon oxynitride film. The oxide insulating film formed in an oxygen-containing atmosphere can be an insulating film that easily releases a large amount of oxygen by heating. By performing heat treatment in the state where such an oxide insulating film that releases oxygen and the insulating film through which oxygen is less likely to diffuse and pass are stacked, oxygen can be supplied to the metal oxide layer. As a result, oxygen vacancies in the metal oxide layer and defects at the interface between the metal oxide layer and the insulating layer 212 can be repaired, and defect levels can be reduced. Consequently, an extremely highly reliable display device can be achieved.

Next, the coloring layer 134 is formed over the insulating layer 213 (FIG. 8(A)), and then, the insulating layer 214 is formed (FIG. 8(B)). The coloring layer 134 is positioned so as to overlap with the opening 451 in the electrode 311b.

The coloring layer 134 can be formed by a method similar to that for the coloring layer 131. The insulating layer 214 is a layer having a surface where the display element is to be formed later, and thus preferably functions as a planarization layer. For the insulating layer 214, the resin or the inorganic insulating film that can be used for the insulating layer 121 can be referred to.

Next, an opening that reaches the conductive layer 222b included in the transistor 205 is formed in the insulating layer 212, the insulating layer 213, and the insulating layer 214.

Subsequently, the electrode 191 is formed (FIG. 8(B)). The electrode 191 can be formed in the following manner: after a conductive film is formed, a resist mask is formed, the conductive film is etched, and then the resist mask is removed. Here, the conductive layer 222b included in the transistor 205 and the electrode 191 are connected to each other. The electrode 191 is formed using a conductive material that transmits visible light.

Then, the insulating layer 216 that covers the end portion of the electrode 191 is formed (FIG. 9(A)). For the insulating layer 216, the resin or the inorganic insulating film that can be used for the insulating layer 121 can be referred to. The insulating layer 216 has an opening in at least part of a portion overlapping with the electrode 191.

Next, the EL layer 192 and the electrode 193 are formed (FIG. 9(A)). Part of the electrode 193 functions as a common electrode of the light-emitting element 170. The electrode 193 is formed using a conductive material that reflects visible light.

The EL layer 192 can be formed by a method such as an evaporation method, a coating method, a printing method, or a discharge method. In the case where the EL layer 192 is separately formed for each individual pixel, it can be formed by an evaporation method using a shadow mask such as a metal mask, an ink-jet method, or the like. In the case where the EL layer 192 is not separately formed for each individual pixel, an evaporation method that uses no metal mask can be used.

Either a low molecular compound or a high molecular compound can be used for the EL layer 192, and an inorganic compound may be included.

Steps conducted after the formation of the EL layer 192 are performed such that the temperature applied to the EL layer 192 is lower than or equal to the upper temperature limit of the EL layer 192. The electrode 193 can be formed by an evaporation method, a sputtering method, or the like.

In the above manner, the light-emitting element 170 can be formed (FIG. 9(A)). The light-emitting element 170 has a structure where the electrode 191 part of which functions as the pixel electrode, the EL layer 192, and the electrode 193 part of which functions as the common electrode are stacked. The light-emitting element 170 is formed such that the light-emitting region overlaps with the coloring layer 134 and the opening 451 in the electrode 311b.

Although an example where a bottom-emission light-emitting element is formed as the light-emitting element 170 is described here, one embodiment of the present invention is not limited to this.

The light-emitting element may be of top-emission type, bottom-emission type, or dual-emission type. A conductive film that transmits visible light is used for the electrode through which light is extracted. Moreover, a conductive film that reflects visible light is preferably used for the electrode through which light is not extracted.

Next, the insulating layer 194 is formed to cover the electrode 193 (FIG. 9(A)). The insulating layer 194 functions as a protective layer that prevents diffusion of impurities such as water into the light-emitting element 170. The light-emitting element 170 is sealed with the insulating layer 194. The insulating layer 194 is preferably formed without exposure to the air after the electrode 193 is formed.

For the insulating layer 194, the inorganic insulating film that can be used for the above-described insulating layer 121 can be employed, for example. It is particularly preferred that an inorganic insulating film with a high barrier property be included. A stack of an inorganic insulating film and an organic insulating film may also be used.

The substrate temperature at the time of forming the insulating layer 194 is preferably lower than or equal to the upper temperature limit of the EL layer 192. The insulating layer 194 can be formed by an ALD method, a sputtering method, or the like. An ALD method and a sputtering method are preferable because low-temperature film formation is possible. Using an ALD method is preferable because the coverage with the insulating layer 194 becomes favorable.

Subsequently, the substrate 351 is bonded to a surface of the insulating layer 194 with the adhesive layer 142 (FIG. 9(B)).

For the adhesive layer 142, a variety of curable adhesives such as a photocurable adhesive such as an ultraviolet curable adhesive, a reactive curable adhesive, a thermosetting adhesive, and an anaerobic adhesive can be used. Alternatively, an adhesive sheet or the like may be used.

For the substrate 351, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. For the substrate 351, a variety of materials such as glass, quartz, a resin, a metal, an alloy, and a semiconductor may be used. For the substrate 351, a variety of materials such as glass, quartz, a resin, a metal, an alloy, and a semiconductor that have a thickness small enough to be flexible may be used.

Then, the formation substrate 61 and the resin layer 62 are separated from each other (FIG. 10(A)).

The resin layer 62 can be separated from the formation substrate 61 by applying a perpendicular tensile force to the resin layer 62, for example. Specifically, the resin layer 62 can be peeled from the formation substrate 61 by pulling the formation substrate 61 upward while part of the top surface thereof is sucked.

Before the separation, a separation trigger may be formed by separating part of the resin layer 62 from the formation substrate 61. For example, the separation trigger may be formed by inserting a sharp-shaped instrument such as a knife between the formation substrate 61 and the resin layer 62. Alternatively, the separation trigger may be formed by cutting the resin layer 62 from the formation substrate 61 side with a sharp-shaped instrument. Alternatively, the separation trigger may be formed by a method using a laser, such as a laser ablation method.

In this embodiment, the first heat treatment is performed in the atmosphere containing oxygen at the time of forming the resin layer 62; thus, the formation substrate 61 and the resin layer 62 can be separated from each other without performing laser irradiation on the entire surface of the resin layer 62. Consequently, a display device can be manufactured at low costs.

FIG. 10(A) shows an example where separation occurs at the interface between the resin layer 62 and the formation substrate 61.

The position of the separation surface can vary depending on the materials and the formation methods of the resin layer 62, the formation substrate 61, and the like, the conditions of the first heat treatment, and the like.

Although FIG. 10(A) shows the example where the separation occurs at the interface between the resin layer 62 and the formation substrate 61, separation sometimes occurs in the resin layer 62 and at the interface between the insulating layer 63 and the resin layer 62. Part of the resin layer (the resin layer 62a) remains on the formation substrate 61. By the separation, the insulating layer 63 is exposed. A resin layer 62b that remains on the insulating layer 63 side is made smaller in thickness than the resin layer 62 in FIG. 9(B).

In addition, in some cases, separation occurs in the resin layer 62 and the resin layer is left on both the formation substrate 61 side and the insulating layer 63 side by the separation.

The conductive layer 311c is formed in the recess portion of the resin layer 62 in the above manner, whereby it becomes easy to expose the conductive layer 311c. Moreover, in this manufacturing method, the insulating layer 63 and/or the resin layer 62b can be left after the conductive layer 311c is exposed, so that contamination of the transistor can be reduced.

The formation substrate 61 can be reused. For example, in the case where glass is used for the formation substrate 61 and a polyimide resin is used for the resin layer 62, the resin layer 62 that remains on the formation substrate 61 can be removed with fuming nitric acid. Alternatively, by using a thermosetting material again, the resin layer 62 may be formed over the resin layer 62 that remains on the formation substrate 61.

In this embodiment, the conductive layer 311c is not exposed at the time of the separation from the formation substrate 61; thus, at least part of each of the remaining insulating layer 63 and resin layer 62 is removed to expose the conductive layer 311c (FIG. 10(B)).

There is no particular limitation on a method for removing the resin layer 62. For example, a wet etching method or a dry etching method can be used, and it is preferable to perform the removal by ashing using oxygen plasma. Ashing has advantages such as high controllability, good in-plane uniformity, and high suitability for treatment using a large-sized substrate. The insulating layer 63 can be removed by a dry etching method, for example.

Note that the electrode 311a may be exposed at the same time as exposing the conductive layer 311c. In the case where the resin layer 62 is colored, removing it can improve the display quality. Note that the electrode 311a does not need to be exposed completely, and the insulating layer 63 and the resin layer 62 may remain on its surface.

Figure 11:
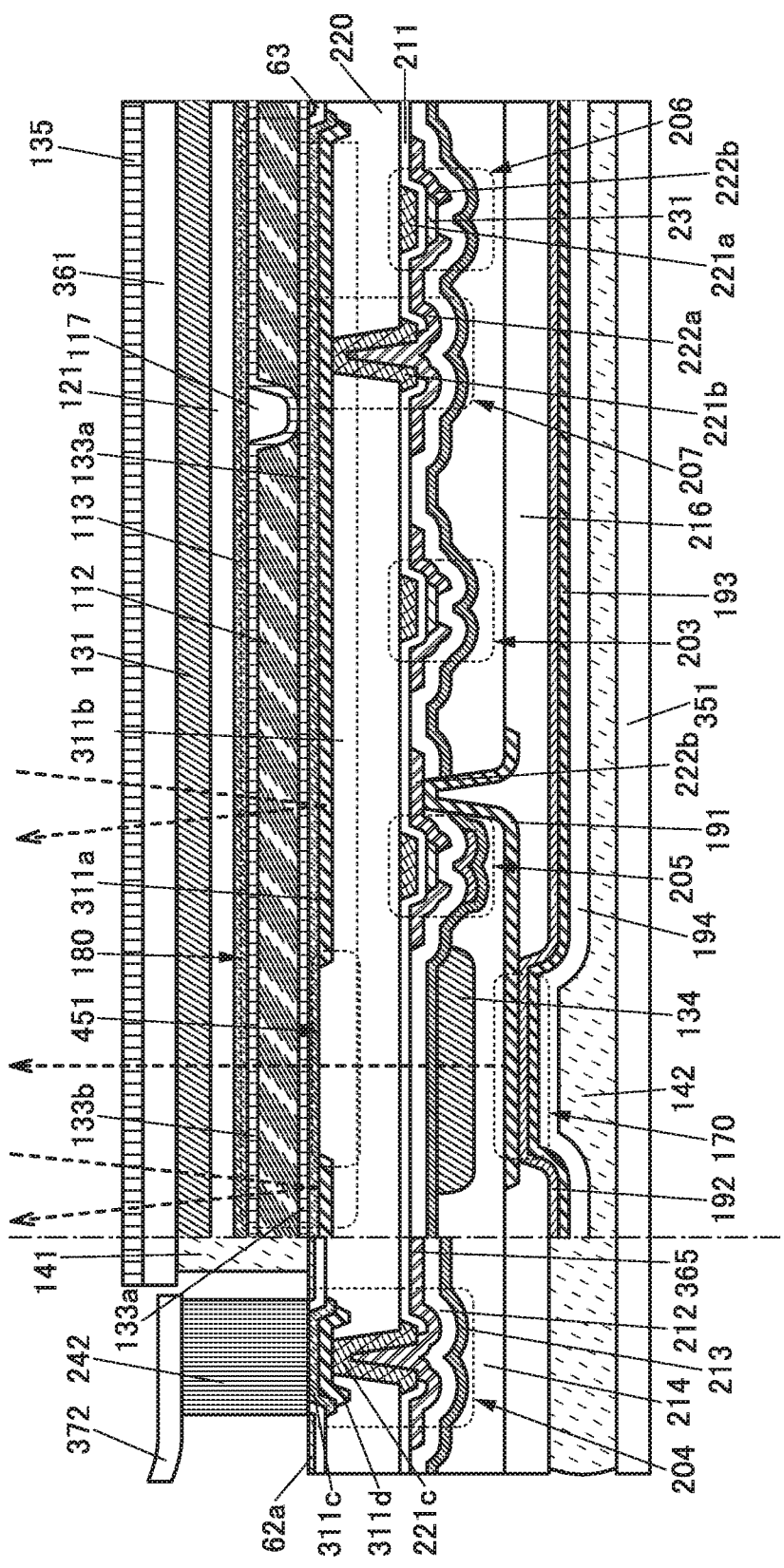
FIG. 11 A cross-sectional view illustrating an example of a display device and an example of a method for manufacturing a display device.
Figure 12A:
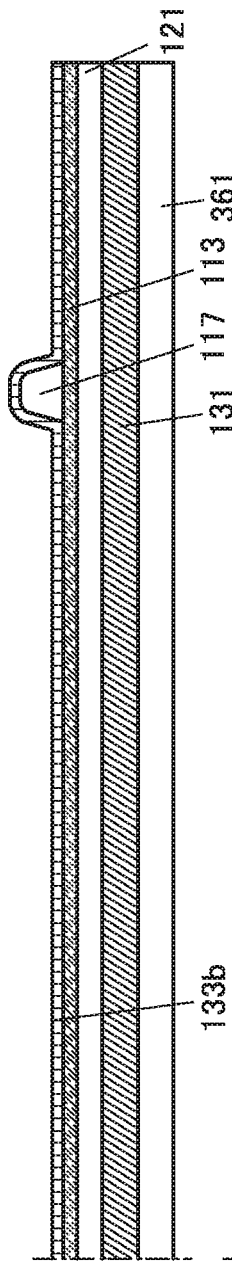
FIG. 12 Cross-sectional views illustrating an example of a method for manufacturing a display device.
Figure 12B:
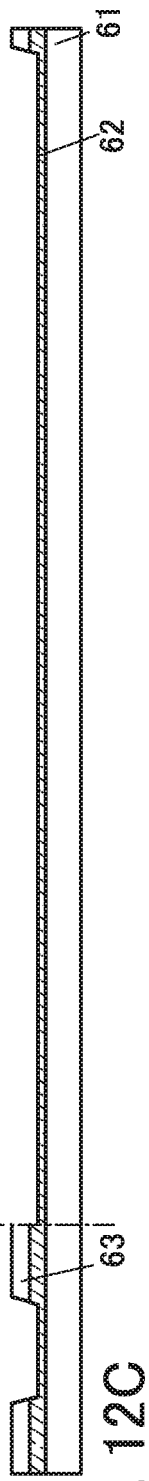
Figure 12C:
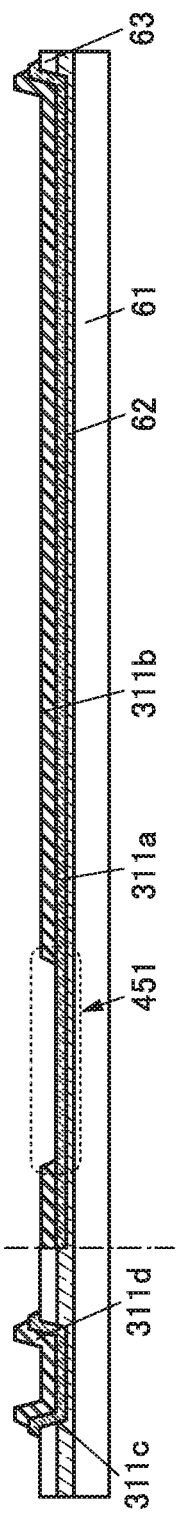
Figure 12D:
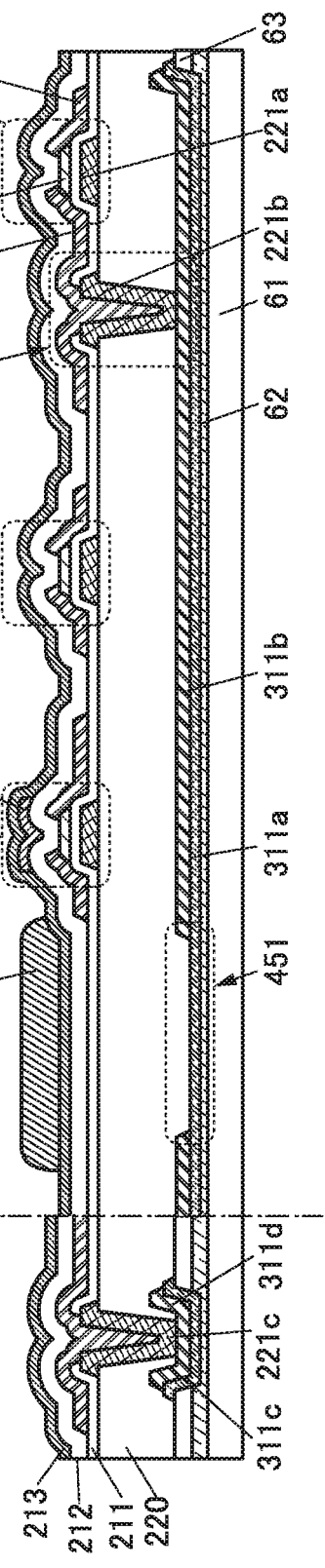
Figure 16:
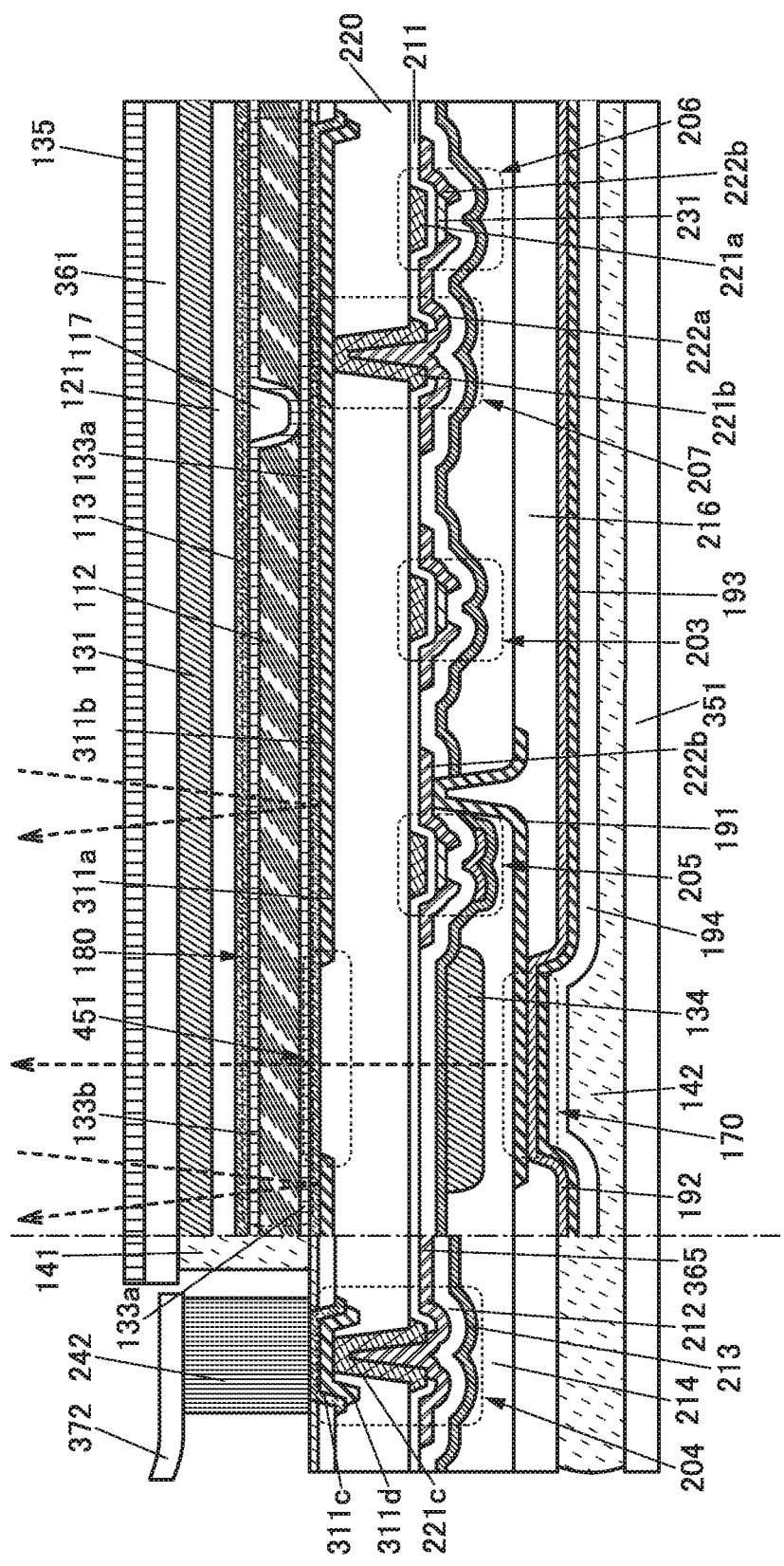
FIG. 16 A cross-sectional view illustrating an example of a method for manufacturing a display device.

Subsequently, the alignment film 133a is formed over the electrode 311a (FIG. 11). The alignment film 133a can be formed by forming a thin film of a resin or the like and then performing rubbing treatment. Note that the alignment film is separately formed in this embodiment; however, when the resin layer 62 is left on the electrode 311a, the resin layer subjected to rubbing treatment may be used as the alignment film.

Then, the substrate 351 where the components up to the alignment film 133a have been formed and the substrate 361 where the steps up to FIG. 7(A) have been completed are attached using the adhesive layer 141, with the liquid crystal 112 sandwiched therebetween (FIG. 11). For the adhesive layer 141, the materials that can be used for the adhesive layer 142 can be referred to.

The liquid crystal element 180 illustrated in FIG. 11 has a structure where the electrode 311a (and the electrode 311b) part of which functions as the pixel electrode, the liquid crystal 112, and the electrode 113 part of which functions as the common electrode are stacked. The liquid crystal element 180 is formed so as to overlap with the coloring layer 131.

In the above manner, the display device 300 can be manufactured.

FIG. 12 to FIG. 16 are diagrams showing a different structure of the display device 300. Although the structure in FIG. 12 to FIG. 16 is substantially the same as that in FIG. 7 to FIG. 11, a method of forming the recess portion of the resin layer 62 is different, resulting in a different shape of the insulating layer 63. In the formation method, an insulating layer is formed after the resin layer 62 is formed and before the recess portion is formed. Then, the insulating layer 63 and the resin layer 62 are continuously etched at the same time, whereby the recess portion is formed (FIG. 12(B)). The etching is finished in a state where the resin layer 62 is left after an opening is formed in the insulating layer 63.

Thus, the resin layer 62 having the recess portion can be formed. The etching is performed by dry etching. In this case, the resin layer 62 can be formed using a material without photosensitivity.

Alternatively, after an opening is formed in the insulating layer 63, etching may be performed with the use of the insulating layer 63 as a mask by a method that is different from the etching of the insulating layer 63 and is suitable for the material forming the resin layer 62 and half etching.

Figure 18:
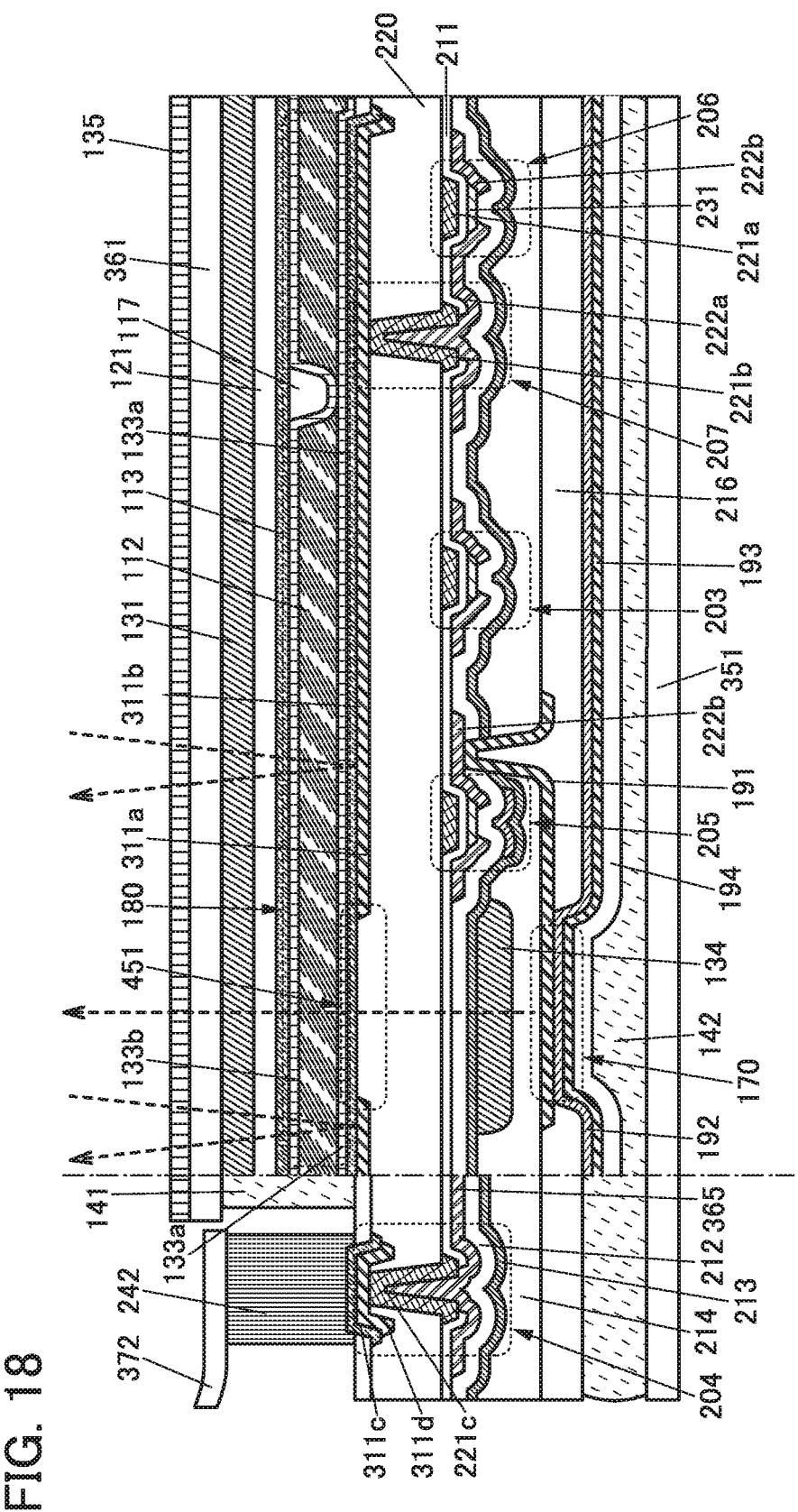
FIG. 18 Cross-sectional view illustrating an example of a display device and an example of a method for manufacturing a display device.
Figure 23:
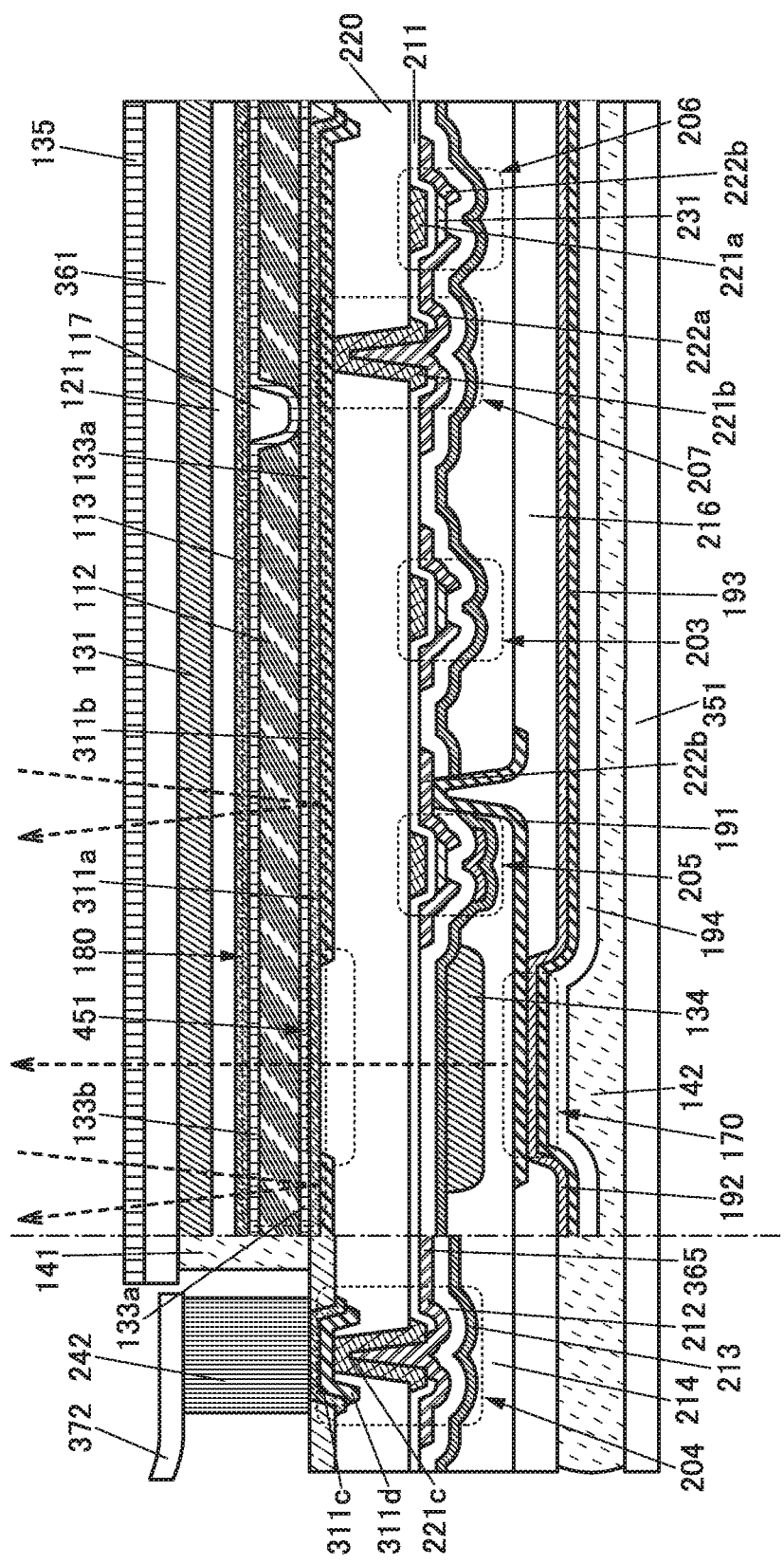
FIG. 23 A cross-sectional view illustrating an example of a display device and an example of a method for manufacturing a display device.

Alternatively, as in FIG. 17(A), the resin layer 62 may be completely removed. In this case, the conductive layer 311c protrudes; thus, it is preferable to provide the connection layer 242 so as to cover the conductive layer 311c, in which case the anchoring effect is generated. Consequently, adhesion between the connection layer 242 and the conductive layer 311c can be improved (FIG. 18). Note that a structure where the conductive layer 311c is protruded with the resin layer 62 left may be employed.

FIG. 19 to FIG. 23 are diagrams showing a different display device 300. FIG. 19 to FIG. 23 are substantially the same as FIG. 7 to FIG. 11 except that the insulating layer 63 is not formed. In the formation method, after the resin layer 62 is formed, the recess portion is formed without forming the insulating layer 63 (FIG. 19(B)), and the electrode 311a and the conductive layer 311c are formed (FIG. 19(C)). After the formation substrate 61 is separated, the resin layer 62b is removed to expose the conductive layer 311c. Not providing the insulating layer 63 can cut out the need of film formation and the need of removal.

FIG. 34 to FIG. 39 are diagrams illustrating a different structure of the display device 300. FIG. 34 to FIG. 39 are substantially the same as FIG. 7 to FIG. 10, except that the insulating layer 63 is not formed and that the resin layer 62 is formed of two layers of a resin layer 62n and a resin layer 62m.

FIG. 34(A) is the same as FIG. 7(A), and thus the description is omitted. Then, the resin layer 62n is formed over the formation substrate 61 (FIG. 34(B)).

The description of the resin layer 62 in FIG. 7 can be referred to for the material and the method used for the resin layer 62n.

In this embodiment, the resin layer 62n is formed using a photosensitive and thermosetting material. Note that the resin layer 62n may be formed using a non-photosensitive material.

For the resin layer 62n, a material to be the resin layer 62n is deposited, and after that, heat treatment for removing a solvent (pre-baking treatment) is performed, and then light exposure is performed using a photomask. Then, development treatment is performed, whereby an unnecessary portion can be removed. Next, the first heat treatment is performed, whereby the resin layer 62n is formed (FIG. 34(B)). FIG. 34(B) shows an example where the resin layer 62n having an island shape is formed.

The shape of the resin layer 62n is not limited to a single-island shape and may be a shape of a plurality of islands or a shape having an opening, for example. Note that in the case of using a photosensitive material, the second region can be formed by a light exposure technique using a half-tone mask or a gray-tone mask, a multiple light exposure technique, or the like.

Alternatively, the resin layer 62n having a desired shape can be formed by forming a mask such as a resist mask or a hard mask and performing etching. This method is particularly suitable for the case of using a non-photosensitive material. In this case, it is preferable to form the mask with an extremely small thickness and remove the mask concurrently with the etching, in which case a step of removing the mask can be eliminated.

The first heat treatment is performed in an atmosphere containing oxygen. The first heat treatment is preferably performed while a gas containing oxygen flows.

Next, the resin layer 62m is formed over the formation substrate 61 and the resin layer 62n (FIG. 34(C)). Over the formation substrate 61, there is a portion where the resin layer 62n is not provided. Thus, a portion that is in contact with the resin layer 62m can be formed on the formation substrate 61.

The resin layer 62m can employ the material and the method that can be used for the resin layer 62n.

The resin layer 62m is preferably formed by a coating method, in which case step coverage is improved and a surface can be flat.

The resin layer 62m is preferably formed using a thermosetting material.

The resin layer 62m may be formed using a photosensitive material or may be formed using a non-photosensitive material.

In this embodiment, the resin layer 62m is formed using a photosensitive and thermosetting material.

The resin layer 62m is formed by depositing a material to be the resin layer 62m and then performing second heat treatment (FIG. 34(C)).

The second heat treatment is performed in an atmosphere that contains less oxygen than the atmosphere for the first heat treatment. The second heat treatment is preferably performed without flow of a gas containing oxygen or performed while a gas in which the proportion of oxygen is lower than that in the gas used for the first heat treatment is made to flow.

The second heat treatment can be performed in a state where the atmosphere in a chamber of an apparatus is a nitrogen atmosphere or a rare gas atmosphere, for example.

For example, the partial pressure of oxygen in the atmosphere at the time of the first heat treatment is preferably higher than or equal to 0% and lower than 15%, further preferably higher than or equal to 0% and lower than or equal to 10%, still further preferably higher than or equal to 0% and lower than or equal to 5%.

The second heat treatment is preferably performed while a gas that does not contain oxygen or a gas in which the proportion of oxygen is lower than that in the gas used for the first heat treatment is made to flow into the chamber of the apparatus. The second heat treatment is preferably performed while only a nitrogen gas, only an argon gas, or a mixed gas containing oxygen is made to flow. Specifically, a mixed gas containing oxygen and nitrogen or a rare gas (e.g., argon) can be used. The proportion of the flow rate of the oxygen gas in the flow rate of the whole mixed gas is preferably higher than 0% and lower than 15%, further preferably higher than 0% and lower than or equal to 10%, still further preferably higher than 0% and lower than or equal to 5%.

The temperature of the second heat treatment is preferably higher than or equal to 200° C. and lower than or equal to 500° C., further preferably higher than or equal to 250° C. and lower than or equal to 475° C., still further preferably higher than or equal to 300° C. and lower than or equal to 450° C.

By the second heat treatment, released gas components (e.g., hydrogen and water) in the resin layer 62m can be reduced. In particular, the heating is preferably performed at a temperature higher than or equal to the formation temperature of each layer formed over the resin layer 62m. Thus, a gas released from the resin layer 62m in the manufacturing process of the transistor can be significantly reduced.

For example, in the case where the formation temperature of the transistor is up to 350° C., a film to be the resin layer 62m is preferably heated at a temperature higher than or equal to 350° C. and lower than or equal to 450° C., further preferably lower than or equal to 400° C., still further preferably lower than or equal to 375° C. Thus, a gas released from the resin layer 62m in the manufacturing process of the transistor can be significantly reduced.

The maximum temperature in manufacture of the transistor is preferably made equal to the temperature of the second heat treatment, in which case the maximum temperature in manufacture of the device can be prevented from being increased by performing the second heat treatment.

The longer the duration of the second heat treatment is, the more sufficiently the released gas components in the resin layer 62m can be reduced.

Even when the heating temperature is relatively low, increasing the treatment time sometimes achieves an effect equivalent to that under a condition with a higher heating temperature. It is thus preferable to increase the treatment time when the heating temperature cannot be increased because of the structure of the apparatus.

The duration of the second heat treatment is preferably longer than or equal to 5 minutes and shorter than or equal to 24 hours, further preferably longer than or equal to 30 minutes and shorter than or equal to 12 hours, still further preferably longer than or equal to 1 hour and shorter than or equal to 6 hours, for example. Note that the duration of the second heat treatment is not particularly limited to these. It may be shorter than 5 minutes, for example, when the second heat treatment is performed by an RTA method.

Note that the heat treatment sometimes changes the thickness of the resin layer 62m from that at the time of the film formation.

Before the second heat treatment is performed, thermal treatment for reducing a solvent contained in the resin layer 62m (pre-baking treatment) may be performed. Alternatively, the second heat treatment may double as the pre-baking treatment, and the solvent contained in the resin layer 62m may be removed by the second heat treatment.

The resin layer 62m has flexibility. The formation substrate 61 has lower flexibility than the resin layer 62m.

The thickness of the resin layer 62m is greater than or equal to 0.1 μm and less than 20 μm, preferably greater than or equal to 0.01 μm and less than 10 μm, further preferably greater than or equal to 0.1 μm and less than or equal to 3 μm, still further preferably greater than or equal to 0.5 μm and less than or equal to 2 μm. With the use of a low-viscosity solution, the resin layer 62m can be easily formed thin. Setting the thickness of the resin layer 62m in the above range can increase the flexibility of the display device. Moreover, a result that the thickness of the resin layer 62m does not affect the force required for separation of the resin layer 62n has been obtained. Thus, it is considered that the resin layer 62m can be formed thinner than the resin layer 62n. However, without being limited thereto, the thickness of the resin layer 62m may be greater than or equal to 10 μm. For example, the thickness of the resin layer 62m may be greater than or equal to 10 μm and less than or equal to 200 μm. Setting the thickness of the resin layer 62m to greater than or equal to 10 μm is preferable in terms of increasing the rigidity of the display device.

The thermal expansion coefficient of the resin layer 62m is preferably greater than or equal to 0.1 ppm/° C. and less than or equal to 50 ppm/° C., further preferably greater than or equal to 0.1 ppm/° C. and less than or equal to 20 ppm/° C., still further preferably greater than or equal to 0.1 ppm/° C. and less than or equal to 10 ppm/° C. A lower thermal expansion coefficient of the resin layer 62m can further prevent occurrence of a crack in a layer included in the transistor or the like and breakage of the transistor or the like that are due to heating.

In the case where the resin layer 62m is positioned on the display surface side of the display device, the resin layer 62m preferably has a high visible-light transmitting property.

The resin layer 62n and the resin layer 62m may be formed using different materials or may be formed using the same material. Using the same material is preferable in terms of cost reduction. Even in the case of using the same material, the level of adhesion to the formation substrate 61 can be made different between the resin layer 62n and the resin layer 62m by varying the conditions for the first heat treatment and the second heat treatment. Note that the resin layer 62m can be replaced with an inorganic insulating film.

Next, the electrode 311a and the conductive layer 311c are formed over the resin layer 62m, and the electrode 311b and the conductive layer 311d are formed over the electrode 311a and the conductive layer 311c, respectively (FIG. 34(D)).

Note that an insulating layer may be formed between the resin layer 62m and the above conductive layer. The insulating layer can be formed in a manner similar to that of the insulating layer 63 described in FIG. 7 and the like.

The steps in FIG. 35 and FIG. 36 are the same as those in FIG. 8 and FIG. 9, and the description is therefore omitted. Note that for the substrate 351, an organic resin or the like is preferably used.

Then, a separation trigger is formed in the resin layer 62n (FIG. 37(A)).

For example, a sharp-shaped instrument such as a knife is inserted from the substrate 351 side into a portion located inward from an end portion of the resin layer 62n to make a frame-shaped cut.

Alternatively, laser light irradiation may be performed on the resin layer 62 so as to draw a frame-like pattern.

In the structure in FIG. 34 to FIG. 39, the portion that the resin layer 62n is in contact with and the portion that the resin layer 62m is in contact with are provided over the formation substrate 61. By performing the first heat treatment in an atmosphere containing oxygen, the resin layer 62n becomes a state of easily separating from the formation substrate 61. On the other hand, the second heat treatment is performed in an atmosphere that contains less oxygen than the atmosphere for the first heat treatment; thus, the resin layer 62m is in a state of being less likely to separate from the formation substrate 61 than the resin layer 62n is. Accordingly, the existence of the place where the resin layer 62m is in contact with the formation substrate 61 can suppress the separation of the resin layer 62n from the formation substrate 61 at unintentional timing. In addition, the formation of the separation trigger enables the separation of the formation substrate 61 and the resin layer 62n at desired timing. Thus, the timing of the separation can be controlled more precisely, and high peelability can be achieved. This can increase the yield of the separation step and the manufacturing process of the display device.

Next, the formation substrate 61 and an element formation region 380 are separated from each other (FIG. 37(B)).

In the structure in FIG. 34 to FIG. 39, the first heat treatment, which is the heat treatment in an atmosphere containing oxygen, is used to control the peelability of the resin layer 62n; thus, the formation substrate 61 and the resin layer 62n can be separated from each other without performing laser irradiation on the entire surface of the resin layer 62n. Consequently, the display device can be manufactured at low costs.

Figure 38:
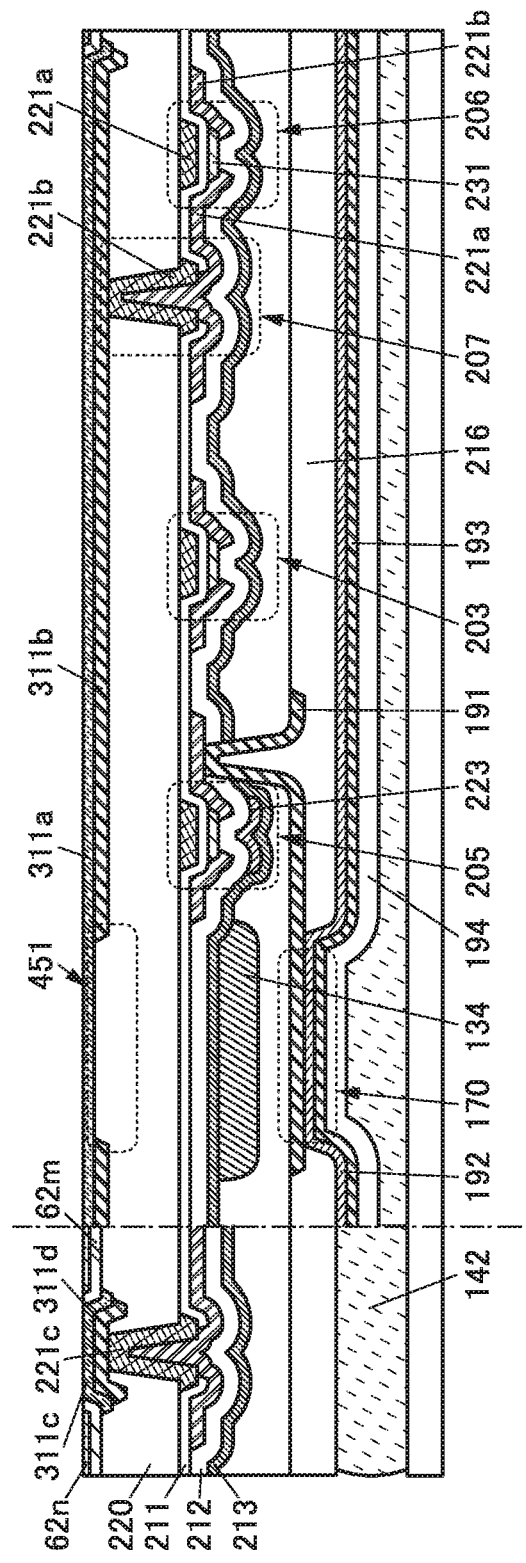
FIG. 38 A Cross-sectional view illustrating an example of a method for manufacturing a display device.
Figure 39:
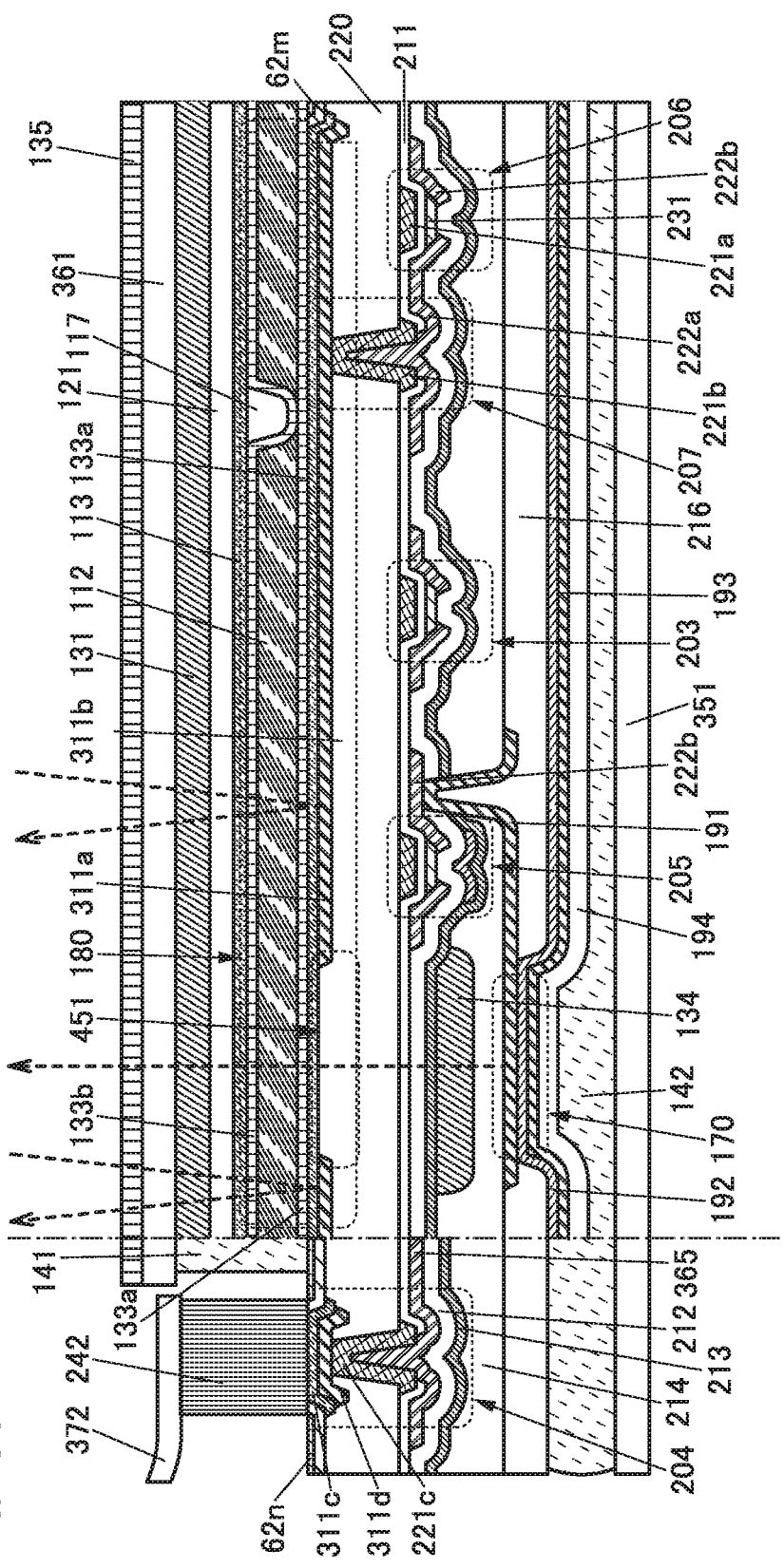
FIG. 39 A Cross-sectional view illustrating an example of a display device and an example of a method for manufacturing a display device.

Next, the resin layer 62n that is exposed by the separation from the formation substrate 61 and the resin layer 62m that is in contact with the surface of the conductive layer 311c are removed (FIG. 38). The subsequent steps are the same as those in FIG. 11, and the description is therefore omitted. In this manner, the display device can be manufactured (FIG. 39).

Note that as described above, the resin layer 62m may be formed as an inorganic insulating film. Even when the resin layer 62m is replaced with an inorganic insulating film, the separation timing can be controlled more precisely and high peelability can be achieved in a similar manner. This can increase the yield of the separation step and the manufacturing process of the display device.

As described above, the display device that can be manufactured easily according to this embodiment includes two types of display elements and can be used with switching between a plurality of display modes, and thus can be a display device that has high visibility and high convenience regardless of ambient brightness.

This embodiment can be combined with the other embodiments as appropriate. Moreover, in this specification, in the case where a plurality of structure examples are shown in one embodiment, the structure examples can be combined as appropriate.

Embodiment 2

In this embodiment, a display device that can be manufactured by one embodiment of the present invention will be described with reference to FIG. 24 to FIG. 27.

Figure 24:
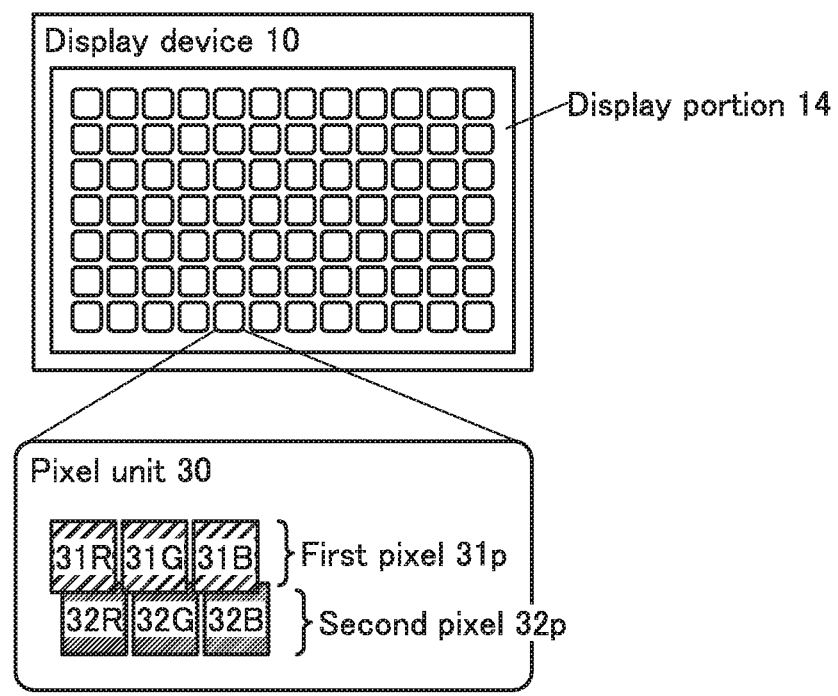
FIG. 24 A block diagram illustrating an example of a display device.

FIG. 24 is a block diagram of the display device 10. The display device 10 includes a display portion 14.

The display portion 14 includes a plurality of pixel units 30 arranged in a matrix. The pixel units 30 each include a first pixel 31p and a second pixel 32p.

FIG. 24 illustrates an example of the case where the first pixel 31p and the second pixel 32p each include display elements corresponding to three colors of red (R), green (G), and blue (B).

The display elements included in the first pixel 31p are each a display element that utilizes reflection of external light. The first pixel 31p includes a first display element 31R corresponding to red (R), a first display element 31G corresponding to green (G), and a first display element 31B corresponding to blue (B).

The display elements included in the second pixel 32p are each a light-emitting element. The second pixel 32p includes a second display element 32R corresponding to red (R), a second display element 32G corresponding to green (G), and a second display element 32B corresponding to blue (B).

Figure 25A:
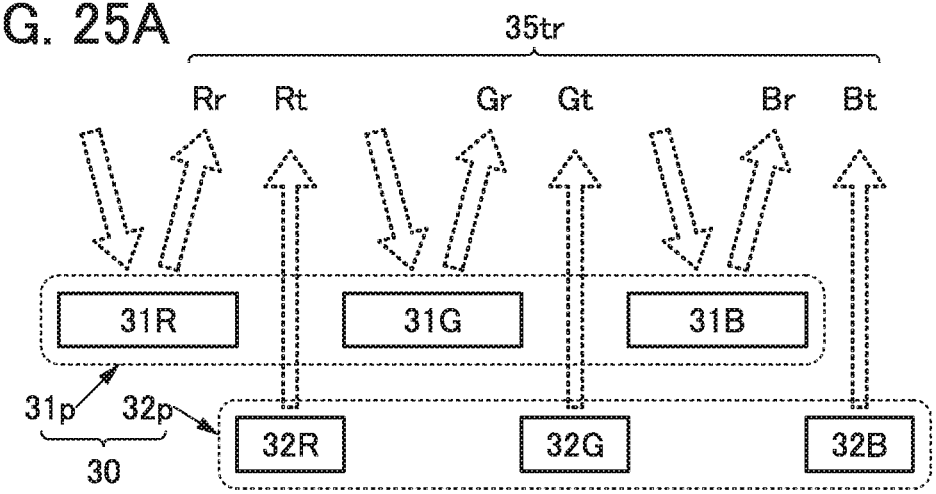
FIG. 25 Drawings illustrating an example of a pixel unit.
Figure 25B:
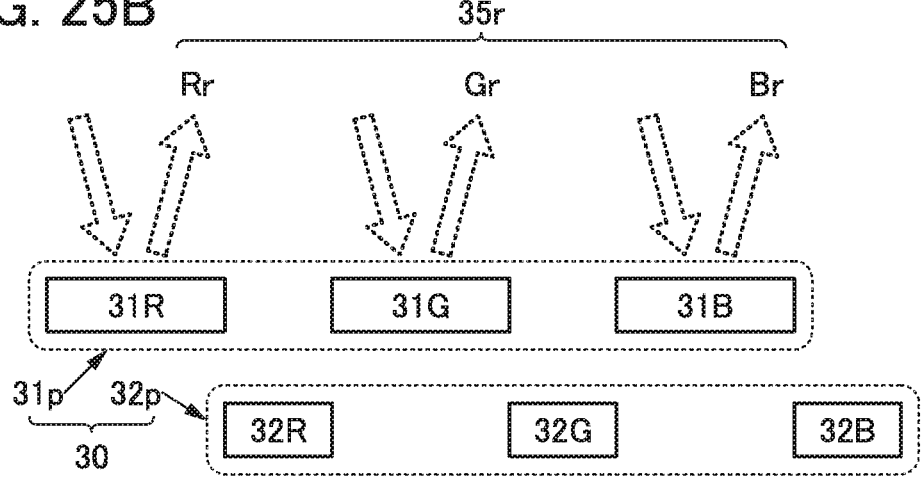
Figure 25C:
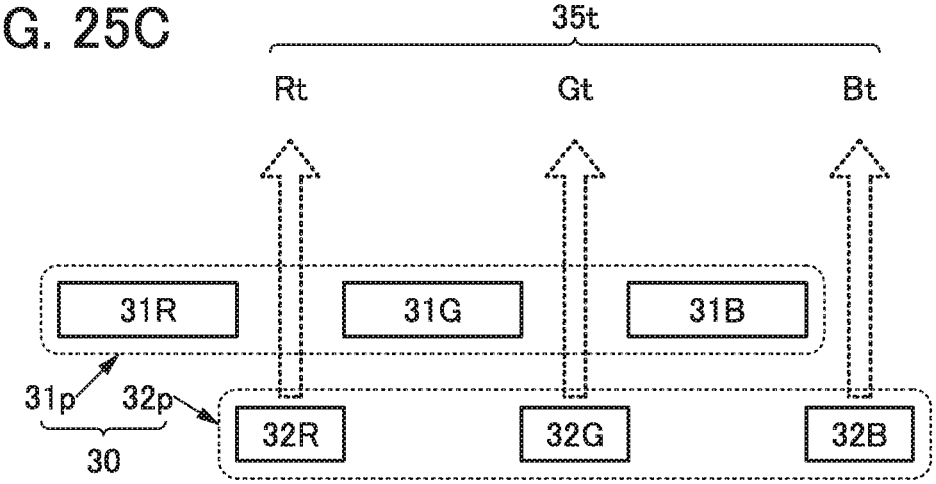

FIGS. 25(A) to (C) are schematic views illustrating a structure example of the pixel unit 30.

The first pixel 31p includes the first display element 31R, the first display element 31G, and the first display element 31B. The first display element 31R reflects external light and emits red light Rr to the display surface side. Similarly, the first display element 31G and the first display element 31B emit green light Gr and blue light Br, respectively, to the display surface side.

The second pixel 32p includes the second display element 32R, the second display element 32G, and the second display element 32B. The second display element 32R emits red light Rt to the display surface side. Similarly, the second display element 32G and the second display element 32B emit green light Gt and blue light Bt, respectively, to the display surface side.

FIG. 25(A) corresponds to a mode (third mode) in which display is performed by driving of both the first pixel 31p and the second pixel 32p. The pixel unit 30 can emit light 35tr of a predetermined color to the display surface side using the reflected light (light Rr, light Gr, and light Br) and the transmitted light (light Rt, light Gt, and light Bt).

FIG. 25(B) corresponds to a mode (first mode) in which display is performed using reflected light by driving of only the first pixel 31p. For example, when the intensity of external light is high enough, the pixel unit 30 can emit light 35r to the display surface side using only the light from the first pixel 31p (light Rr, light Gr, and light Br), without driving of the second pixel 32p. Thus, driving with extremely low power consumption can be performed.

FIG. 25(C) corresponds to a mode (second mode) in which display is performed using generated light (transmitted light) by driving of only the second pixel 32p. For example, when the intensity of external light is extremely low, the pixel unit 30 can emit light 35t to the display surface side using only the light from the second pixel 32p (light Rt, light Gt, and light Bt), without driving of the first pixel 31p. Thus, vivid display can be performed. Furthermore, by lowering the luminance when the environment is dark, a user can be prevented from feeling glare and power consumption can be reduced.

The color and number of display elements included in the first pixel 31p and the second pixel 32p are not limited.

FIGS. 26(A) to (C) and FIGS. 27(A) to (C) each illustrate a structure example of the pixel unit 30. Although schematic views corresponding to the mode (third mode) in which display is performed by driving of both the first pixel 31p and the second pixel 32p, display can also be performed in the mode (first mode or second mode) in which display is performed by driving of only the first pixel 31p or the second pixel 32p, like the above.

Figure 26A:
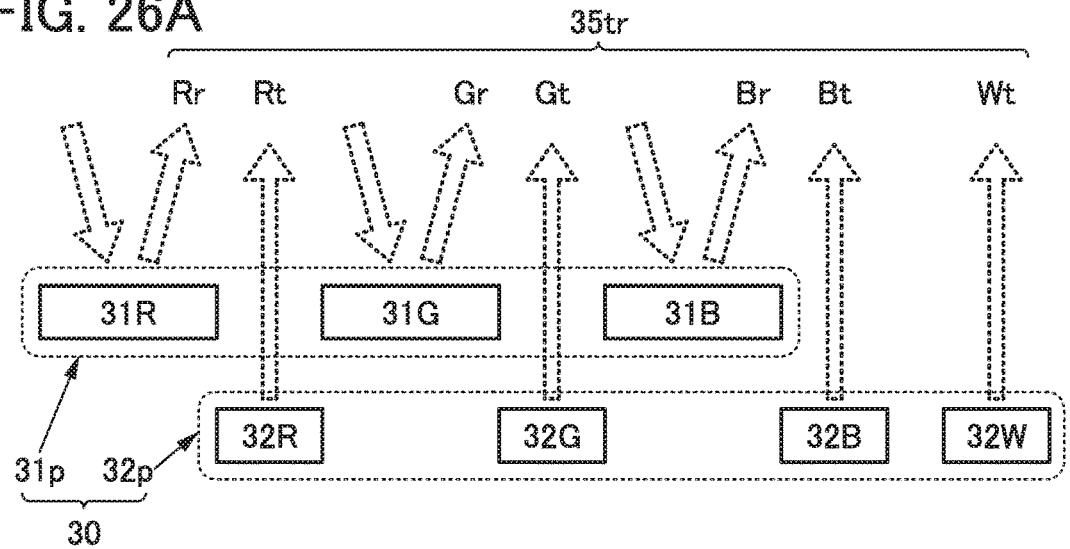
FIG. 26 Drawings illustrating examples of a pixel unit.
Figure 27A:
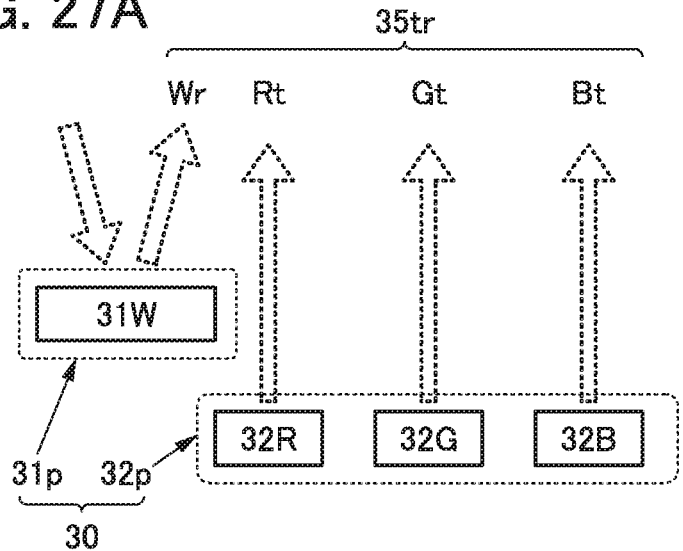
FIG. 27 Drawings illustrating examples of a pixel unit.
Figure 27B:
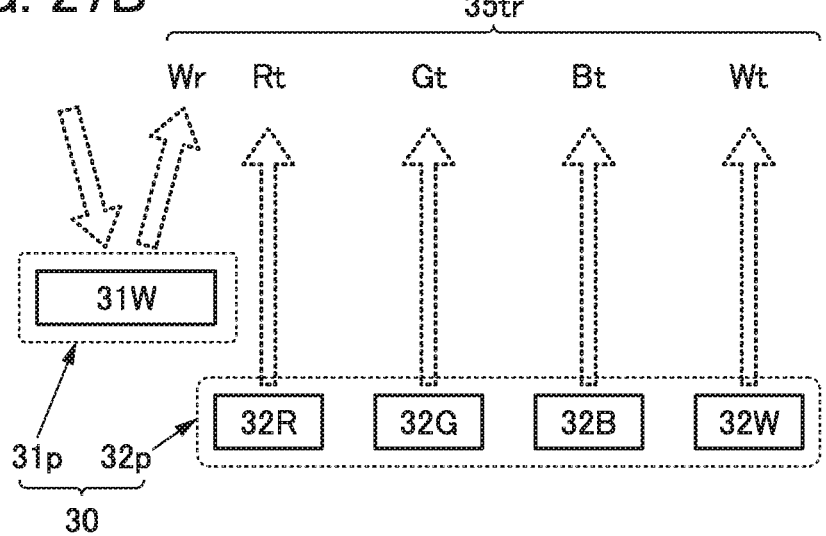

The second pixel 32p illustrated in FIGS. 26(A) and (C) and FIG. 27(B) includes a second display element 32W exhibiting white (W) in addition to the second display element 32R, the second display element 32G, and the second display element 32B.

Figure 26B:
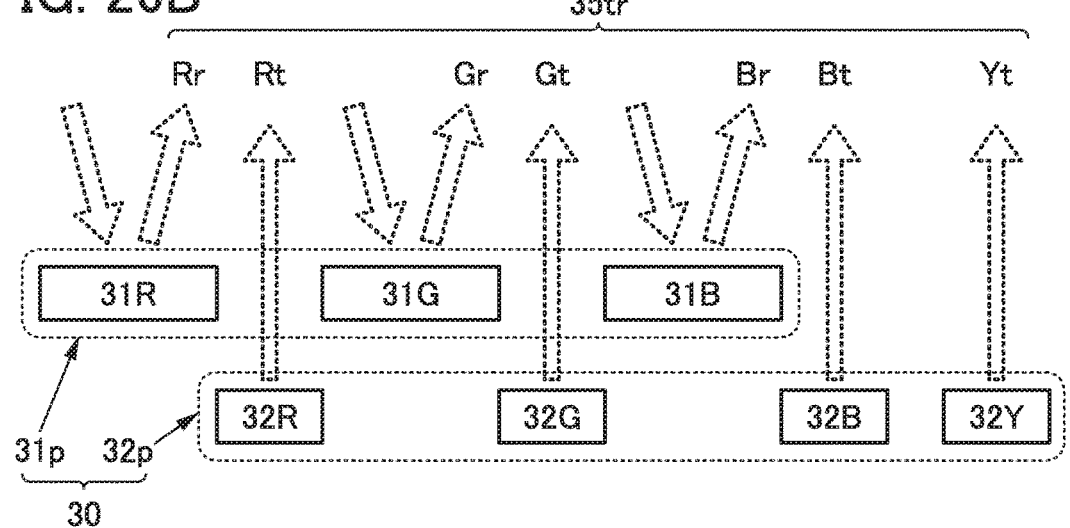
Figure 27C:
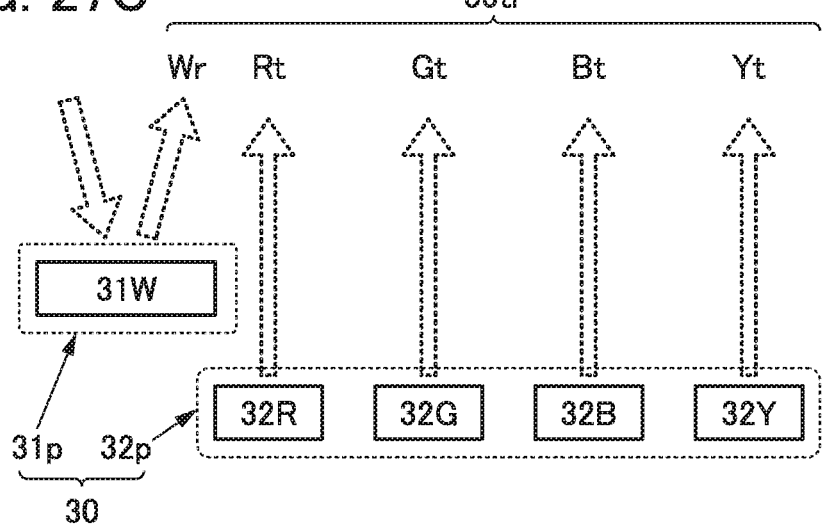

The second pixel 32p illustrated in FIG. 26(B) and FIG. 27(C) includes a second display element 32Y exhibiting yellow (Y) in addition to the second display element 32R, the second display element 32G, and the second display element 32B.

Power consumption in the display modes using the second pixel 32p (second mode and third mode) can be made lower in the structures illustrated in FIGS. 26(A) to (C) and FIGS. 27(A) and (B) than in the structures not including neither the second display element 32W nor the second display element 32Y.

Figure 26C:
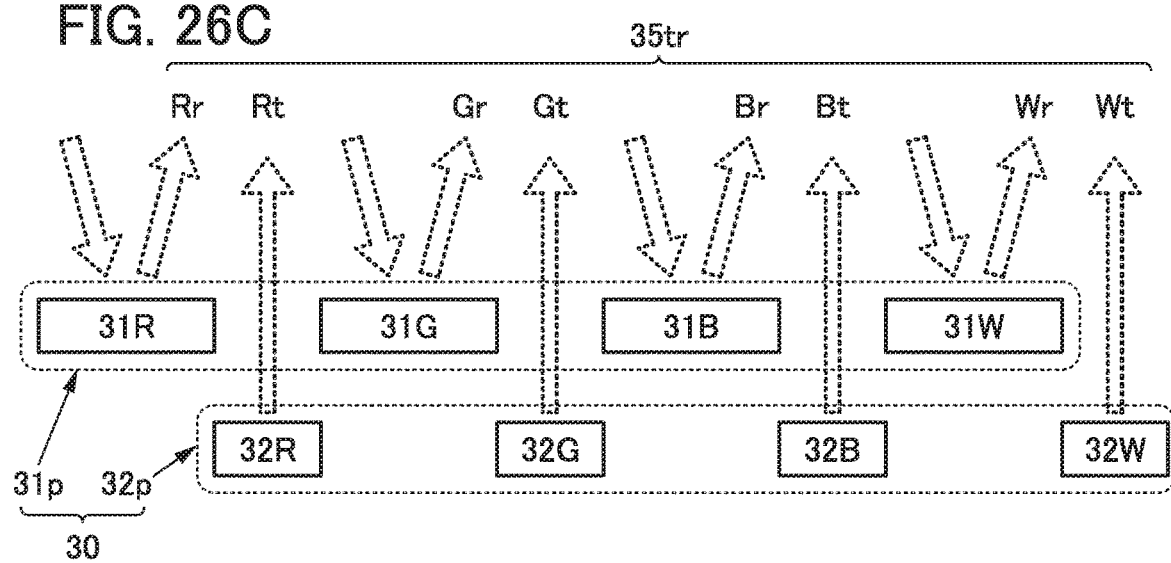

The first pixel 31p illustrated in FIG. 26(C) includes a first display element 31W exhibiting white (W) in addition to the first display element 31R, the first display element 31G, and the first display element 31B.

Power consumption in the display modes using the first pixel 31p (first mode and third mode) can be made lower in the structure illustrated in FIG. 26(C) than in the structure illustrated in FIG. 25(A).

The first pixel 31p illustrated in FIGS. 27(A) to (C) includes only the first display element 31W exhibiting white. At this time, black-and-white display or grayscale display can be performed in the display mode using only the first pixel 31p (first mode), and color display can be performed in the display modes using the second pixel 32p (second mode and third mode).

With such a structure, the aperture ratio of the first pixel 31p can be increased and thus the reflectivity of the first pixel 31p can be increased; accordingly, brighter display can be performed.

The first mode is suitable, for example, for displaying information that need not be displayed in color, such as text information.

This embodiment can be combined with the other embodiments as appropriate.

Embodiment 3

In this embodiment, a more specific structure example of the display device described in Embodiment 1 will be described with reference to FIG. 28 to FIG. 30.

FIG. 28(A) is a block diagram of a display device 400. The display device 400 includes the display portion 362, a circuit GD, and a circuit SD. The display portion 362 includes a plurality of pixels 410 arranged in a matrix.

The display device 400 includes a plurality of wirings G1, a plurality of wirings G2, a plurality of wirings ANO, a plurality of wirings CSCOM, a plurality of wirings S1, and a plurality of wirings S2. The plurality of wirings G1, the plurality of wirings G2, the plurality of wirings ANO, and the plurality of wirings CSCOM are each electrically connected to the plurality of pixels 410 arranged in a direction indicated by an arrow R and the circuit GD. The plurality of wirings S1 and the plurality of wirings S2 are each electrically connected to the plurality of pixels 410 arranged in a direction indicated by an arrow C and the circuit SD.

Note that although the structure including one circuit GD and one circuit SD is illustrated here for simplicity, the circuit GD and the circuit SD for driving liquid crystal elements and the circuit GD and the circuit SD for driving light-emitting elements may be provided separately.

The pixel 410 includes a reflective liquid crystal element and a light-emitting element.

Structure examples of the electrode 311 included in the pixel 410 are illustrated in FIGS. 28(B1) to (B4). The electrode 311 functions as a reflective electrode of the liquid crystal element. The opening 451 is provided in the electrode 311 in FIGS. 28(B1) and (B2).

In FIGS. 28(B1) and (B2), a light-emitting element 360 positioned in a region overlapping with the electrode 311 is indicated by a broken line. The light-emitting element 360 is provided so as to overlap with the opening 451 included in the electrode 311. Thus, light from the light-emitting element 360 is emitted to the display surface side through the opening 451.

In FIG. 28(B1), the pixels 410 which are adjacent in the direction indicated by the arrow R are pixels corresponding to light of different colors. At this time, as illustrated in FIG. 28(B1), the openings 451 are preferably provided in different positions in the electrodes 311 so as not to be aligned in two adjacent pixels in the direction indicated by the arrow R. This allows two light-emitting elements 360 to be apart from each other, thereby suppressing a phenomenon (also referred to as crosstalk) in which light emitted from the light-emitting element 360 enters a coloring layer in the adjacent pixel 410. Furthermore, since two adjacent light-emitting elements 360 can be arranged apart from each other, a high-resolution display device can be achieved even when EL layers of the light-emitting elements 360 are separately formed with a shadow mask or the like.

In FIG. 28(B2), the pixels 410 which are adjacent in the direction indicated by the arrow C are pixels emitting light of different colors. Also in FIG. 28(B2), the openings 451 are preferably provided in different positions in the electrodes 311 so as not to be aligned in two adjacent pixels in the direction indicated by the arrow C.

The lower the ratio of the total area of the opening 451 to the total area of a non-opening portion is, the brighter display using the liquid crystal element can be. Furthermore, the higher the ratio of the total area of the opening 451 to the total area of the non-opening portion is, the brighter display using the light-emitting element 360 can be.

The opening 451 can have a polygonal shape, a quadrangular shape, an elliptical shape, a circular shape, or a cross-like shape, for example. In addition, a stripe shape, a slit-like shape, or a checkered pattern may be employed. The opening 451 may be provided close to an adjacent pixel. Preferably, the opening 451 is provided close to another pixel emitting light of the same color, in which case crosstalk can be suppressed.

Alternatively, as illustrated in FIGS. 28(B3) and (B4), a light-emitting region of the light-emitting element 360 may be positioned in a region where the electrode 311 is not provided, in which case light emitted from the light-emitting element 360 is emitted to the display surface side.

In FIG. 28(B3), the light-emitting elements 360 are not aligned in two adjacent pixels 410 in the direction indicated by the arrow R. In FIG. 28(B4), the light-emitting elements 360 are aligned in two adjacent pixels in the direction indicated by the arrow R.

As the circuit GD, a variety of sequential circuits or the like, such as a shift register, can be used. In the circuit GD, a transistor, a capacitor, and the like can be used. A transistor included in the circuit GD can be formed in the same steps as the transistors included in the pixels 410.

The circuit SD is electrically connected to the wirings S1. For example, an integrated circuit can be used as the circuit SD. Specifically, an integrated circuit formed on a silicon substrate can be used as the circuit SD.

For example, a COG (Chip on glass) method, a COF method, or the like can be used to mount the circuit SD on a pad electrically connected to the pixels 410. Specifically, an integrated circuit can be mounted on the pad using an anisotropic conductive film.

Figure 29:
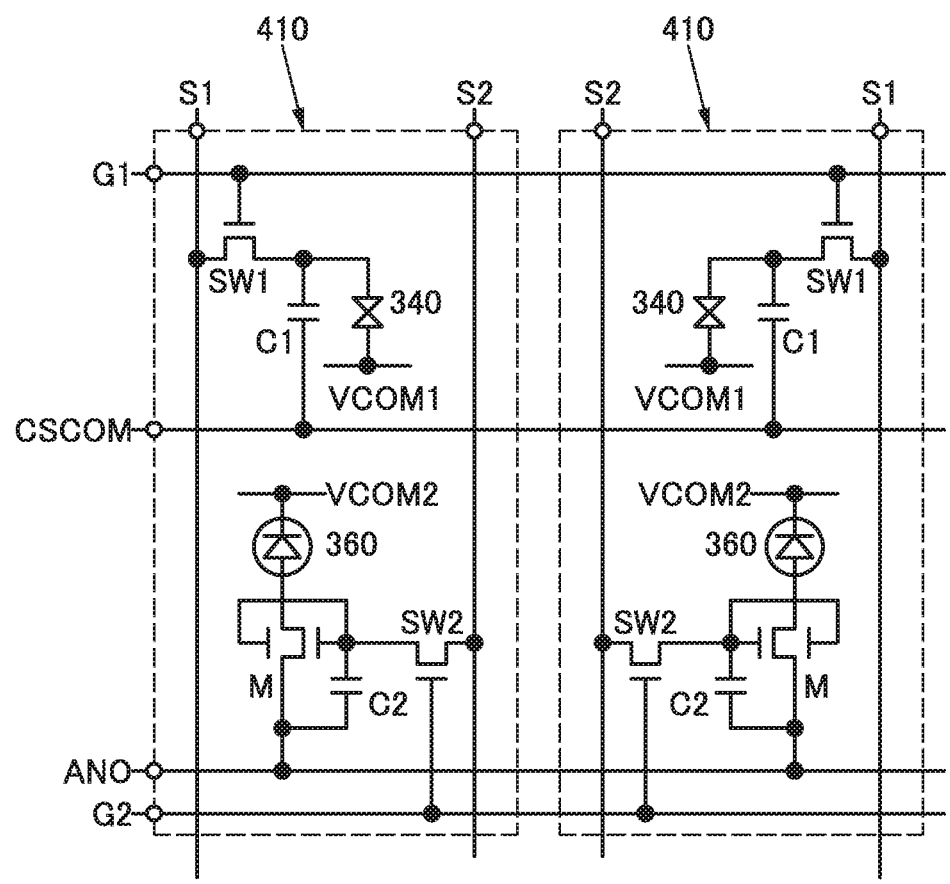
FIG. 29 A circuit diagram illustrating an example of pixel circuits of a display device.

FIG. 29 is an example of a circuit diagram of the pixels 410. FIG. 29 illustrates two adjacent pixels 410.

The pixel 410 includes a switch SW1, a capacitor C1, a liquid crystal element 340, a switch SW2, a transistor M, a capacitor C2, the light-emitting element 360, and the like. The wiring G1, the wiring G2, the wiring ANO, the wiring CSCOM, the wiring S1, and the wiring S2 are electrically connected to the pixel 410. In addition, FIG. 29 illustrates a wiring VCOM1 electrically connected to the liquid crystal element 340 and a wiring VCOM2 electrically connected to the light-emitting element 360.

FIG. 29 illustrates an example of the case where a transistor is used as the switch SW1 and the switch SW2.

A gate of the switch SW1 is connected to the wiring G1. One of a source and a drain of the switch SW1 is connected to the wiring S1, and the other is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other is connected to one electrode of the capacitor C2 and gates of the transistor M. The other electrode of the capacitor C2 is connected to one of a source and a drain of the transistor M and the wiring ANO. The other of the source and the drain of the transistor M is connected to one electrode of the light-emitting element 360. The other electrode of the light-emitting element 360 is connected to the wiring VCOM2.

FIG. 29 illustrates an example where the transistor M includes two gates that sandwiches a semiconductor and are connected to each other. This can increase the amount of current that the transistor M can flow through.

The wiring G1 can be supplied with a signal for controlling whether the switch SW1 is turned on or turned off. The wiring VCOM1 can be supplied with a predetermined potential. The wiring S1 can be supplied with a signal for controlling the orientation of liquid crystals of the liquid crystal element 340. The wiring CSCOM can be supplied with a predetermined potential.

The wiring G2 can be supplied with a signal for controlling whether the switch SW2 is turned on or turned off. The wiring VCOM2 and the wiring ANO can each be supplied with a potential that causes a potential difference with which the light-emitting element 360 emits light. The wiring S2 can be supplied with a signal for controlling the conduction state of the transistor M.

For example, in the case where display is performed in the reflective mode, display can be performed by driving the pixel 410 illustrated in FIG. 29 with the signals supplied to the wiring G1 and the wiring S1 and utilizing the optical modulation of the liquid crystal element 340. In addition, in the case where display is performed in the transmissive mode, display can be performed by driving with the signals supplied to the wiring G2 and the wiring S2 and emitting light from the light-emitting element 360. Furthermore, in the case where the driving is performed in both modes, the driving can be performed with the signals supplied to the wiring G1, the wiring G2, the wiring S1, and the wiring S2.

Note that although FIG. 29 illustrates an example in which one liquid crystal element 340 and one light-emitting element 360 are included in one pixel 410, one embodiment of the present invention is not limited thereto. FIG. 30(A) illustrates an example in which one liquid crystal element 340 and four light-emitting elements 360 (light-emitting elements 360r, 360g, 360b, and 360w) are included in one pixel 410. The pixel 410 illustrated in FIG. 30(A) differs from that in FIG. 29 in being capable of performing full-color display using the light-emitting elements by one pixel.

In FIG. 30(A), in addition to the example in FIG. 29, a wiring G3 and a wiring S3 are connected to the pixel 410.

In the example illustrated in FIG. 30(A), light-emitting elements exhibiting red (R), green (G), blue (B), and white (W) can be used as the four light-emitting elements 360, for example. Furthermore, as the liquid crystal element 340, a reflective liquid crystal element exhibiting white can be used. Thus, in the case of performing display in the reflective mode, white display with high reflectivity can be performed. In the case of performing display in the transmissive mode, display with a higher color rendering property can be performed at low power.

A structure example of the pixel 410 corresponding to FIG. 30(A) is illustrated in FIG. 30(B). The pixel 410 includes the light-emitting element 360w overlapping with the opening included in the electrode 311 and the light-emitting element 360r, the light-emitting element 360g, and the light-emitting element 360b which are arranged around the electrode 311. It is preferable that the light-emitting areas of the light-emitting element 360r, the light-emitting element 360g, and the light-emitting element 360b be almost the same.

This embodiment can be combined with the other embodiments as appropriate.

Embodiment 4

In this embodiment, the composition of a CAC (Cloud-Aligned Composite)-OS that can be used for a transistor disclosed in one embodiment of the present invention will be described.

A CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in a metal oxide is hereinafter referred to as a mosaic pattern or a patch-like pattern.

Note that a metal oxide preferably contains at least indium, and particularly preferably contains indium and zinc. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (an In—Ga—Zn oxide with the CAC-OS composition may be particularly referred to as CAC-IGZO) has a composition in which materials are separated into indium oxide (hereinafter $InO_{X1}$ (X1 is a real number greater than 0)) or indium zinc oxide (hereinafter $In_{X2}Zn_{Y2}I_{Z2}$ (X2, Y2, and Z2 are real numbers greater than 0)) and gallium oxide (hereinafter $GaO_{X3}$ (X3 is a real number greater than 0)) or gallium zinc oxide (hereinafter $Ga_{X4}Zn_{Y4}O_{Z4}$ (X4, Y4, and Z4 are real numbers greater than 0)) so that a mosaic pattern is formed, and mosaic-like $InO_{X1}$ or $In_{X2}Zn_{Y2}O_{Z2}$ is evenly distributed in the film (which is hereinafter also referred to as a "cloud-like").

That is, the CAC-OS is a composite metal oxide having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGa_{O3}(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a structure formed of two layers of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under conditions where a substrate is not heated, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the flow rate ratio of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by Out-of-plane method, which is one of X-ray diffraction (XRD: X-ray diffraction) measurement methods. That is, it is found by the X-ray diffraction measurement that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanometer-sized electron beam), a ring-like high-luminance region and a plurality of bright spots in the ring region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX: Energy Dispersive X-ray spectroscopy) that an In—Ga—Zn oxide with the CAC-OS composition has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions including $GaO_{X3}$ or the like as a main component and regions including $In_{X2}Zn_{Y2}O_{Z2}$ or $InO_{X1}$ as a main component are phase-separated from each other and form a mosaic pattern.

Here, a region including $In_{X2}Zn_{Y2}O_{Z2}$ or $InO_{X1}$ as a main component is a region whose conductivity is higher than that of a region including $GaO_{X3}$ or the like as a main component. In other words, when carriers flow through regions including $In_{X2}Zn_{Y2}O_{Z2}$ or $InO_{X1}$ as a main component, the conductivity of a metal oxide is exhibited. Accordingly, cloud-like distribution of regions including $In_{X2}Zn_{Y2}O_{Z2}$ or $InO_{X1}$ as a main component in a metal oxide can achieve high field-effect mobility (μ).

In contrast, a region including $GaO_{X3}$ or the like as a main component is a region whose insulating property is higher than that of a region including $In_{X2}Zn_{Y2}O_{Z2}$ or $InO_{X1}$ as a main component. In other words, distribution of regions including $GaO_{X3}$ or the like as a main component in a metal oxide can reduce leakage current and achieve favorable switching operation.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

Moreover, a semiconductor element using the CAC-OS has high reliability. Thus, the CAC-OS is most suitable for a variety of semiconductor devices such as displays.

This embodiment can be combined with the other embodiments as appropriate.

Embodiment 5

In this embodiment, a display module and electronic devices of one embodiment of the present invention will be described.

Figure 31:
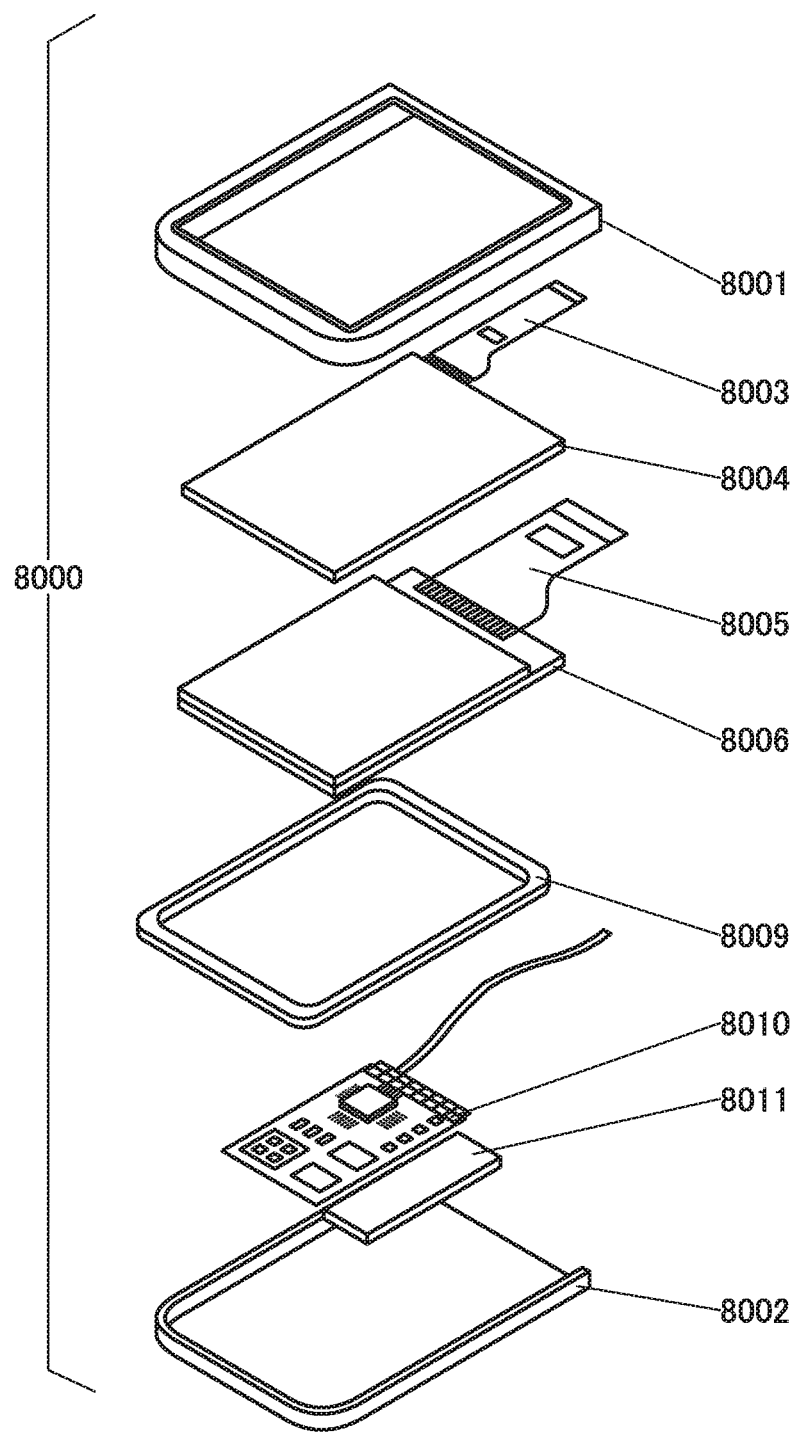
FIG. 31 A drawing illustrating an example of a display module.

A display module 8000 illustrated in FIG. 31 includes a touch panel 8004 connected to an FPC 8003, a display panel 8006 connected to an FPC 8005, a frame 8009, a printed circuit board 8010, and a battery 8011 between an upper cover 8001 and a lower cover 8002.

The display device of one embodiment of the present invention can be used for the display panel 8006, for example. Thus, a display module that has high visibility regardless of ambient brightness can be manufactured. Moreover, a display module with low power consumption can be manufactured. Furthermore, a display module with a wide viewing angle can be manufactured.

The shapes and sizes of the upper cover 8001 and the lower cover 8002 can be changed as appropriate in accordance with the sizes of the touch panel 8004 and the display panel 8006.

As the touch panel 8004, a resistive or capacitive touch panel can be used, overlapping with the display panel 8006. Alternatively, it is also possible to give a touch panel function to the display panel 8006 without installation of the touch panel 8004.

The frame 8009 has a function of an electromagnetic shield for blocking electromagnetic waves generated by the operation of the printed circuit board 8010, in addition to a function of protecting the display panel 8006. The frame 8009 may also function as a radiator plate.

The printed circuit board 8010 includes a power supply circuit and a signal processing circuit for outputting a video signal and a clock signal. A power source for supplying power to the power supply circuit may be an external commercial power source or may be the battery 8011 provided separately. The battery 8011 can be omitted in the case of using a commercial power source.

Moreover, the display module 8000 may be additionally provided with a component such as a polarizing plate, a retardation plate, or a prism sheet.

The display device of one embodiment of the present invention can achieve high visibility regardless of the intensity of external light and thus can be suitably used for a portable electronic device, a wearable electronic device (wearable device), an e-book reader, and the like.

Figure 32A:
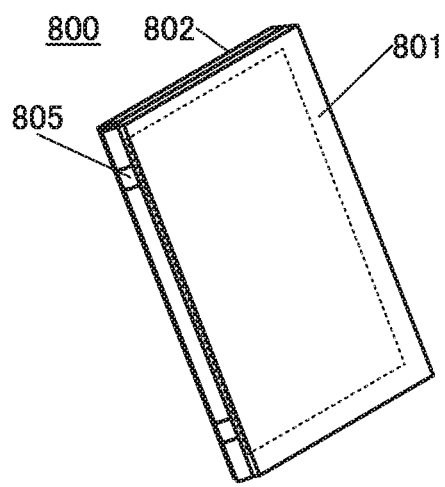
FIG. 32 Drawings illustrating examples of electronic devices.

A portable information terminal 800 illustrated in FIGS. 32(A) and (B) includes a housing 801, a housing 802, a display portion 803, a display portion 804, a hinge portion 805, and the like.

Figure 32B:
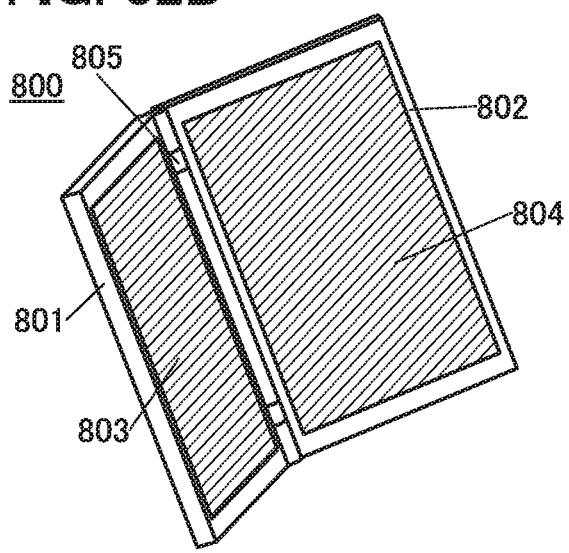

The housing 801 and the housing 802 are joined with the hinge portion 805. The portable information terminal 800 can be opened as illustrated in FIG. 32(B) from a folded state (FIG. 32(A)).

The display device of one embodiment of the present invention can be used for at least one of the display portion 803 and the display portion 804. Thus, a portable information terminal that has high visibility regardless of ambient brightness can be manufactured.

Moreover, a portable information terminal with low power consumption can be manufactured. Furthermore, a portable information terminal with a wide viewing angle can be manufactured.

The display portion 803 and the display portion 804 can each display at least one of text information, a still image, a moving image, and the like. When text information is displayed on the display portion, the portable information terminal 800 can be used as an e-book reader.

The portable information terminal 800 is foldable and thus has high portability and excellent versatility.

The housing 801 and the housing 802 may include a power button, an operation button, an external connection port, a speaker, a microphone, or the like.

Figure 32C:
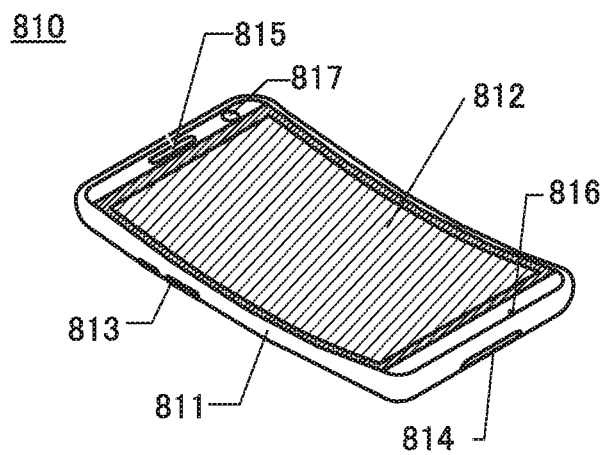

A portable information terminal 810 illustrated in FIG. 32(C) includes a housing 811, a display portion 812, an operation button 813, an external connection port 814, a speaker 815, a microphone 816, a camera 817, and the like.

The display device of one embodiment of the present invention can be used for the display portion 812. Thus, a portable information terminal that has high visibility regardless of ambient brightness can be manufactured. Moreover, a portable information terminal with low power consumption can be manufactured. Furthermore, a portable information terminal with a wide viewing angle can be manufactured.

In the portable information terminal 810, the display portion 812 is provided with a touch sensor. All operations including making a call and inputting letters can be performed by touch on the display portion 812 with a finger, a stylus, or the like.

In addition, the operation of the operation button 813 can switch the power ON and OFF operations and types of images displayed on the display portion 812, for example, from a mail creation screen to a main menu screen.

Moreover, when a detection device such as a gyroscope sensor or an acceleration sensor is provided inside the portable information terminal 810, the (horizontal or vertical) orientation of the portable information terminal 810 can be determined so that the direction of display on the screen of the display portion 812 can be automatically changed. Furthermore, the direction of display on the screen can be changed by touch on the display portion 812, operation with the operation button 813, sound input using the microphone 816, or the like.

The portable information terminal 810 has one or a plurality of functions selected from a telephone, a personal organizer, an information browsing device, and the like. Specifically, the portable information terminal 810 can be used as a smartphone. The portable information terminal 810 is capable of executing a variety of applications such as mobile phone calls, e-mailing, text viewing and writing, music reproduction, video replay, Internet communication, and games, for example.

Figure 32D:
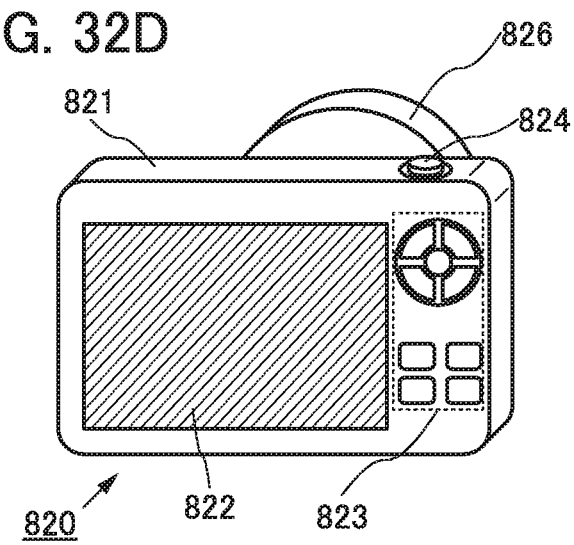

A camera 820 illustrated in FIG. 32(D) includes a housing 821, a display portion 822, operation buttons 823, a shutter button 824, and the like. Moreover, a detachable lens 826 is attached to the camera 820.

The display device of one embodiment of the present invention can be used for the display portion 822. Including the display portion that has high visibility regardless of ambient brightness can increase the convenience of the camera. Moreover, a camera with low power consumption can be manufactured. Furthermore, a camera with a wide viewing angle can be manufactured.

Here, the camera 820 is configured such that the lens 826 is replaceable and detachable from the housing 821; however, the lens 826 and the housing 821 may be integrated with each other.

The camera 820 can take still images or moving images with the push of the shutter button 824. In addition, the display portion 822 functions as a touch panel, and images can also be taken by touch on the display portion 822.

Note that the camera 820 can be additionally equipped with an electronic flash unit, a viewfinder, and the like. Alternatively, they may be incorporated into the housing 821.

FIGS. 33(A) to (E) are diagrams illustrating electronic devices. These electronic devices include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and/or the like.

The display device of one embodiment of the present invention can be suitably used for the display portion 9001. Thus, an electronic device including a display portion that has high visibility regardless of ambient brightness can be manufactured. Moreover, an electronic device with low power consumption can be manufactured. Furthermore, an electronic device with a wide viewing angle can be manufactured.

The electronic devices illustrated in FIGS. 33(A) to (E) can have a variety of functions. For example, they can have a function of displaying a variety of information (e.g., a still image, a moving image, and a text image) on the display portion, a touch panel function, a function of displaying a calendar, date, time, or the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a memory medium and displaying it on the display portion. Note that the functions which the electronic devices illustrated in FIGS. 33(A) to (E) have are not limited to these, and they may have other functions.

Figure 33A:
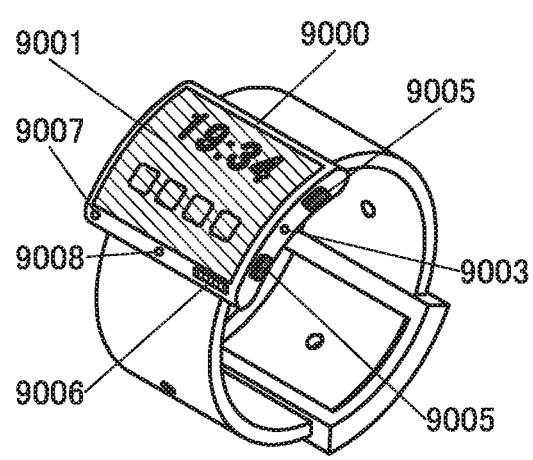
FIG. 33 Drawings illustrating examples of electronic devices.
Figure 33B:
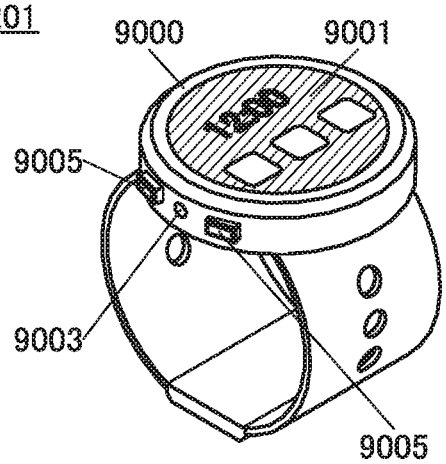

FIG. 33(A) and FIG. 33(B) are perspective views illustrating a wristwatch-type portable information terminal 9200 and a wristwatch-type portable information terminal 9201, respectively.

The portable information terminal 9200 illustrated in FIG. 33(A) is capable of executing a variety of applications such as mobile phone calls, e-mailing, text viewing and writing, music reproduction, Internet communication, and computer games. In addition, the display portion 9001 is provided such that its display surface is curved, and display can be performed along the curved display surface. Moreover, the portable information terminal 9200 can perform standards-based near field communication. For example, mutual communication with a headset capable of wireless communication enables hands-free calling. Furthermore, the portable information terminal 9200 includes the connection terminal 9006 and can exchange data directly with another information terminal through a connector. Power charging through the connection terminal 9006 is also possible. Note that the charging operation may be performed by wireless power feeding without using the connection terminal 9006.

Unlike in the portable information terminal illustrated in FIG. 33(A), the display surface of the display portion 9001 is not curved in the portable information terminal 9201 illustrated in FIG. 33(B). Furthermore, the external shape of the display portion of the portable information terminal 9201 is a non-rectangular shape (a circular shape in FIG. 33(B)).

Figure 33C:
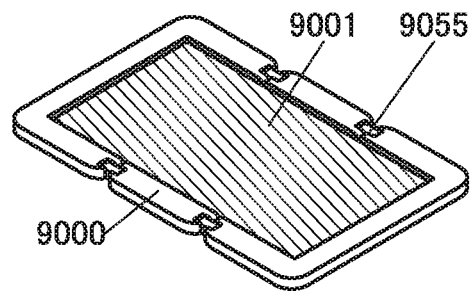
Figure 33D:
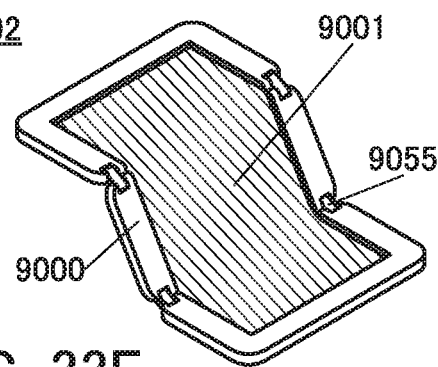
Figure 33E:
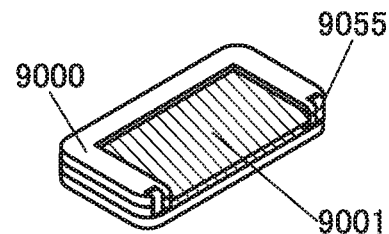

FIGS. 33(C) to (E) are perspective views illustrating a foldable portable information terminal 9202. Note that FIG. 33(C) is a perspective view of the portable information terminal 9202 in an open state; FIG. 33(D) is a perspective view of the portable information terminal 9202 that is being changed from one of an open state and a folded state to the other; and FIG. 33(E) is a perspective view of the portable information terminal 9202 in a folded state.

The portable information terminal 9202 is highly portable in a folded state and has high display browsability due to a seamless large display region in an open state. The display portion 9001 included in the portable information terminal 9202 is supported by three housings 9000 joined with hinges 9055. By being bent between two housings 9000 with the hinges 9055, the portable information terminal 9202 can be reversibly changed in shape from an open state to a folded state. For example, the portable information terminal 9202 can be bent with a radius of curvature of greater than or equal to 1 mm and less than or equal to 150 mm.

This embodiment can be combined with the other embodiments as appropriate.

REFERENCE NUMERALS

ANO wiring
C1 capacitor
C2 capacitor
CSCOM wiring
G1 wiring
G2 wiring
G3 wiring
GD circuit
S1 wiring
S2 wiring
S3 wiring
SD circuit
SW1 switch
SW2 switch
VCOM1 wiring
VCOM2 wiring
10 display device
14 display portion
21 light emission
22 reflected light
30 pixel unit
31B first display element
31G first display element
31p pixel
31R first display element
31W first display element
32B second display element
32G second display element
32p pixel
32R second display element
32W second display element
32Y second display element
35r light
35t light
35tr light
41 transistor
42 transistor
formation substrate
62 resin layer
62a resin layer
62b resin layer
62n resin layer
62m resin layer
62p resin layer
63 insulating layer
110a transistor
110b transistor
110c transistor
110d transistor
110e transistor
110f transistor
110g transistor
110h transistor
112 liquid crystal
113 electrode
117 insulating layer
121 insulating layer
131 coloring layer
132 light-blocking layer
133a alignment film
133b alignment film
134 coloring layer
135 polarizing plate
141 adhesive layer
142 adhesive layer
151 insulating layer
170 light-emitting element
180 liquid crystal element
191 electrode
192 EL layer
193 electrode
194 insulating layer
201 transistor
203 transistor
204 connection portion
205 transistor
206 transistor 207 connection portion
211 insulating layer
212 insulating layer
213 insulating layer
214 insulating layer
216 insulating layer
217 insulating layer
218 insulating layer
220 insulating layer
221 conductive layer
221a conductive layer
221b conductive layer
221c conductive layer
221d conductive layer
222a conductive layer
222b conductive layer
223 conductive layer
231 semiconductor layer
235 conductive layer
242 connection layer
243 connector
252 connection portion
261 semiconductor layer
263a conductive layer
263b conductive layer
281 transistor
284 transistor
285 transistor
286 transistor
300 display device
300A display device
300B display device
300C display device
311 electrode
311a electrode
311b electrode
311c conductive layer
311d conductive layer
311e conductive layer
311f conductive layer
340 liquid crystal element
351 substrate
360 light-emitting element
360b light-emitting element
360g light-emitting element
360r light-emitting element
360w light-emitting element
361 substrate
362 display portion
364 circuit
365 wiring
372 FPC
373 IC
400 display device
410 pixel
451 opening
800 portable information terminal
801 housing
802 housing
803 display portion
804 display portion
805 hinge portion
810 portable information terminal
811 housing
812 display portion
813 operation button
814 external connection port
815 speaker
816 microphone
817 camera
820 camera
821 housing
822 display portion
823 operation button
824 shutter button
826 lens
8000 display module
8001 upper cover
8002 lower cover
8003 FPC
8004 touch panel
8005 FPC
8006 display panel
8009 frame
8010 printed circuit board
8011 battery
9000 housing
9001 display portion
9003 speaker
9005 operation key
9006 connection terminal
9007 sensor
9008 microphone
9055 hinge
9200 portable information terminal
9201 portable information terminal
9202 portable information terminal

The invention claimed is:

1. A method for manufacturing a display device, comprising:
   forming a first resin layer including a first region and a second region thinner than the first region over a substrate, by performing first heat treatment on a first layer while a gas containing oxygen is supplied;
   forming, over the first resin layer, a layer to be separated which includes a display element; and
   separating the layer to be separated and the substrate from each other,
   wherein forming a conductive layer over the first resin layer in a position overlapping with the second region of the first resin layer is included in forming the layer to be separated,
   wherein exposing the conductive layer by removing the first resin layer is included after separating the layer to be separated and the substrate from each other, and
   wherein the first layer is formed by using a material comprising a resin or a resin precursor.

2. The method for manufacturing a display device, according to claim 1, further comprising:
   forming a first region and a second region thinner than the first region in the first layer,
   wherein the first region of the first layer corresponds to the first region of the first resin layer, and
   wherein the second region of the first layer corresponds to the second region of the first resin layer.

3. A method for manufacturing a display device, comprising:
   forming a first resin layer including a first region and a second region thinner than the first region over a substrate, by performing first heat treatment on a first layer while a gas containing oxygen is supplied;
   forming an insulating layer covering an edge portion of the first resin layer over the substrate and over the first resin layer;

forming, over the insulating layer, a layer to be separated which includes a display element; and separating the layer to be separated and the substrate from each other in such a manner that a separation trigger is formed by separating at least part of the first resin layer from the substrate, wherein forming a conductive layer over the insulating layer in a position overlapping with the second region of the first resin layer is included in forming the layer to be separated, wherein exposing the conductive layer by removing the first resin layer is included after separating the layer to be separated and the substrate from each other, and wherein the first layer is formed by using a material comprising a resin or a resin precursor.

4. The method for manufacturing a display device, according to claim 3:

forming a first region and a second region thinner than the first region in the first layer, wherein the first region of the first layer corresponds to the first region of the first resin layer, and wherein the second region of the first layer corresponds to the second region of the first resin layer.

5. A method for manufacturing a display device, comprising:

forming a first resin layer including a first region and a second region thinner than the first region over a substrate, by performing first heat treatment on a first layer while a gas containing oxygen is supplied;

forming a second layer covering an edge portion of the first resin layer over the substrate and over the first resin layer;

performing second heat treatment on the second layer in an atmosphere containing less oxygen than an atmosphere of the first heat treatment to form a second resin layer covering the edge portion of the first resin layer;

forming, over the second resin layer, a layer to be separated which includes a display element; and separating the layer to be separated and the substrate from each other in such a manner that a separation trigger is formed by separating at least part of the first resin layer from the substrate, wherein forming a conductive layer over the second resin layer in a position overlapping with the second region is included in forming the layer to be separated, wherein exposing the conductive layer by removing the first resin layer is included after separating the layer to be separated and the substrate from each other, and wherein the first layer is formed by using a material comprising a resin or a resin precursor.

6. The method for manufacturing a display device according to claim 5:

forming a first region and a second region thinner than the first region in the first layer, wherein the first region of the first layer corresponds to the first region of the first resin layer, and wherein the second region of the first layer corresponds to the second region of the first resin layer.

7. A method for manufacturing a display device comprising a first display element, a second display element, a first insulating layer, and a conductive layer, wherein the first display element includes a first pixel electrode configured to reflect visible light, a liquid crystal, and a first common electrode configured to transmit visible light, and wherein the second display element includes a second pixel electrode configured to transmit visible light, a light-emitting layer, and a second common electrode configured to reflect visible light, the method comprising:

forming the first common electrode over a first substrate;

forming a resin layer including a first region and a second region thinner than the first region over a formation substrate by using a material containing a resin or a resin precursor;

forming the first pixel electrode over the resin layer;

forming the conductive layer covering the second region, performed concurrently with forming the first pixel electrode;

forming the first insulating layer over the first pixel electrode;

forming the second pixel electrode, the light-emitting layer, and the second common electrode in this order over the first insulating layer to form the second display element;

bonding the formation substrate and a second substrate to each other with an adhesive layer;

separating the formation substrate and the first pixel electrode from each other; and positioning the liquid crystal between the first common electrode and the first pixel electrode and bonding the first substrate and the second substrate to each other with an adhesive layer to form the first display element, wherein the resin layer is a layer formed through a process of first heat treatment in an atmosphere containing oxygen.

8. A method for manufacturing a display device comprising a first display element, a second display element, a first insulating layer, and a conductive layer, wherein the first display element includes a first pixel electrode configured to reflect visible light, a liquid crystal, and a first common electrode configured to transmit visible light, and wherein the second display element includes a second pixel electrode configured to transmit visible light, a light-emitting layer, and a second common electrode configured to reflect visible light, the method comprising:

forming the first common electrode over a first substrate;

forming a resin layer including a first region and a second region thinner than the first region over a formation substrate by using a material containing a resin or a resin precursor;

forming a second insulating layer covering an edge portion of the resin layer;

forming the first pixel electrode over the second insulating layer;

forming the conductive layer covering the second region, performed concurrently with forming the first pixel electrode;

forming the first insulating layer over the first pixel electrode;

forming the second pixel electrode, the light-emitting layer, and the second common electrode in this order over the first insulating layer to form the second display element;

bonding the formation substrate and a second substrate to each other with an adhesive layer;

separating the formation substrate and the first pixel electrode from each other in such a manner that a separation trigger is formed by separating at least part of the resin layer from the formation substrate; and positioning the liquid crystal between the first common electrode and the first pixel electrode and bonding the first substrate and the second substrate to each other with an adhesive layer to form the first display element, wherein the resin layer is a layer formed through a process of first heat treatment in an atmosphere containing oxygen.

9. The method for manufacturing a display device, according to claim 8, wherein a material of the second insulating layer is an inorganic insulating material.

10. The method for manufacturing a display device, according to claim 8, wherein a material of the second insulating layer is a resin or a resin precursor.

11. The method for manufacturing a display device, according to claim 8, wherein a material of the second insulating layer is identical to a material of the resin layer.

12. The method for manufacturing a display device, according to claim 8, wherein the second insulating layer is a layer formed through second heat treatment in an atmosphere containing less oxygen than an atmosphere of the first heat treatment.

13. The method for manufacturing a display device according to claim 12, wherein the second heat treatment is performed while a nitrogen gas is supplied.

14. The method for manufacturing a display device according to claim 12, wherein the second heat treatment is performed at a temperature lower than a temperature of the first heat treatment while a mixed gas containing nitrogen and oxygen is supplied.

15. The method for manufacturing a display device according to claim 12, wherein the first heat treatment is performed while a mixed gas where the proportion of an oxygen gas flow rate in a whole gas flow rate is greater than or equal to 5% and less than or equal to 50% is supplied.

16. The method for manufacturing a display device according to claim 12, wherein the first heat treatment is performed at a temperature of greater than or equal to 350° C. and less than or equal to 450° C. while a mixed gas containing nitrogen and oxygen is supplied.

17. The method for manufacturing a display device, according to claim 8, further comprising exposing the conductive layer, after separating the formation substrate and the first pixel electrode from each other.

18. The method for manufacturing a display device, according to claim 17, further comprising connecting a wiring for inputting a signal or power to the exposed conductive layer through a connection layer.

19. The method for manufacturing a display device, according to claim 17, wherein the exposed conductive layer is connected to the first common electrode through a connector.

20. The method for manufacturing a display device, according to claim 8, further comprising forming a transistor including a metal oxide in a channel formation region, after forming the first pixel electrode and before forming the second pixel electrode, and wherein, when the resin layer is formed, the resin layer is heated at a temperature higher than a temperature for heating performed when the transistor is formed.

21. The method for manufacturing a display device according to claim 1, wherein the second region is formed by removing a part of the first resin layer after the first heat treatment.

22. The method for manufacturing a display device according to claim 3, wherein the second region is formed by removing a part of the first resin layer after the first heat treatment.

23. The method for manufacturing a display device, according to claim 7, further comprising exposing the conductive layer, after separating the formation substrate and the first pixel electrode from each other.

24. The method for manufacturing a display device, according to claim 8, further comprising forming a transistor including a metal oxide in a channel formation region, after forming the first pixel electrode and before forming the second pixel electrode, and wherein, when the resin layer is formed, the resin layer is heated at a temperature higher than a temperature for heating performed when the transistor is formed.

25. A separation method, comprising:

forming a first resin layer including a first region and a second region thinner than the first region over a substrate, by performing first heat treatment on a first layer while a gas containing oxygen is supplied;

forming a second layer covering an edge portion of the first resin layer over the substrate and over the first resin layer;

performing second heat treatment on the second layer in an atmosphere containing less oxygen than an atmosphere of the first heat treatment to form a second resin layer covering the edge portion of the first resin layer;

forming, over the second resin layer, a layer to be separated which includes a display element; and separating the layer to be separated and the substrate from each other in such a manner that a separation trigger is formed by separating at least part of the first resin layer from the substrate, wherein forming a conductive layer over the second resin layer in a position overlapping with the second region is included in forming the layer to be separated, wherein exposing the conductive layer by removing the first resin layer is included after separating the layer to be separated and the substrate from each other, and wherein the first layer is formed by using a material comprising a resin or a resin precursor.

26. The separation method according to claim 25, wherein the second heat treatment is performed while a nitrogen gas is supplied.

27. The separation method according to claim 25, wherein the second heat treatment is performed at a temperature lower than a temperature of the first heat treatment while a mixed gas containing nitrogen and oxygen is supplied.

28. The separation method according to claim 25, wherein the first heat treatment is performed while a mixed gas where the proportion of an oxygen gas flow rate in a whole gas flow rate is greater than or equal to 5% and less than or equal to 50% is supplied.

29. The separation method according to claim 25, wherein the first heat treatment is performed at a temperature of greater than or equal to 350° C. and less than or equal to 450° C. while a mixed gas containing nitrogen and oxygen is supplied.

* * * * *